(12) United States Patent
Aulhorn

(10) Patent No.: US 11,795,003 B2
(45) Date of Patent: Oct. 24, 2023

(54) CIRCULATION CONVEYOR TRANSPORT WHEEL, SUBSTRATE CARRIER AND METHOD

(71) Applicant: VON ARDENNE Asset GmbH & Co. KG, Dresden (DE)

(72) Inventor: Stephan Aulhorn, Radebeul (DE)

(73) Assignee: VON ARDENNE Asset GmbH & Co. KG, Dresden (DE)

( * ) Notice: Subject to any disclaimer, the term of this patent is extended or adjusted under 35 U.S.C. 154(b) by 172 days.

(21) Appl. No.: 17/145,469

(22) Filed: Jan. 11, 2021

(65) Prior Publication Data

US 2021/0221622 A1      Jul. 22, 2021

(30) Foreign Application Priority Data

Jan. 22, 2020   (DE) ...................... 10 2020 101 460.0

(51) Int. Cl.
*B65G 23/16*   (2006.01)
*H01L 21/677*  (2006.01)

(52) U.S. Cl.
CPC .......... *B65G 23/16* (2013.01); *H01L 21/6773* (2013.01); *B65G 2201/0297* (2013.01)

(58) Field of Classification Search
CPC ..................................................... B65G 23/16
See application file for complete search history.

(56) References Cited

U.S. PATENT DOCUMENTS 3,848,726 A * 11/1974 Wiemer ................. B65G 35/08
198/795
6,015,040 A    1/2000 Goeb et al.
6,132,562 A    10/2000 Baumecker et al.
(Continued)

FOREIGN PATENT DOCUMENTS

CN         1154334 A      7/1997
CN       101511556 A      8/2009
(Continued)

OTHER PUBLICATIONS

German Search Report for corresponding Application DE 10 2020 101 460.0; 9 pages; dated Sep. 21, 2020 (for reference purpose only).

(Continued)

*Primary Examiner* — Jonathan Snelting
(74) *Attorney, Agent, or Firm* — VIERING, JENTSCHURA & PARTNERmbB

(57) ABSTRACT

According to various aspects of the disclosure, a circulation conveyor transport wheel (100) may have: a framework (102) at which the circulation conveyor transport wheel (100) can be rotatably mounted; a multiplicity of coupling devices (104) which are arranged at an outer circumference of the framework (102) and of which each of the coupling devices has at least one form-fit contour (104*f*) for the form-fitting coupling-on of a substrate carrier (400), wherein the multiplicity of coupling devices (104) has a pair (302) of coupling devices (104), the form-fit contours of which have a smaller spacing to one another along the circumference than to the form-fit contours of the multiplicity of coupling devices (104) which are arranged immediately adjacent to the pair (302).

17 Claims, 33 Drawing Sheets

(56) References Cited

U.S. PATENT DOCUMENTS

| | | | | |
|---|---|---|---|---|
| 6,425,478 | B1* | 7/2002 | Eberle | B65G 35/08 |
| | | | | 198/795 |
| 9,394,118 | B2* | 7/2016 | Fenile | B65G 47/61 |
| 10,464,759 | B2* | 11/2019 | Lykkegaard | B65G 21/22 |
| 2003/0219547 | A1 | 11/2003 | Arnold | |
| 2012/0260955 | A1 | 10/2012 | Winzinger | |
| 2015/0344237 | A1 | 12/2015 | Papsdorf et al. | |
| 2016/0257504 | A1 | 9/2016 | Fukuta | |
| 2019/0233938 | A1 | 8/2019 | Matsuzaki et al. | |
| 2020/0002807 | A1 | 1/2020 | Matsuzaki et al. | |

FOREIGN PATENT DOCUMENTS

| | | |
|---|---|---|
| CN | 102730415 A | 10/2012 |
| CN | 106458474 A | 2/2017 |
| DE | 19807032 A1 | 8/1999 |
| DE | 20010791 U1 | 11/2000 |
| JP | S55170365 U | 12/1980 |
| JP | S58108747 A | 6/1983 |
| JP | 2000042856 A | 2/2000 |
| JP | 2013092193 A | 5/2013 |
| JP | 2020001893 A | 1/2020 |
| KR | 20190002726 A | 1/2019 |
| KR | 20190087651 A | 7/2019 |
| WO | 2003100119 A1 | 12/2003 |
| WO | 2003100124 A1 | 12/2003 |
| WO | 2015064374 A1 | 5/2015 |
| WO | 2018084286 A1 | 5/2018 |
| WO | 2018230592 A1 | 12/2018 |

OTHER PUBLICATIONS

First Search Report issued for the corresponding Chinese patent application No. 2021100747128, dated May 16, 2022, 2 pages (for informational purposes only).

Notice of Reasons for Refusal issued for the corresponding Japanese patent application No. 2021-007318, dated Jun. 7, 2022, 5 pages (for informational purposes only).

Search Report by Registered Search Organization issued for the corresponding Japanese patent application No. 2021-007318, dated Apr. 12, 2022, 29 pages (for informational purposes only).

Request for the Submission of an Opinion issued for the corresponding Korean patent application No. 10-2021-0006112, dated Jul. 11, 2022, 5 pages (for informational purposes only).

Notice for Reasons for Refusal issued for the parallel Japanes patent application No. 2021007318, dated Jan. 10, 2023, 4 pages (for informational purposes only).

* cited by examiner

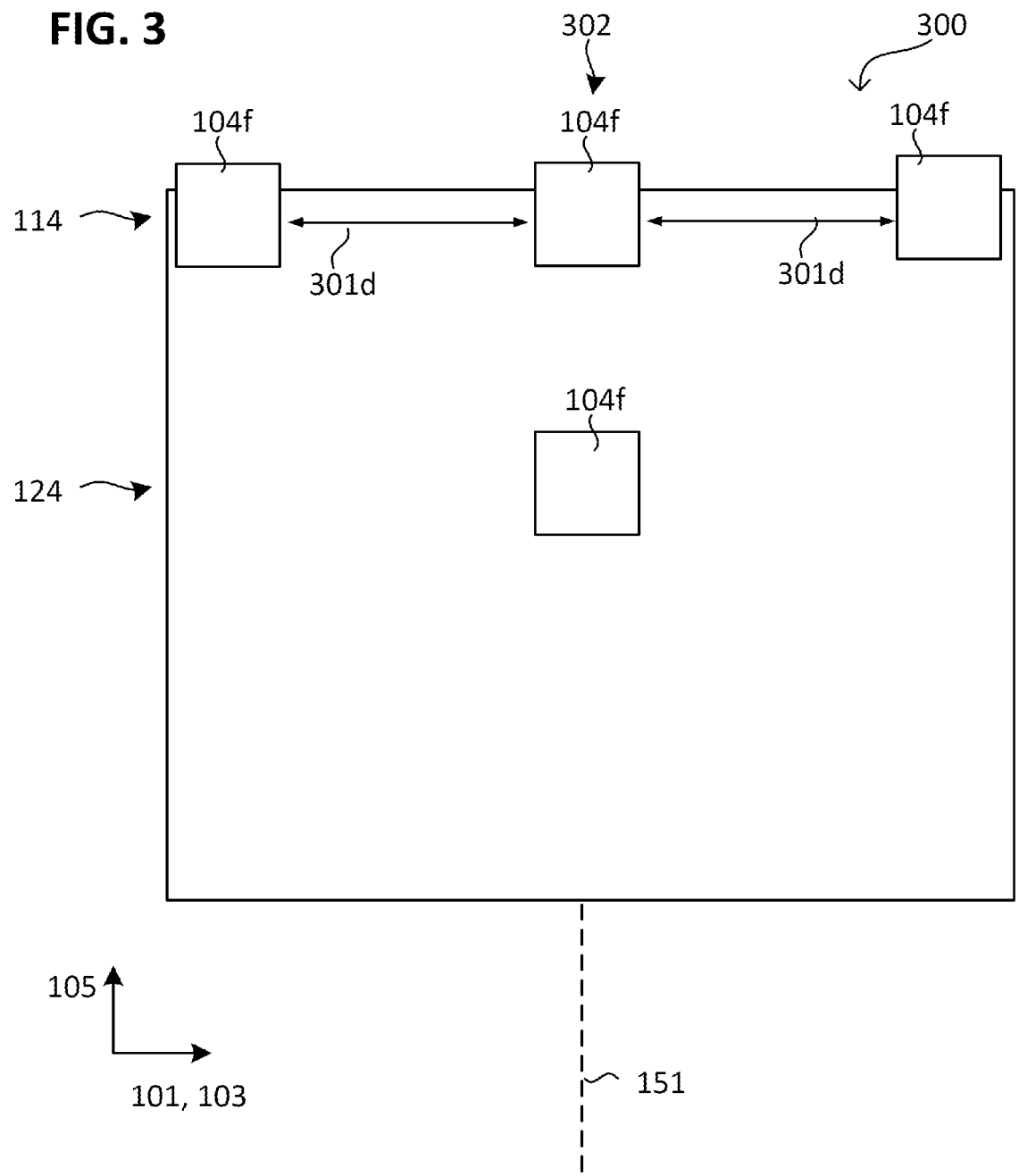

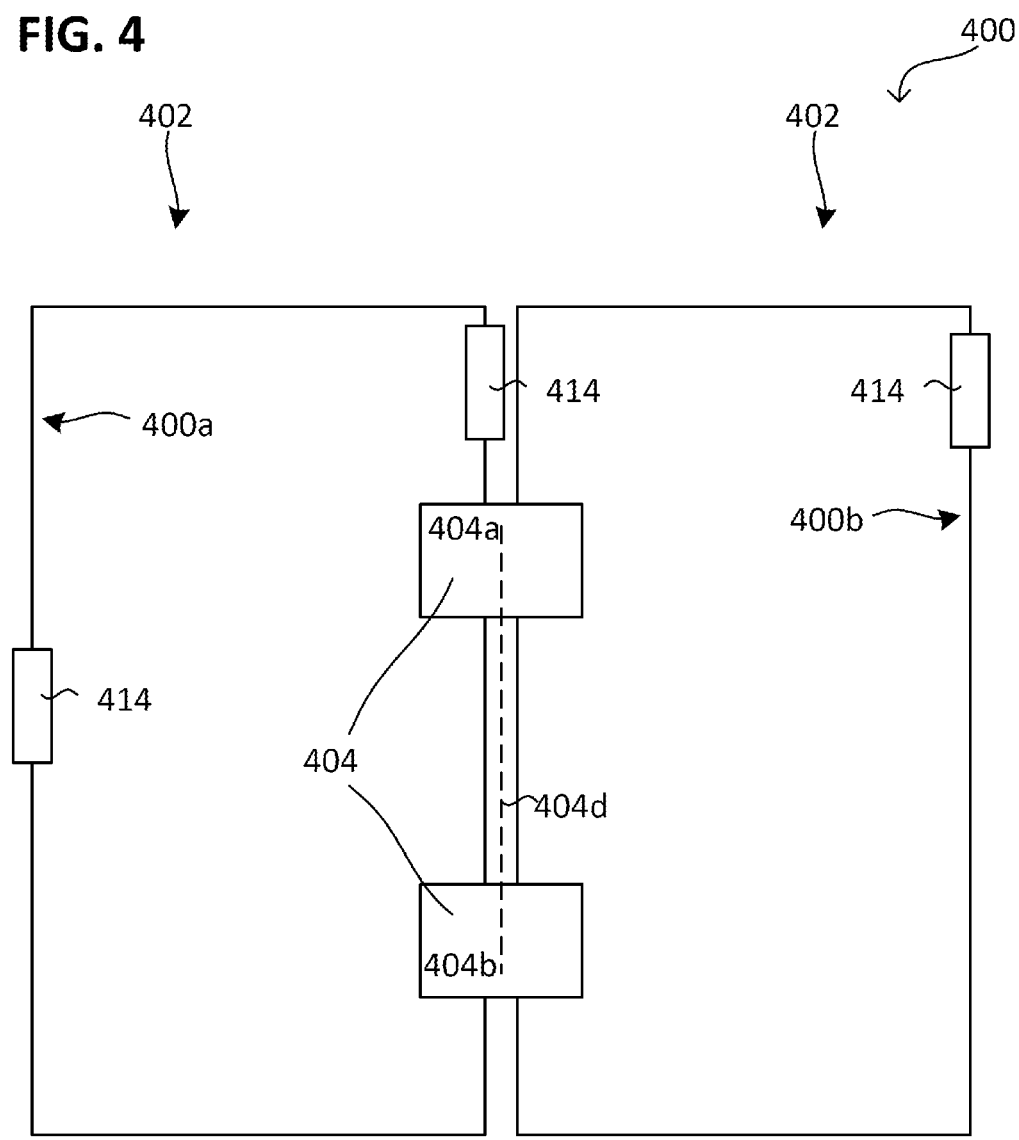
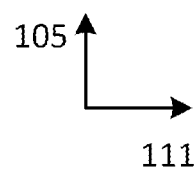

Fig. 13
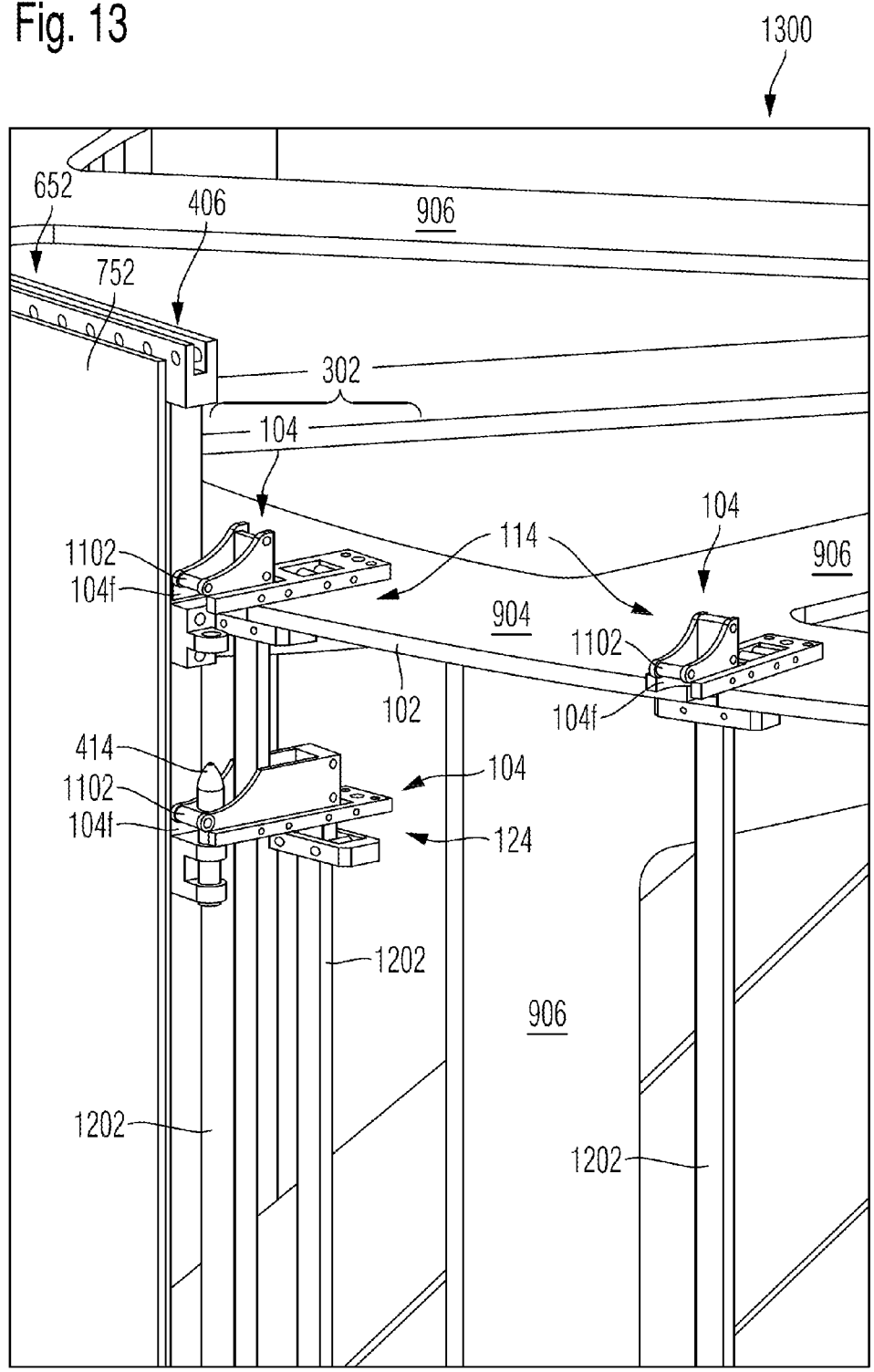
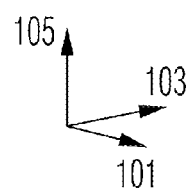

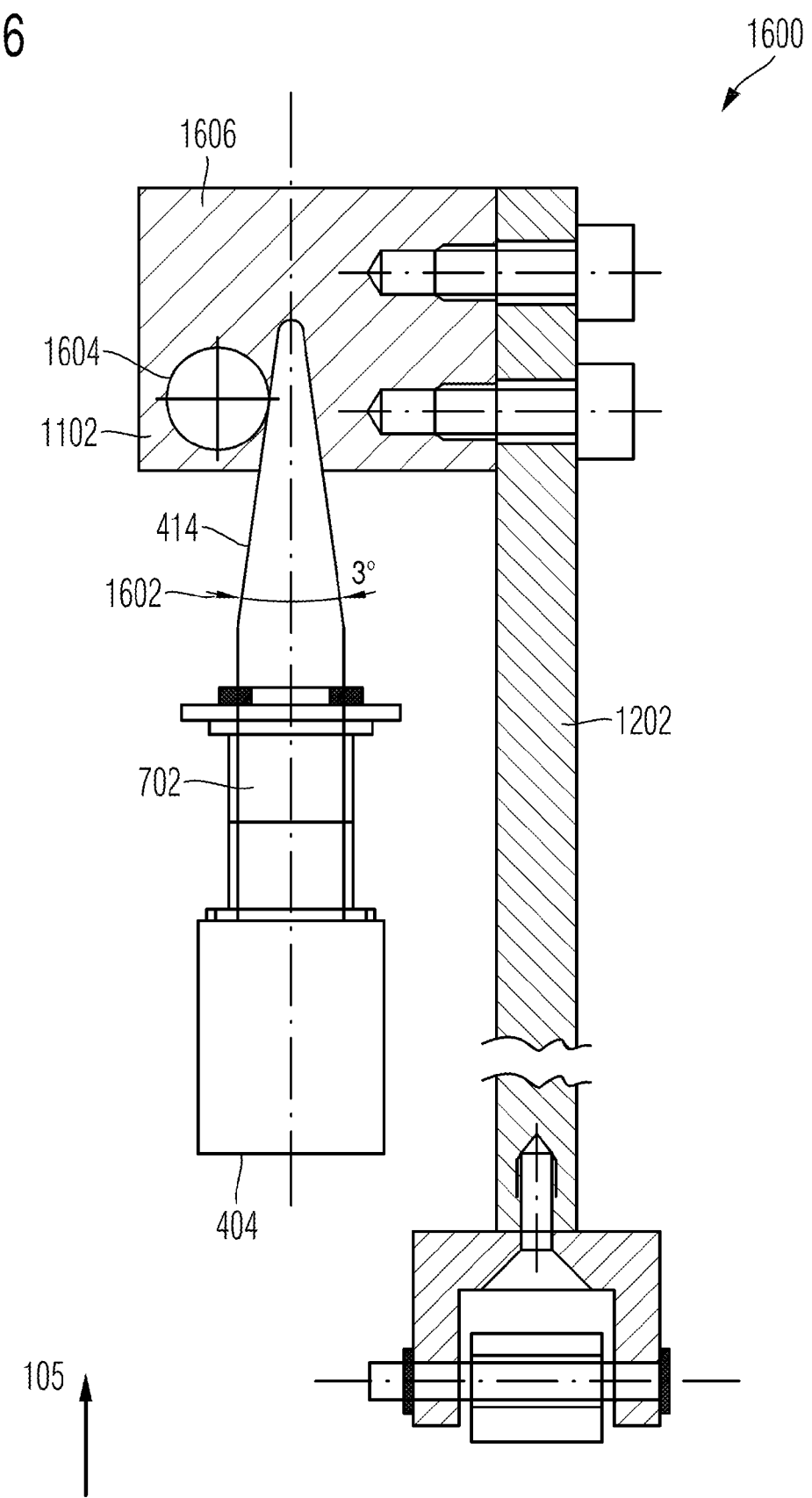

Fig. 19
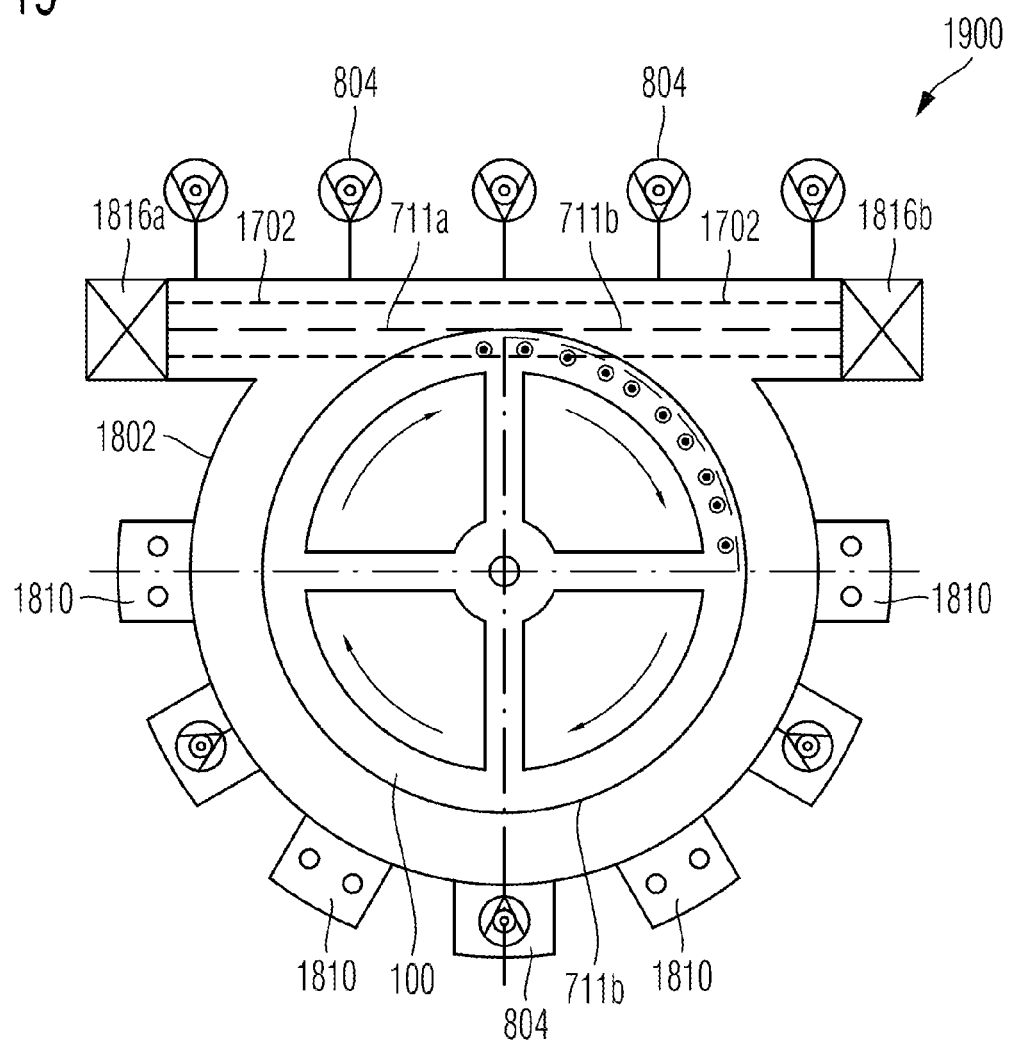

Fig. 24
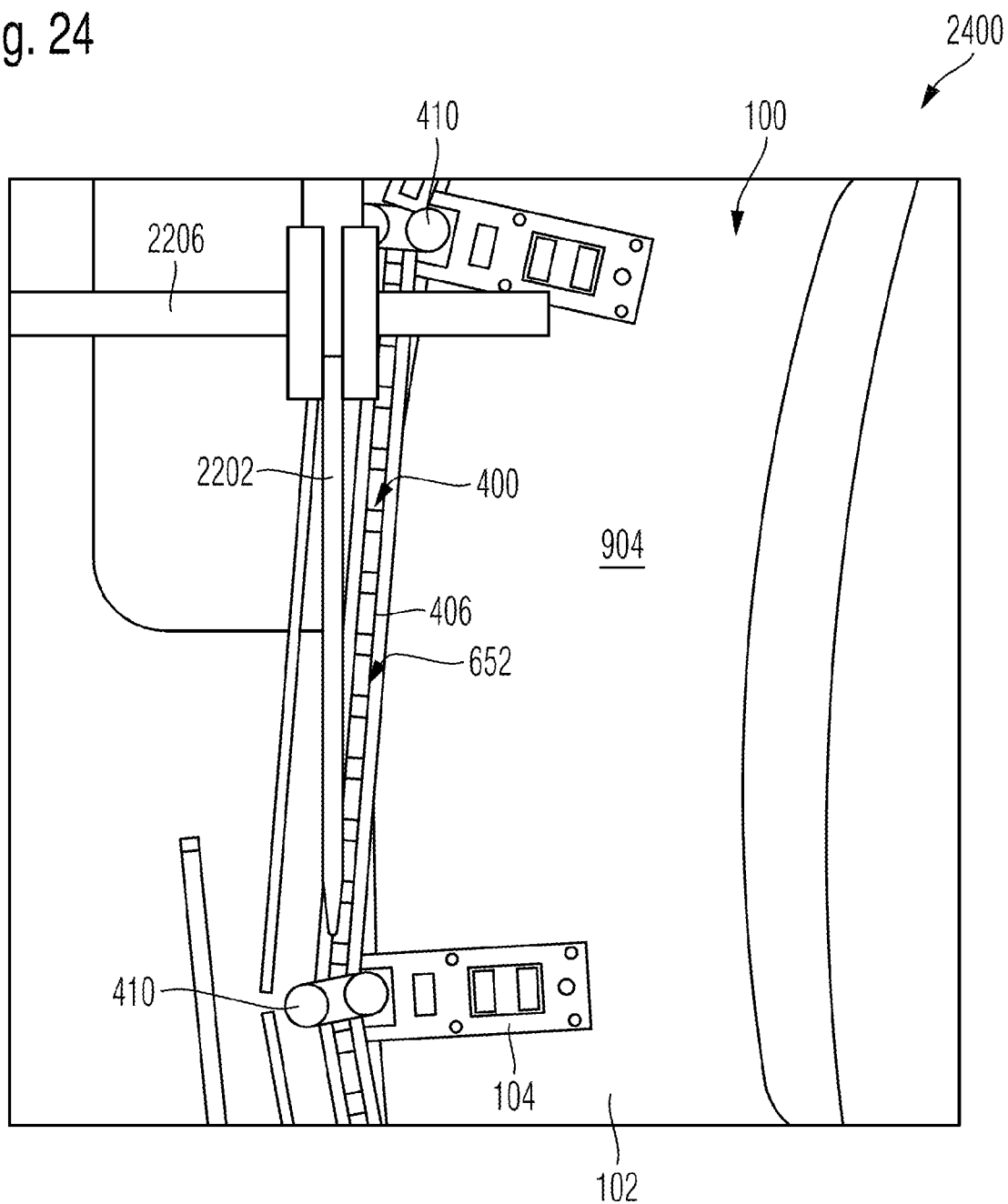

Fig. 26
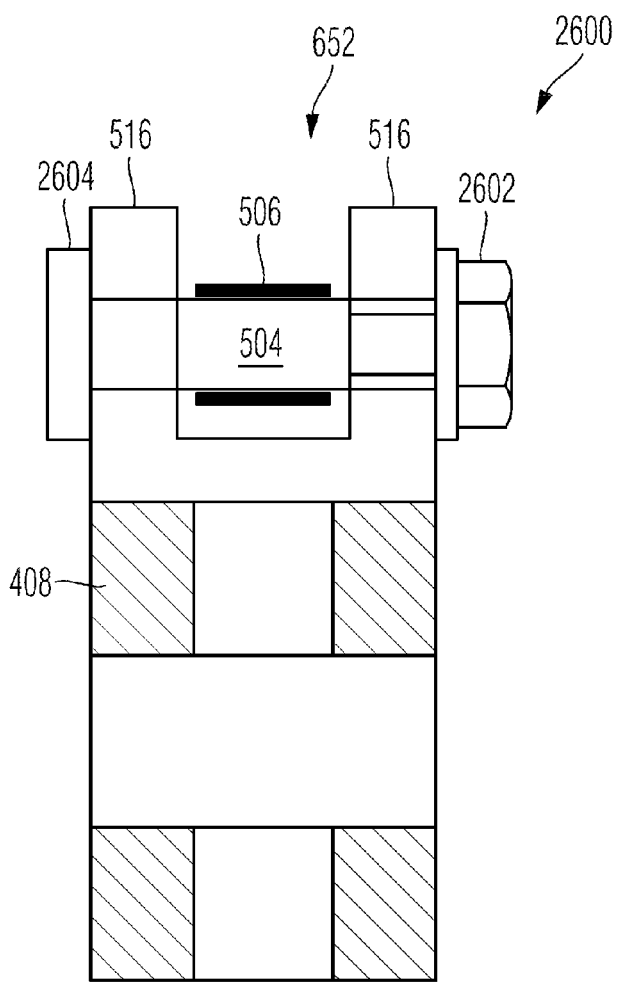
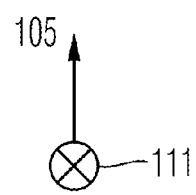

Fig. 29
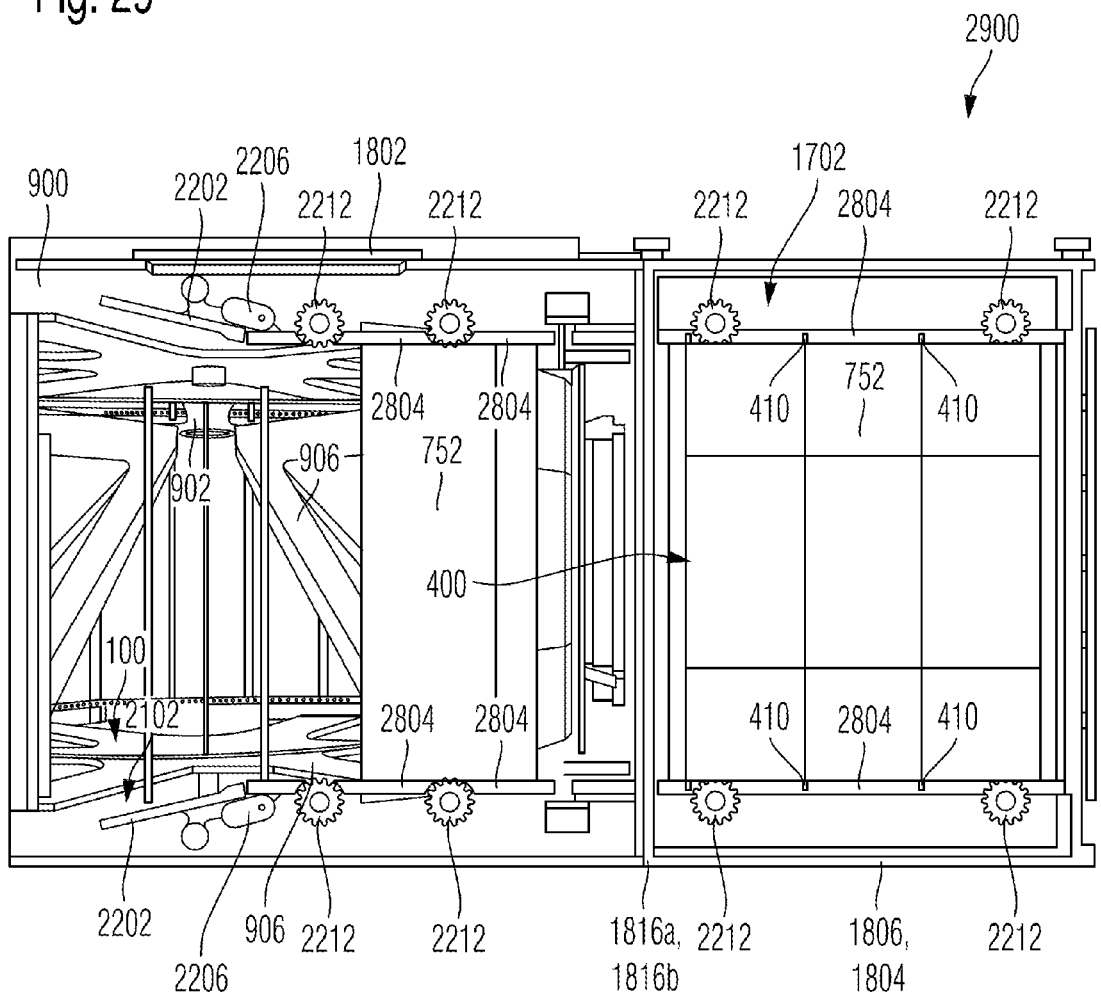
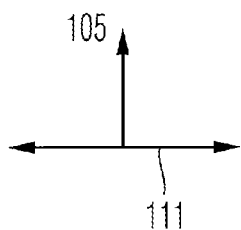

FIG. 30
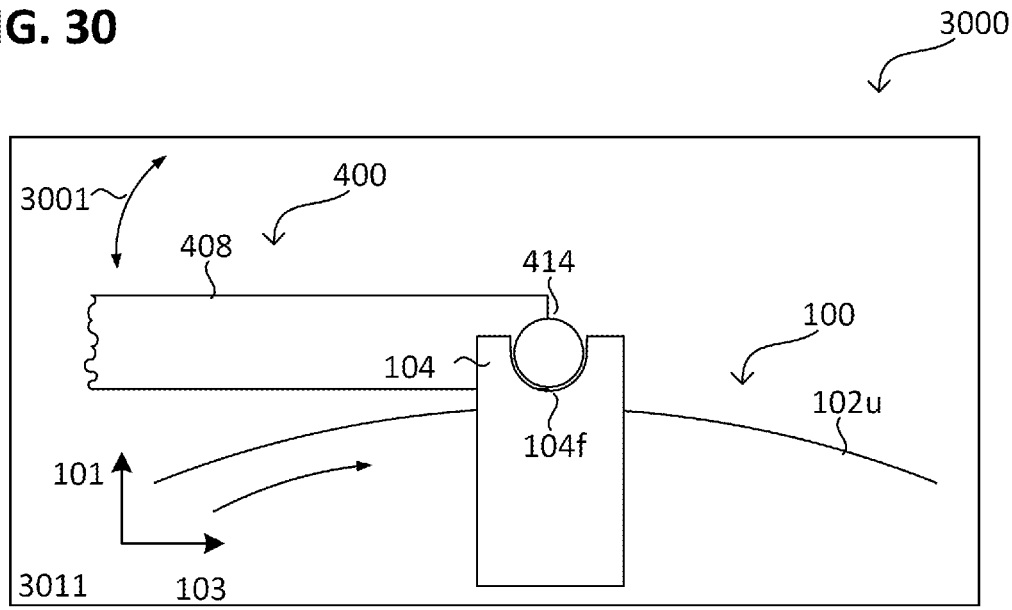
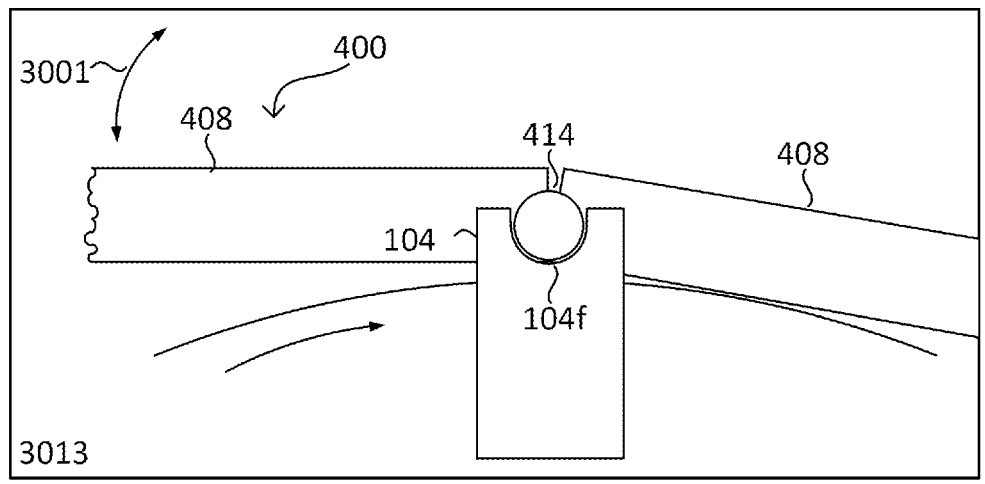
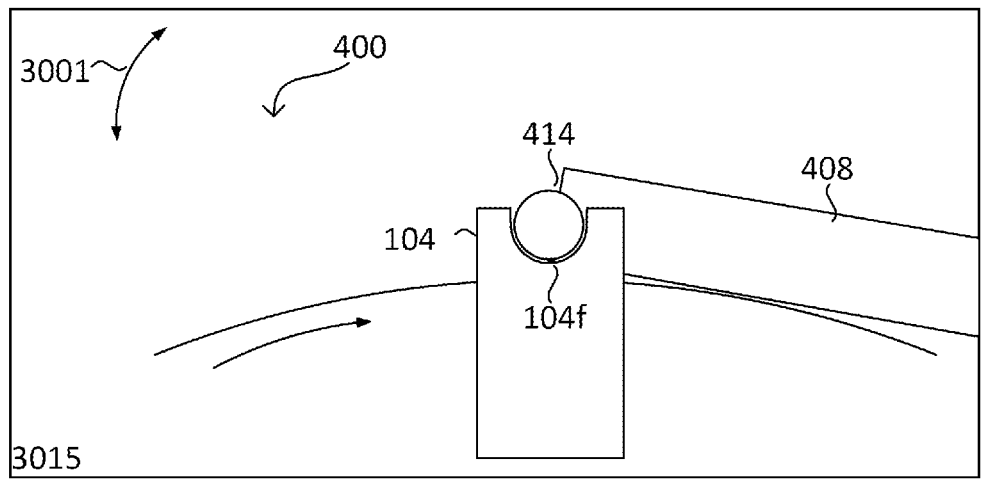

FIG. 31
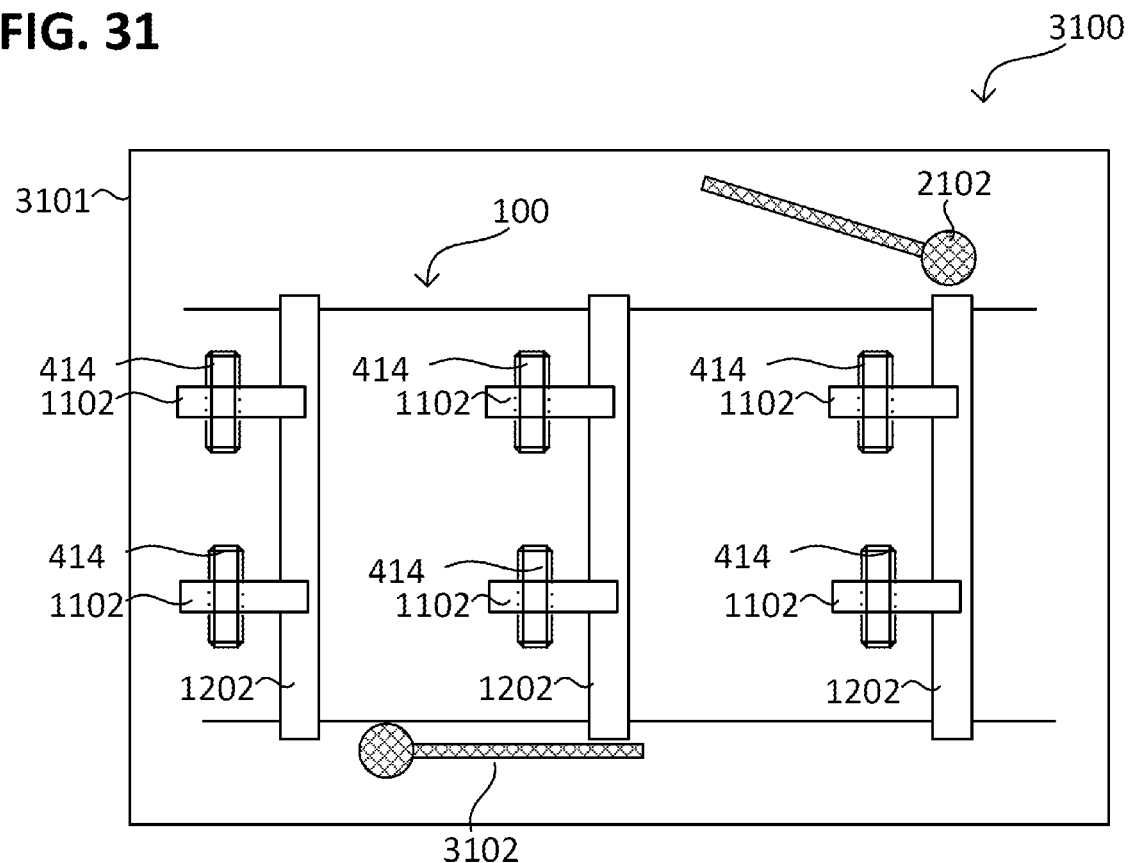
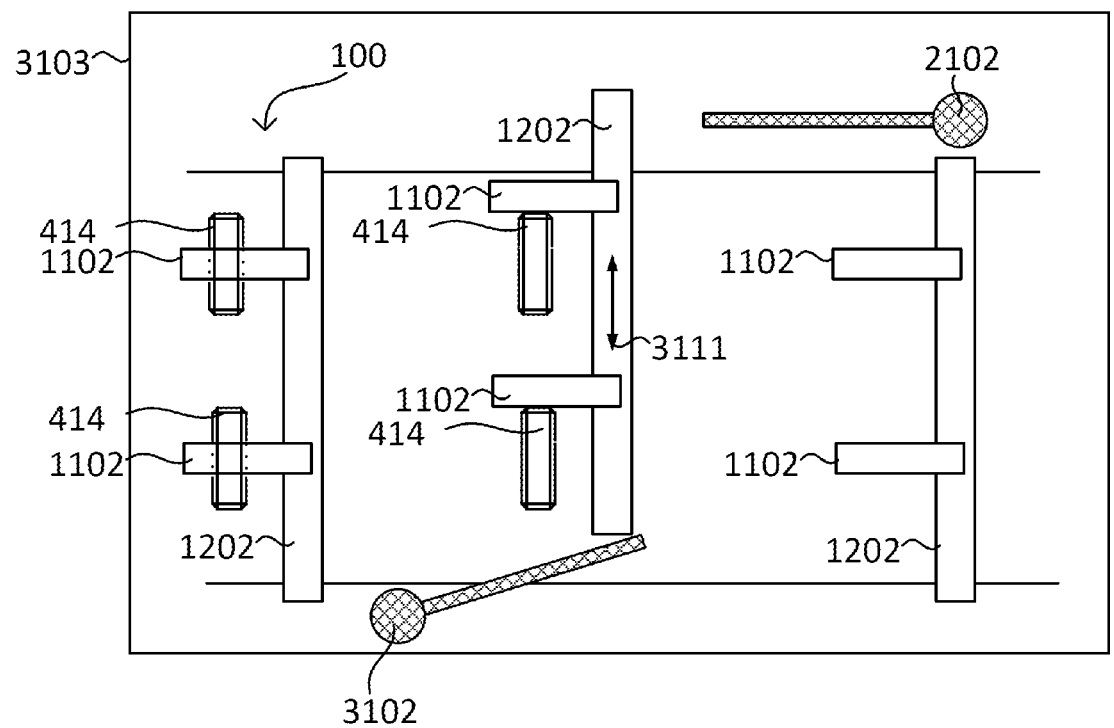

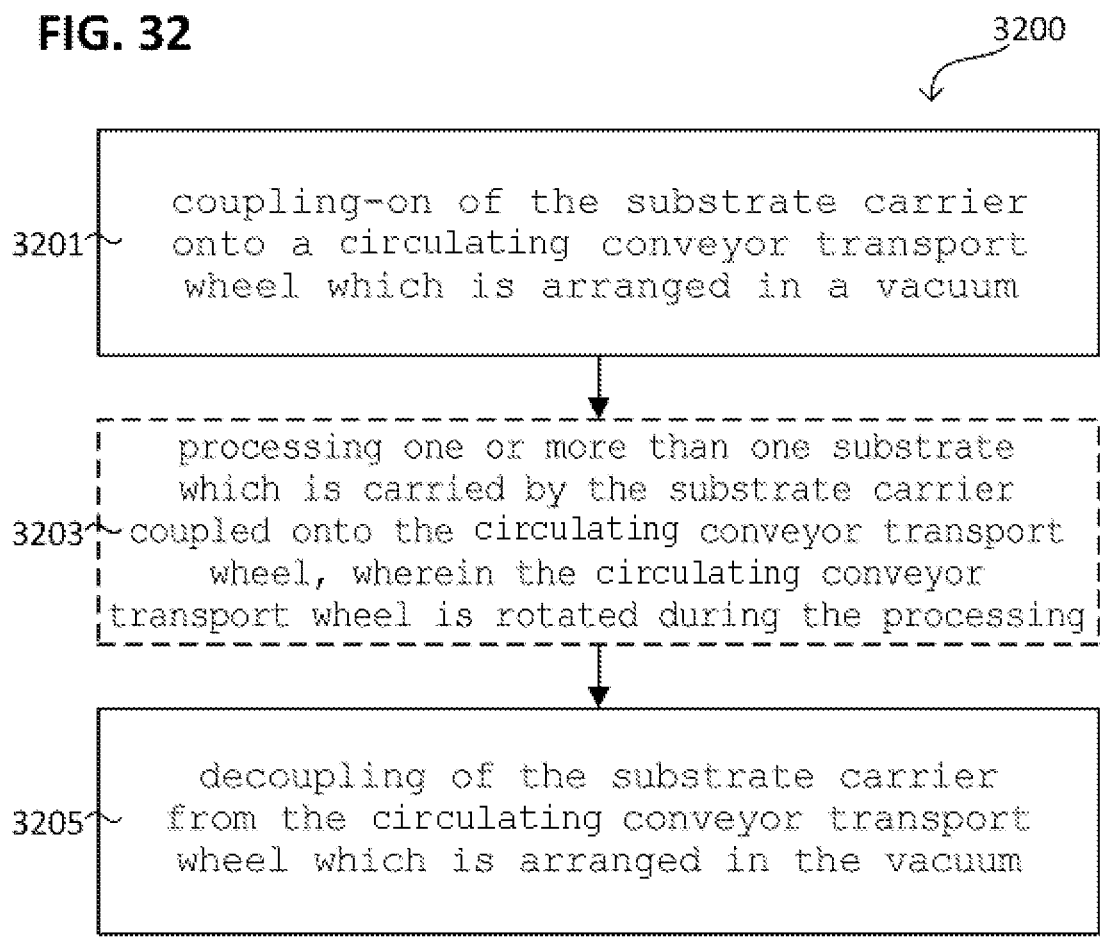

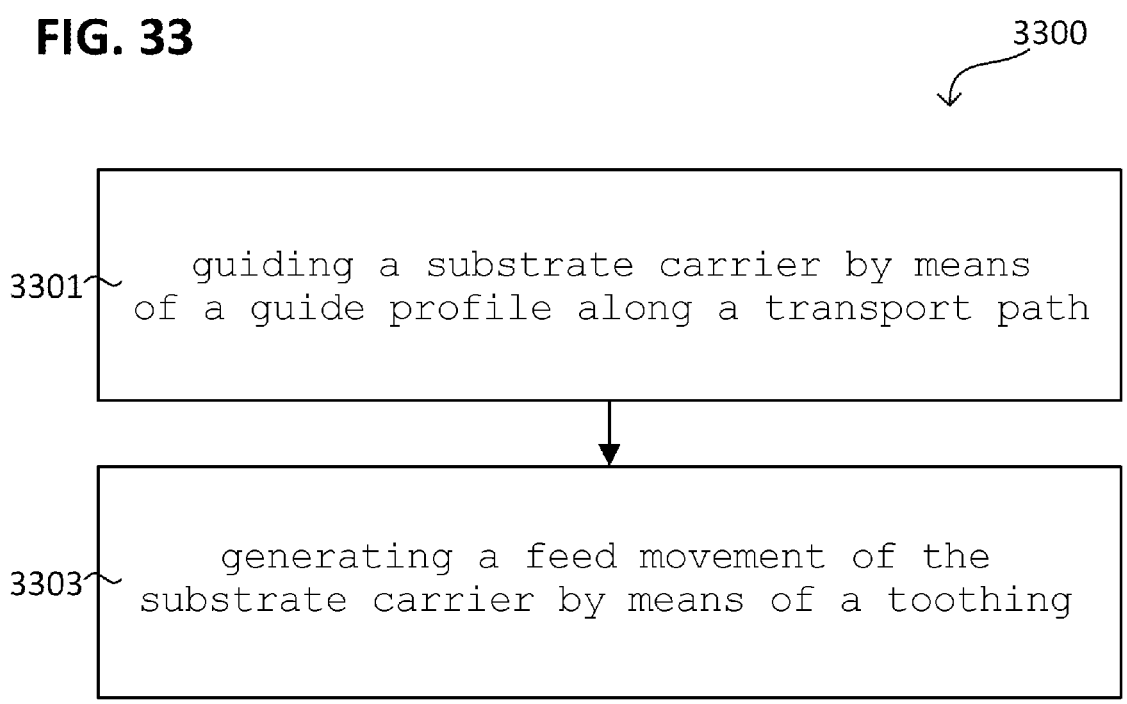

CIRCULATION CONVEYOR TRANSPORT WHEEL, SUBSTRATE CARRIER AND METHOD

CROSS-CITING TO RELATED APPLICATIONS

This application claims priority to German Application 10 2020 101 460.0, which was filed on Jan. 22, 2019, the entirety of which is incorporated herein fully by reference.

TECHNICAL FIELD

Various exemplary aspects of the disclosure relate to a circulation conveyor transport wheel, a substrate carrier and a method.

BACKGROUND

In general, a substrate, for example a glass substrate, a metal substrate and/or a polymer substrate, may be treated (processed), for example coated, such that the chemical and/or physical characteristics of the substrate may be changed. Various coating processes may be performed in order to coat a substrate. For example, a vacuum coating installation may be utilized in order to deposit a layer or multiple layers on a substrate or on multiple substrates by means of chemical and/or physical vapor deposition.

The substrate may basically be processed in a horizontal or upright position.

If the installation is intended to be of a particularly space-saving form, it is conventional, in a so-called vertical installation, for an upright substrate to be transported in a circulating fashion for example by means of a so-called drum. Here, the substrate transported in this way passes cyclically through the same regions of the vertical installation, in which, for example, a coating process may be performed. Such a vertical installation is particularly space-saving because the drum, as a transporting component, may be arranged in an extremely small space, and the components which perform the processing may be arranged so as to surround said drum. However, a vertical installation requires that the drum be loaded with a group of substrates in a time-consuming manner and that, after the processing of said substrates, said drum be unloaded again in a time-consuming manner, which results in an interruption of operation.

By contrast, if it is sought to achieve high throughput, use is conventionally made of a so-called in-line installation, in which a flow of substrates is transported continuously through the entire in-line installation, such that the process of loading and unloading takes place at the same time as the processing. For example, during the transport of the substrate through the in-line installation, a coating process is performed in one or more regions of the in-line installation.

SUMMARY

In various aspects of the disclosure, it has been identified, by way of illustration, that the concept of the in-line installation, that is to say the sequential transport of a flow of substrates, may be combined with the concept of the vertical installation, that is to say the cyclic transport of a group of substrates. This achieves a greater throughput of substrates.

In various aspects of the disclosure, a circulation conveyor transport wheel, a substrate carrier and a method are provided which make it possible to attain a high throughput in a space-saving manner. By way of illustration, components and a method for a vertical installation are provided which make it possible for the process of loading and unloading to take place simultaneously with the processing in an extremely small space.

According to various aspects of the disclosure, a circulation conveyor transport wheel may have: a framework at which the circulation conveyor transport wheel may be rotatably mounted; a multiplicity of coupling devices which are arranged at an outer circumference of the framework and of which each of the coupling devices has two form-fit contours for the form-fitting coupling-on of a substrate carrier, wherein the multiplicity of coupling devices has a pair of coupling devices, the form-fit contours of which have a smaller spacing to one another along the circumference than to the form-fit contours of the multiplicity of coupling devices which are arranged immediately adjacent to the pair.

According to various aspects of the disclosure, a substrate carrier may have: multiple members which are connected to one another (for example in pairwise fashion) by means of a hinge; two carriages which are arranged on mutually opposite sides of the substrate carrier and which serve for guiding the substrate carrier along the transport path; wherein at least one of the two carriages has a lantern-gear rack.

According to various aspects of the disclosure, a method may include: coupling (also referred to herein as coupling-on) the substrate carrier onto a circulation conveyor transport wheel (a transport wheel of a circulation conveyor) which is arranged in a vacuum; decoupling (herein also referred to as coupling-off) the substrate carrier from the circulation conveyor transport wheel which is arranged in the vacuum, wherein the coupling-on and the decoupling begin at the same side of the substrate carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed aspect of the disclosure. In the following description, various aspects of the disclosure are described with reference to the following drawings, in which:

FIGS. 1 to 3 each show a circulation conveyor transport wheel according to various aspects of the disclosure in various views;

FIGS. 4 to 8 each show a substrate carrier according to various aspects of the disclosure in various views;

FIGS. 9 to 16 each show a circulation conveyor e.g., a circulating conveyor) according to various aspects of the disclosure in various views;

FIGS. 18 to 25 each show a vacuum arrangement according to various aspects of the disclosure in various views;

FIG. 26 shows a substrate carrier according to various aspects of the disclosure in a schematic cross-sectional view;

FIGS. 28 and 29 each show a vacuum arrangement according to various aspects of the disclosure in various views;

FIG. 30 shows a circulation conveyor (e.g., a circulating conveyor) in a method according to various aspects of the disclosure in a schematic plan view;

FIG. 31 shows a conveying arrangement in a method according to various aspects of the disclosure in a schematic plan view;

FIGS. 32 and 33 each show a method according to various aspects of the disclosure in a schematic flow diagram.

DETAILED DESCRIPTION

Figure 1:
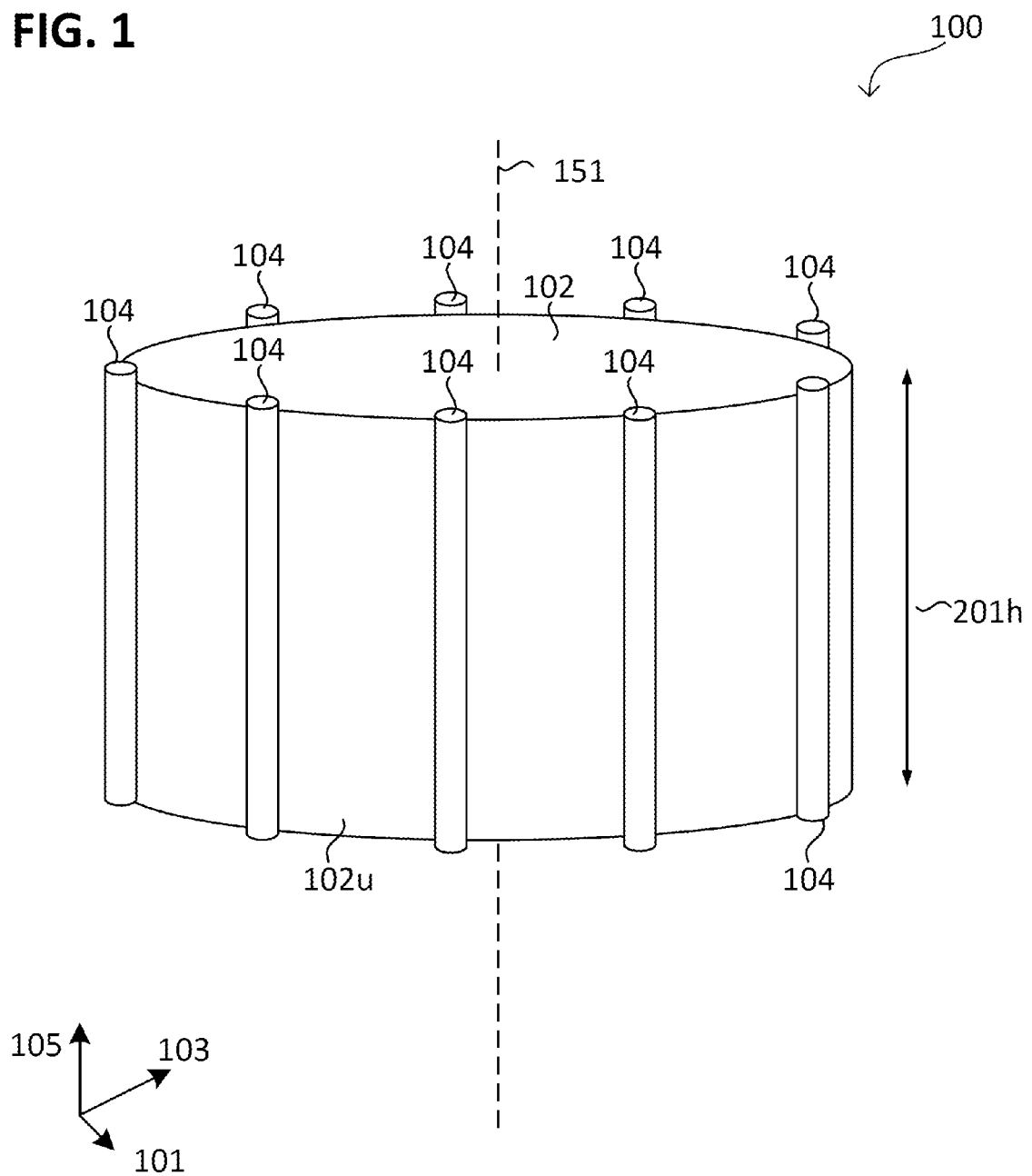

In the following detailed description, reference will be made to the appended drawings, which form part of this description and in which, for illustrative purposes, specific aspects of the disclosure are shown in which the disclosure may be implemented. In this regard, directional terminology such as "upwards", "downwards", "forwards", "rearwards", "front", "rear" etc. is used in relation to the orientation of the described figure(s). Since components of aspects of the disclosure may be positioned in a number of different orientations, the directional terminology serves for illustrative purposes and is in no way restrictive. It is self-evident that other aspects of the disclosure may be utilized, and structural or logical modifications made, without departing from the scope of protection of the present disclosure. It is self-evident that the features of the various exemplary aspects of the disclosure described herein may be combined with one another unless specifically stated otherwise. The following detailed description is therefore not to be considered in a restrictive sense, and the scope of protection of the present invention is defined by the appended claims.

In the context of this description, the expressions "connected", "attached" and "linked" are used to describe both a direct and an indirect connection (for example ohmic and/or electrically conductive), a direct or indirect attachment and a direct or indirect link. In the figures, identical or similar elements have been denoted by identical reference designations where expedient.

According to various aspects of the disclosure, the expression "linked" or "link" may be understood in the sense of a (for example mechanical, hydrostatic, thermal and/or electrical) for example direct or indirect connection and/or interaction. Multiple elements may be linked to one another, for example, along an interaction chain, along which the interaction (for example a signal) may be transmitted. For example, two linked-together elements may exchange an interaction with one another, for example a mechanical, hydrostatic, thermal and/or electrical interaction. According to various aspects of the disclosure, "coupled" may be understood in the sense of a mechanical (for example physical) link, for example by means of direct physical contact. A coupling may be configured to transmit a mechanical interaction (for example force, torque, vibration etc.). Coupling-on may be understood herein to mean that the coupling is established. Decoupling may be understood herein to mean that the coupling is eliminated.

The coupling-on of two components onto one another may for example include that said components are brought into physical contact with one another (that is to say are physically contacted with one another). The coupling-on of the two components may for example further include that their collective sum of degrees of freedom is reduced, for example by virtue of a relative movement (for example translation and/or rotation) between the components being blocked (for example along and/or counter to one or more than one direction). This blocking of the relative movement (also referred to as blocked degree of freedom) may for example be performed by virtue of the two components being coupled to one another in form-fitting fashion.

The decoupling of two components from one another may for example include said components being detached and/or removed from one another. The decoupling of the two components may for example further include their collective sum of degrees of freedom being increased, for example by virtue of a relative movement (for example translation and/or rotation) between the components being enabled (for example along and/or counter to one or more than one direction).

A form-fitting coupling (also referred to as form fit or as tight fit) may be provided by means of engagement of the two components into one another. For example, the form fit may be configured such that the two components may not be detached from one another even in the absence, or in the event of an interruption, of a transmission of force. By way of illustration, the form fit has the effect that one component restricts a movement of the other component, such that the relative movement thereof is blocked. In order to be able to engage into one another, the two components have form-fit contours which match one another (also referred to as a pair of form-fit contours) and which are configured for engaging into one another. For example, the form-fit contours may correspond to one another, for example in terms of contour size and/or contour profile.

If the pair of form-fit contours has two cylinder surfaces which are coaxial with respect to one another, then the form fit may block the relative movement in all directions of the surface perpendicular to the cylinder axis. One example is a pin which is inserted into a hole and which is removable again. If the hole is a blind hole, in order that the pin may not fall through, there is additionally a unilateral form fit (also referred to as unidirectional form fit) in an axial direction. If the outer cylinder surface is divided along the axial direction into two halves (that is to say along a surface in which the axial direction lies) and one of the halves is removed, the form fit may block the relative movement to both sides along a direction (also referred to as bilateral form fit) which lies in the surface of the division, and may block unilaterally along a direction which lies transversely with respect to the surface of the division.

A pin-like form-fit contour may also be provided by means of a rivet, a bolt and/or a screw. Below, reference will be made inter alia to a bolt for providing a form-fit contour. The description may also apply analogously to other bodies which provide the form-fit contour.

In various aspects of the disclosure, the form-fit coupling-on may provide at least a bilateral form fit (also referred to as bidirectional form fit) (that is to say block a relative movement along and counter to the same first direction) and optionally provide at least one additional unilateral form fit (that is to say block a relative movement along another, second direction). The decoupling may in turn enable the relative movement. Where reference is made herein to the blocking or enablement of multiple directions, these directions may be perpendicular to one another.

Open-loop control may be understood to mean intentional influencing of a system. Here, the present state of the system (also referred to as actual state) may be varied in accordance with a specification (also referred to as setpoint state). Closed-loop control may be understood to mean open-loop control with additional counteraction of a change in state of the system resulting from perturbations. It may be seen that the open-loop control system may involve a feedforward control path and thus implement clear sequential control which converts an input variable (for example the specification) into an output variable. The control path may however also be part of a closed control loop, such that closed-loop control is implemented. By contrast to purely feedforward sequential control, closed-loop control involves continuous influence of the output variable on the input variable, which is effected by means of the closed control loop (feedback).

In other words, a closed-loop control system may be used as an alternative or in addition to the open-loop control system, or closed-loop control may be performed as an alternative or in addition to open-loop control. The state of the system (also referred to as operating point) may be represented by one or more than one controlled variables of the system, the actual value of which represents the actual state of the system and the setpoint value of which (also referred to as guiding value) represents the setpoint state of the system. In the case of closed-loop control, an actual state of the system (ascertained for example on the basis of a measurement and/or by means of a sensor) is compared with the setpoint state of the system, and the one or more than one controlled variable is influenced by means of a corresponding manipulated variable (using an actuating element) such that the deviation of the actual state from the setpoint state of the system is minimized.

A sensor may be part of a measurement chain which has a corresponding infrastructure (for example having processor, memory medium and/or bus system or the like). The measurement chain may be configured to activate the corresponding sensor, process the detected measured variable thereof as input variable, and on the basis of this provide an electrical signal as output variable, which represents the actual state of the input variable at the time of the detection. The measurement chain may for example be implemented by means of a control device (for example a programmable logic controller—PLC).

The expression "control device" may be understood to mean any type of logic-implementing entity, which may for example have a circuit and/or a processor which may for example execute software, which is stored in a memory medium, in firmware or in a combination of these, and may output commands on the basis of this. The control device may for example be configured, by means of code segments (for example software), to control the operation of a system (for example the operating point thereof), for example of a machine or of an installation, for example at least of the kinematic chain thereof. The control device may for example have or be formed from a programmable logic controller (PLC).

The expression "processor" may be understood to mean any type of entity which permits the processing of data or signals. The data or signals may for example be handled in accordance with at least one (that is to say one or more than one) specific function which is executed by the processor. A processor may have or be formed from an analogue circuit, a digital circuit, a mixed-signal circuit, a logic circuit, a microprocessor, a central processing unit (CPU), a graphics processing unit (GPU), a digital signal processor (DSP), a field-programmable gate array (FPGA), an integrated circuit or any combination of these. Any other form of implementation of the respective functions described in more detail below may also be understood as a processor or logic circuit, for example also virtual processors (or a virtual machine) or a multiplicity of decentralized processors, which for example are connected to one another by means of a network, are spatially distributed in any desired manner and/or perform any desired proportion of the implementation of the respective functions (for example processing load distribution among the processes). The same applies generally for a logic implemented in some other way for implementing the respective functions. It is self-evident that one or more of the method steps described in detail herein may be executed (for example realized) by a processor by means of one or more specific functions executed by the processor.

The expression "actuating element" (also referred to as actuator) may be understood as a component which is configured for influencing a mechanism or a process in response to an activation. The actuator may convert commands output by the control device (the so-called activation) into mechanical movements or changes in physical variables such as pressure or temperature. The actuator, for example an electromechanical transducer, may for example be configured to convert electrical energy into mechanical energy (for example by movement) in response to an activation.

Using a substrate carrier as described herein, it is possible for one or more than one substrate to be held and transported (for example per member). The substrate may have a width in a range from approximately 50 cm (centimeters) to approximately 500 cm, or a width of more than approximately 500 cm. In various aspects of the disclosure, the substrate may have or be formed from at least one of the following: a ceramic, a glass, a semiconductor (for example amorphous, polycrystalline or monocrystalline semiconductor, such as silicon), a metal, and/or a polymer (for example plastic). For example, the substrate may be a plastics film, a wafer (a semiconductor substrate), a metal film, a metal sheet or a glass plate, and may optionally be coated.

In various aspects of the disclosure, a treatment (also referred to as processing) of a substrate may include at least one of the following: cleaning the substrate, coating the substrate, irradiating/blasting (for example by means of light, UV light, particles, electrons, ions, etc.) the substrate, modifying the surface of the substrate, warming the substrate, etching the substrate and subjecting the substrate to a glow discharge.

A coating material with which the substrate may be coated may have or be formed from at least one material of the following materials: a metal; a transition metal; an oxide (for example a metal oxide or a transition metal oxide); a dielectric; a polymer (for example a carbon-based polymer or a silicon-based polymer); an oxynitride; a nitride; a carbide; a ceramic; a metalloid (for example carbon); a perovskite; a glass or glass-like material (for example a sulfide glass); a semiconductor; a semiconductor oxide; a semiorganic material, and/or an organic material.

In the context of this description, a metal (also referred to as metallic material) may have (or be formed from) at least one metallic element (that is to say one or more metallic elements), for example at least one element from the following group of elements: copper (Cu), iron (Fe), titanium (Ti), nickel (Ni), silver (Ag), chromium (Cr), platinum (Pt), gold (Au), magnesium (Mg), aluminum (Al), zirconium (Zr), tantalum (Ta), molybdenum (Mo), tungsten (W), vanadium (V), barium (Ba), indium (In), calcium (Ca), hafnium (Hf), samarium (Sm), silver (Ag), and/or lithium (Li). Furthermore, a metal may have or be formed from a metallic compound (for example an intermetallic compound or an alloy), for example a compound composed of at least two metallic elements (for example from the group of elements), such as for example bronze or brass, or for example a compound composed of at least one metallic element (for example from the group of elements) and at least one nonmetallic element (for example carbon), such as for example steel. Optionally, the metal may have alloy elements (the mass fraction of which is for example less than 10%, for example individually or collectively), for example chromium, silicon, molybdenum, nickel, vanadium, carbon, manganese, phosphorus, sulfur, tin, zinc.

Here, a toothed gear may be understood to mean any substantially circular body which has a multiplicity of drive teeth which are arranged along a circumference of the body. The toothed gear may for example have or be formed from a toothed disk, a spur gear, a lantern-gear pinion or a toothed ring. Using the toothed gear, a toothing may be provided, for example a lantern-gear toothing. The lantern-gear toothing is a special form of cycloidal toothing, in the case of which the pitch circle and rolling circle are of equal size. The toothing may be implemented in straight, that is to say axially parallel, or helical form (helical toothing), or as a spiral toothing. The size of the toothing is determined as a modulus (also referred to a diameter pitch). The counterpart gear (herein also referred to as counter-gear) or the toothed rack may have a toothing (e.g., interlocking and/or gearing) of the same modulus as the toothed gear.

If two components are arranged offset with respect to one another along a path or a direction, this may be understood to mean that the two components are, when projected onto a surface which is transverse with respect to the path or the direction, arranged adjacent to one another or so as to only partially overlap (not so as to be congruent). For example, the two components may have a spacing to one another along a direction which is transverse with respect to the path or the direction.

FIG. 1 illustrates a circulation conveyor transport wheel 100 according to various aspects of the disclosure in a schematic perspective view.

The circulation conveyor transport wheel 100 has a framework 102, at which the circulation conveyor transport wheel may be rotatably mounted, and a multiplicity of coupling devices 104, which are arranged at an outer circumference 102$u$ of the framework 102. The corresponding axis of rotation 151 may be parallel to the direction 105. During the operation of the circulation conveyor transport wheel 100, direction 105 may for example be counter to a direction of gravity, that is to say along a vertical (also referred to as vertical direction).

The multiplicity of coupling devices 104 may for example have at least 4 coupling devices 104, for example at least 6 coupling devices 104, for example at least 8 coupling devices 104, for example at least 10 coupling devices 104, for example at least 16 coupling devices 104, for example at least 20 coupling devices 104, for example at least 26 coupling devices 104.

A height 201$h$ (extent along the axis of rotation 151 of the circulation conveyor transport wheel 100) of the circulation conveyor transport wheel 100 may be in a range from approximately 0.5 m to approximately 2 m (meters), for example in a range from approximately 1 m to approximately 1.5 m. Alternatively or in addition, a diameter 201$d$ (extent transversely with respect to the axis of rotation 151 of the circulation conveyor transport wheel 100) of the circulation conveyor transport wheel 100 may be in a range from approximately 1 m to approximately 5 m (meters), for example in a range from approximately 2 m to approximately 3 m.

Figure 2:
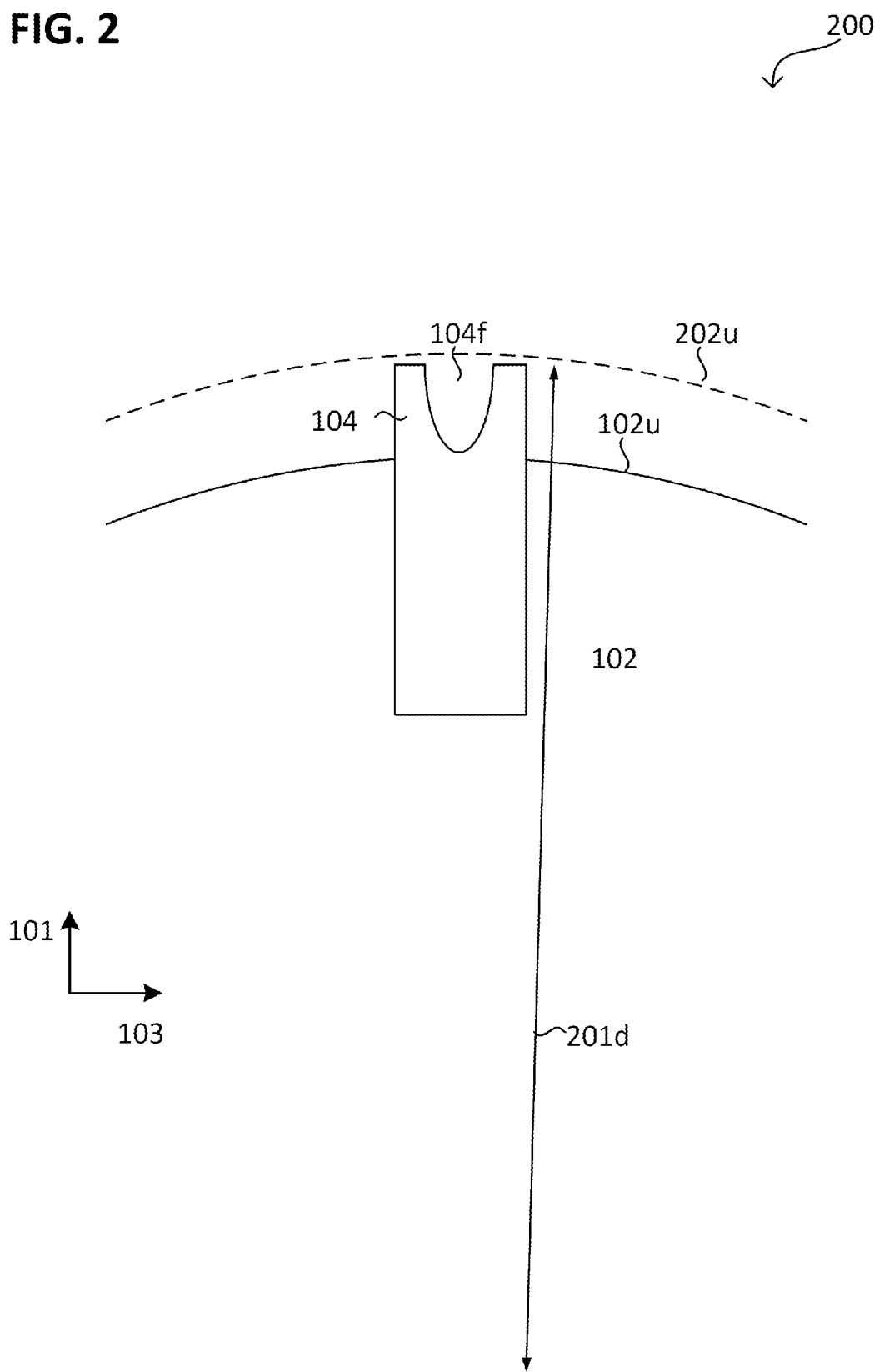

FIG. 2 illustrates a circulation conveyor transport wheel 100 according to various aspects 200 of the disclosure in a schematic detail view of one of the coupling devices 104. Each of the coupling devices 104 may have one or more than one form-fit contour 104$f$ (also referred to as receiving point) for the form-fitting coupling-on of a substrate carrier. In the example illustrated, the coupling device 104 may have a fork which has a (for example cylindrical) cutout, the outer delimitation of which provides the form-fit contour 104$f$. The cutout may for example provide a concave curvature as form-fit contour 104$f$. The cutout may extend into the fork toward the interior of the circulation conveyor transport wheel 100, for example toward the axis of rotation thereof.

A coupling device 104 with one fork will be referred to below by way of example. The description given may self-evidently apply analogously to a coupling device 104 configured in some other way. For example, the coupling device 104 may have a bolt as an alternative or in addition to the fork. For example, the coupling device 104 may have a convex curvature as an alternative or in addition to the concave curvature. The form-fit contour 104$f$ however does not necessarily have to be curved. For example, the form-fit contour 104$f$ may also be angled.

In the exemplary aspects 200 of the disclosure illustrated here, the fork 104 may protrude from the framework 102 or from the circumference 102$u$ of the framework 102. The circumference 102$u$ of the framework 102 may be the circumference of a circle which has the diameter of the framework 102. The circumference 202$u$ of the circulation conveyor transport wheel 100 may accordingly be larger and be the circumference of a circle which has the diameter 201$d$ of the circulation conveyor transport wheel 100.

The form-fit contour 104$f$ may optionally be configured such that a counterpart coupling device (herein also referred to as counter-coupling device) of the substrate carrier (also referred to as coupling device of the substrate carrier), when joined together with the coupling device 104 of the circulation conveyor transport wheel, may be rotated relative to the form-fit contour 104$f$, such that a rotary joint is provided. This facilitates the coupling and decoupling of the substrate carrier, as will be described in more detail further below.

For this purpose, the form-fit contour 104$f$ may for example be cylindrically curved. For example, the cutout may have the shape of a cylinder (or of a part thereof), such that the form-fit contour 104$f$ runs along the lateral surface thereof. The cylinder may for example have a cylinder axis along the axis of rotation 151. The cylinder may for example be a circular cylinder or have a base area of some other shape.

Alternatively or in addition, the form-fit contour 104$f$ may be provided for example by means of a surface of revolution or a segment thereof. The surface of revolution may be a surface formed by rotation of a planar curve about a straight line lying in the same plane. The straight line may be along the axis of rotation 151.

FIG. 3 illustrates a circulation conveyor transport wheel 100 according to various aspects 300 of the disclosure in a schematic side view or cross-sectional view. The multiplicity of coupling devices 104 may have multiple first coupling devices which (for example the form-fit contours of which) are spatially separate from one another, that is to say have a spacing 301$d$ to one another, along the circumference (for example circular circumference), for example the direction thereof. The direction of the circumference (for example circular circumference) may be along a closed circular path which lies in the area 101, 103. The directions 101, 103 may, during the operation of the circulation conveyor transport wheel 100, be transverse with respect to the direction of gravity, that is to say span a horizontal area.

In illustrative terms, the spacing may be measured along the circumference, that is to say along a (for example circular) path which runs along the circumference and the length of which for example corresponds to the circumference. In other words, the spacing may be the circumference projected onto the circumference or onto the path. The direction of the circumference then runs for example clockwise or counterclockwise and follows the path. Expressed in cylindrical coordinates (r, z, φ), the circumference or the path extends (e.g., runs) on a line for which z=constant and r=constant. The spacing then corresponds to the length of the circular arc b spanned between the form-fit contours (that is to say whose ends lie on the form-fit contours), where b=π·r·φ$_{ij}$/180° (in units of degrees). The angle φ$_{ij}$ then denotes the angle spanned between the i-th and the j-th form-fit contour. The spacing between the form-fit contours may for example also be zero if these are arranged directly one above the other.

The circulation conveyor transport wheel 100 may have one or more than one plane pair which has two planes 114, 124 (referred to as plane pair). The two planes 114, 124 of the or each plane pair 114, 124 and/or multiple plane pairs 114, 124 may be arranged one above the other with respect to the axis of rotation 151, that is to say arranged one behind the other in direction 105. Below, for easier understanding, one of the plane pairs will be referred to. The description given may also apply analogously to multiple plane pairs.

The form-fit contours 104f of the multiple first coupling devices 104 may be arranged in a first plane 114 of the plane pair 114, 124.

The multiplicity of coupling devices 104 may have at least one (that is to say one or more than one) pair 302 of coupling devices (also referred to as coupling device pair 302), which has a first coupling device of the multiple first coupling devices and a second coupling device of the multiplicity of coupling devices 104. For example, the multiplicity of coupling devices 104 may have at least the (that is to say one or more than one) second coupling device, the form-fit contour 104f of which is arranged in a second plane 124 of the plane pair 114, 124. In other words, with respect to the axis of rotation of the circulation conveyor transport wheel 100, the form-fit contour 104f of the or each second coupling device 104 may be arranged in the second plane 124 of the plane pair 114, 124.

The form-fit contours of the pair 302 of coupling devices may be arranged adjacent to one another (for example one above the other) with respect to the direction of the circumference, or may overlap one another for example in a projection along the axis of rotation 151. In more general terms, the spacing of the form-fit contours 104f of the pair 302 of coupling devices as measured along the circumference may be smaller than the spacing 301d of the form-fit contours 104f of the first plane 114 of the plane pair 114, 124.

This has the effect that, at the region of the pair 302 of coupling devices, multiple form-fit contours are present in different planes 114, 124, such that mutually facing sides of different substrate carriers (the so-called end side thereof) may be coupled on as close together as possible. This has the effect of maintaining the repeating pattern of the substrate carriers as exactly as possible, such that these may be arranged in as space-saving a manner as possible. By way of illustration, by means of the pair 302 of coupling devices, it is possible for two different substrate carriers to be coupled on such that these lie against one another in as seamless a manner as possible.

Furthermore, the first coupling device and the second coupling device of the pair 302 of coupling devices may be configured such that the coupling-on and decoupling by means of the first coupling device and by means of the second coupling device may take place independently of one another. This has the effect that the substrate carriers may be wound on and wound off in succession, for example with a first end side of the substrate carrier leading in each case and a second end side of the substrate carrier trailing in each case. The first end side of the substrate carrier may be situated opposite the second end side of the substrate carrier.

FIG. 4 illustrates a substrate carrier 400 according to various aspects of the disclosure in a schematic side view (in a view transverse with respect to the transport direction). The substrate carrier 400 may have multiple members 402 (also referred to as carrier members) which are connected to one another (for example in pairwise fashion) by means of a hinge 404. A hinge may be understood to mean the sum of all components which couples two mutually immediately adjacent members 402 to one another such that these may be rotated relative to one another. For example, the hinge may have multiple hinge segments 404a, 404b which are spatially separate from one another and of which each hinge segment 404a, 404b couples the two mutually immediately adjacent members 402 to one another. Each of the hinge segments 404a, 404b may for example have a hinge bolt.

The members 402 may be arranged one behind the other along the transport direction 111 of the substrate carrier 400.

The substrate carrier 400 may further have two mutually opposite end sides 400a, 400b (also referred to as first end side and second end side). The first end side 400a may for example be the end side of a first carrier member 402 (also referred to as front carrier member 402) and the second end side 400b may for example be the end side of a second carrier member 402 (also referred to as rear carrier member 402).

For example, the substrate carrier 400 may have at least two members 402, for example at least three members 402, for example at least four members 402. Alternatively or in addition, the substrate carrier 400 may have a maximum of seven, for example a maximum of five, for example a maximum of four, for example a maximum of three members 402.

In more general terms, the substrate carrier 400 may have a number g=1+n of members 402, wherein n is a natural number greater than zero. Accordingly, in addition to the general three translation degrees of freedom and three rotational degrees of freedom, the substrate carrier 400 may additionally have n degrees of freedom provided by means of the hinges.

By means of each hinge 404, two mutually immediately adjacent members 402 may be configured to be movable relative to one another, which facilitates the winding-on of the substrate carrier 400 onto the circulation conveyor transport wheel 100 and the corresponding winding-off. The axis of rotation 404d of the hinge or each hinge (also referred to as hinge axis of rotation 404d) may for example run along direction 105 when the substrate carrier 400 has been coupled onto the circulation conveyor transport wheel 100.

Each of the members 402 may have a frame 408 (also referred to as support frame 408) which may carry one or more than one substrate. For example, three or more substrates may be carried by means of three members 402. For this purpose, each of the members 402 may have (for example for each substrate to be held) one substrate holding device on the support frame 408 for the purposes of holding a substrate.

Furthermore, the substrate carrier 400 may have multiple coupling devices 414 (also referred to as counterpart coupling devices 414). The multiple coupling devices may have, for each member 402, at least one first counterpart coupling device 414 and at least one second counterpart coupling device 414. For example, the multiple coupling devices may have a number of k=1+g counterpart coupling devices 414.

Each of the counterpart coupling devices 414 may have one or more than one form-fit contours corresponding to the form-fit contour 104*f* of the coupling devices 104. The mutually corresponding form-fit contours may be configured for engaging into one another in form-fitting fashion.

In the example illustrated, each of the counterpart coupling devices 414 may have one or more than one bolt which may fit into the cutout 104*f* of a fork 104. Each of the bolts (the outer delimitation thereof) provides a form-fit contour of the counterpart coupling devices 414 (also referred to as counterpart form-fit contour). A bolt may for example provide a convex curvature as counterpart form-fit contour (herein also referred to as counter-form-fit contour). The curvature may be curved toward the interior of the circulation conveyor transport wheel 100, for example toward the axis of rotation thereof.

Below, by way of example, a counterpart coupling device 414 with one or more than one bolt will be referred to. Each of the bolts may permit a fork-bolt connection with a fork of the coupling devices 104. The description given may self-evidently apply analogously to a counterpart coupling device 414 of some other configuration, for example a projection of some other configuration, which provides the counterpart form-fit contour. For example, the counterpart coupling devices 414 and the coupling device 104 may also permit some other form-fit connection, for example a tongue-and-groove connection or a ball-and-socket connection.

In general, the counterpart coupling devices 414 may, in addition or as an alternative to the convex curvature, have a concave curvature as a counterpart form-fit contour. The counterpart form-fit contour however need not necessarily be curved. For example, the counterpart form-fit contour may also be angled.

Each of the counterpart coupling devices 414 may be configured such that, when joined to the coupling device 104, it may be rotated relative to the coupling device 104 such that a rotary joint is provided. This facilitates the coupling and decoupling of the substrate carrier 400.

For this purpose, the counterpart form-fit contour may for example be cylindrically curved. For example, the projection of the counterpart coupling devices 414 (for example the bolt) may have the shape of a cylinder (or of a part thereof), such that the counterpart form-fit contour runs along the lateral surface thereof. The cylinder may for example have a cylinder axis along the hinge axis of rotation. The cylinder may for example be a circular cylinder or have a base area of some other shape.

Analogously to the multiple planes of the circulation conveyor transport wheel 100, the substrate carrier 400 may have (e.g., with respect to the hinge axis of rotation) one or more than one plane pair composed of planes arranged one above the other, of which each plane has at least one of the multiple counterpart form-fit contours. For example, two or more first counterpart form-fit contours may be arranged in a first plane of the or each plane pair or be configured for engaging with the first coupling devices of the circulation conveyor transport wheel 100. For example, at least one second counterpart form-fit contour may be arranged in a second plane of the or each plane pair or be configured for engaging with the at least one second coupling device of the circulation conveyor transport wheel 100.

In the aspects of the disclosure described below, the bolts of the counterpart coupling device 414 may be provided by means of the hinges 404, for example by means of bolts of the hinges 404 (then also referred to as hinge bolts), for example by means of the hinge bolts of the hinge segments 404*a*, 404*b*. This simplifies the construction. The hinge bolts may for example be provided as hinge pins (that is to say have a thickened end section).

The number and shape of the members 402 may be configured such that a first extent of the substrate carrier 400 along the transport direction 111 (also referred to as length) substantially corresponds to a second extent along direction 105 (that is to say transversely with respect to the transport direction 111). In other words, said extents may differ from one another by less than 20%. For example, the ratio of the length to the height (also referred to as aspect ratio) may be substantially 1 (that is to say in a range from approximately 0.8 to approximately 1.2). This reduces the risk of misalignment of the substrate carrier 400 (also referred to as drawer effect).

For example, the length may be in a range from approximately 1 m (meter) to approximately 1.5 m, for example approximately 1.3 m.

In aspects 400 of the disclosure, the coating window may be maintained, it is possible for an extremely large number of members (also referred to as carriage members) to be loaded and unloaded all at once (which saves time), and/or fewer drive devices are required.

Figure 5:
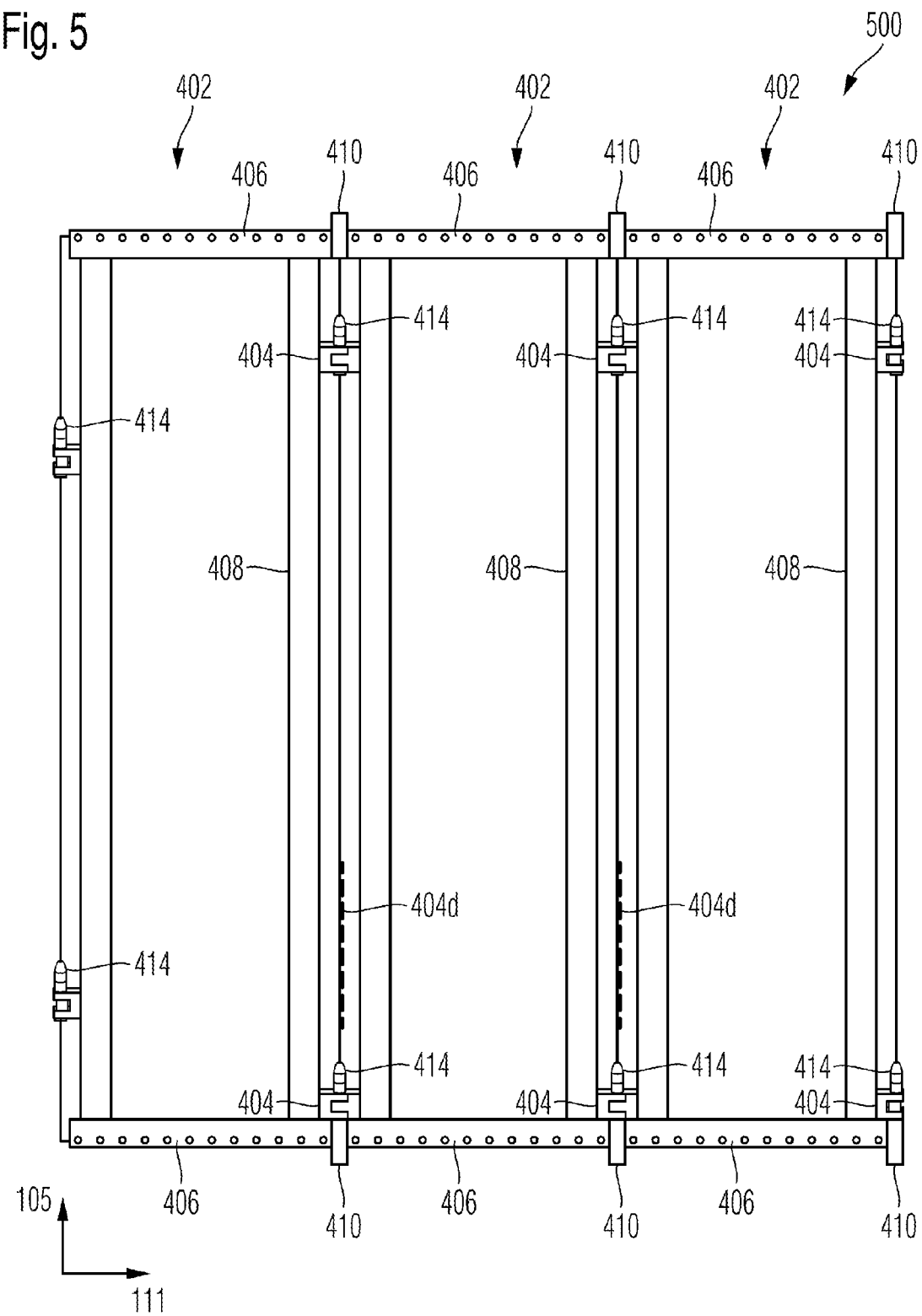

FIG. 5 illustrates a substrate carrier 400 according to various aspects 500 of the disclosure in a schematic side view.

The substrate carrier 400, for example each of the members 402, may have at least one or more than one carriage 406 (also referred to as rail carriage). For example, the substrate carrier 400 (for example each of the members 402) may have two carriages 406 arranged on mutually opposite sides (also referred to as top side and bottom side) of the substrate carrier 400. The guidance of the substrate carrier along the transport path may be performed by means of the carriage or carriages 406.

The or each carriage (for example for each member) may have a lantern-gear rack. A lantern-gear rack is a machine element from the field of drive technology as will be described in more detail further below. By way of illustration, the lantern-gear rack is a simplified form of toothed rack. In the case of a lantern-gear rack, the drive teeth of the toothed rack are provided by means of bolts. The lantern-gear rack will be referred to below. The description given for the lantern-gear rack may however also apply analogously to a toothed rack of some other configuration or to a machine element of some other configuration with a multiplicity of drive teeth. The lantern-gear rack makes it possible to provide a precise feed movement. The lantern-gear rack allows relatively precise transport of the substrate carrier, which facilitates the winding-on of the substrate carrier 400 onto the circulation conveyor transport wheel 100 and the corresponding winding-off therefrom.

The or each carriage 406 (for example for each member) may have a pair 410 of rotatably mounted rollers (also referred to as roller pair). The roller pair 410 may facilitate the coupling-on and/or decoupling of the substrate carrier 400, as will be described in more detail further below. For example, in each case one roller pair 410 may be arranged between two support frames 408.

The position of the roller pairs 410 further facilitates the coupling-on and/or decoupling of the substrate carrier 400, because the forces are maximized. For example, the axis of rotation of a roller of the roller pair 410 may be aligned with the axis of rotation of a hinge 404 (also referred to as hinge axis of rotation). Alternatively or in addition, a gap may be arranged between the rollers of a roller pair 410, which gap extends along the hinge axis of rotation between the two rollers.

If the substrate carrier 400 is configured for the aspect ratio of greater than 1, the associated greater length may impede a winding-on under process conditions. The use of exactly one link chain which extends around the circulation conveyor transport wheel 100 would furthermore require very large load lock chambers. Very many short substrate carriers with an aspect ratio of less than 1 have a tendency to become jammed and require a large number of loading/unloading processes, which in turn takes a large amount of time. The aspect ratio of substantially 1 realizes the shortest possible loading and unloading times.

By means of the hinges 404, the substrate carrier 400 may be buckled or folded. Optionally, the hinge or each hinge 404 may have a stop, which limits an angle of the hinge (by which said hinge may be rotated). This prevents an undesired folding-together of the substrate carrier.

The hinges 404 may optionally provide the bolts of the counterpart coupling devices 414 (hinge bolts) for the coupling-on onto the circulation conveyor transport wheel 100. The journal 702 of the or each hinge 404 may optionally have a bearing sleeve in order to reduce the wear during the coupling-on onto the circulation conveyor transport wheel 100 and during the decoupling to a minimum. This has the effect that the hinges may be utilized as receiving means for the circulation conveyor transport wheel 100 (also referred to for simplicity as drum 100). Center of rotation, guidance and fixing along the same line inhibits the generation of undesired torques and thus inhibits misalignment.

Figure 6:
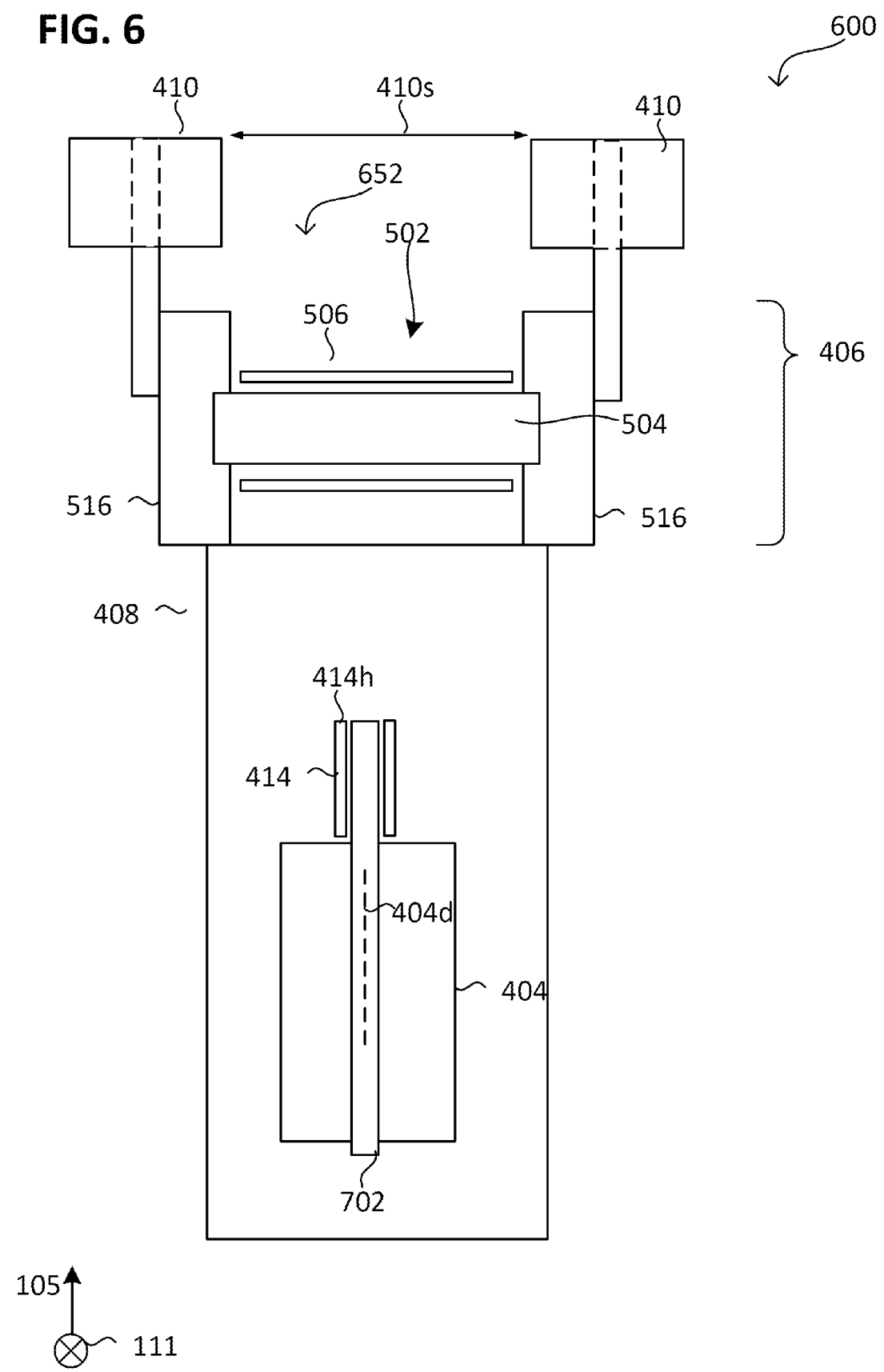

FIG. 6 illustrates a substrate carrier 400 according to various aspects 600 of the disclosure in a schematic cross-sectional view (with a view in a transport direction).

The lantern-gear rack 652 may for example have a toothed rack which has two lateral side walls 516 (for example panels) which are drilled at regular intervals and connected by means of bolts inserted (for example welded or screwed) into the bores. By way of illustration, a lantern-gear rack 652 may be configured in the form of a ladder. The teeth of a toothed gear may engage between the bolts 502 and thus form a form-fit connection with the lantern-gear rack 652. If the toothed gear is rotated, a translational movement may be transmitted to the lantern-gear rack 652.

The lantern-gear rack 652 may have a multiplicity of bolts, of which each bolt optionally has a rotary bearing. The rotary bearing may for example have a bolt axle 504 (composed for example of metal) on which a sleeve 506 (also referred to as bearing sleeve) is mounted. The sleeve may for example have or be formed from a plastic or at least a material which is more elastic and/or softer than the bolt axle 504.

For example, a bolt axle 504 of the lantern-gear rack 652 may have one or more than one thread and be screwed into one of the side walls 516 or into a nut situated therebehind. Alternatively or in addition, a bolt axle 504 may have a thickened portion (for example a head) which is larger than a passage opening of the side walls 516, such that said bolt axle does not slip through the side wall.

The rotary bearing of the lantern-gear rack 652 may for example be a plain bearing. This simplifies the construction.

Between the rollers of the or each roller pair 410, there may be formed a gap 410s into which a switch may engage, as will be described in more detail further below. The rollers of the roller pair 410 may have a spacing to one another along a direction, wherein the direction is transverse with respect to the transport direction 111 and/or is transverse with respect to the hinge axis of rotation 404d.

The or each counterpart coupling device 414 may have one or more than one bolt, of which each bolt optionally has a rotary bearing. The rotary bearing may for example have a bolt axle 702 (composed for example of metal) on which a sleeve 414h (also referred to as bearing sleeve) is mounted. The sleeve 414h may for example have or be formed from a plastic or at least a material which is more elastic and/or softer than the bolt axle 702. The bolt axle 702 may be provided by means of a hinge bolt. This simplifies the construction.

The rotary bearing of the or each counterpart coupling device 414 may for example be a plain bearing. This simplifies the construction.

Figure 7:
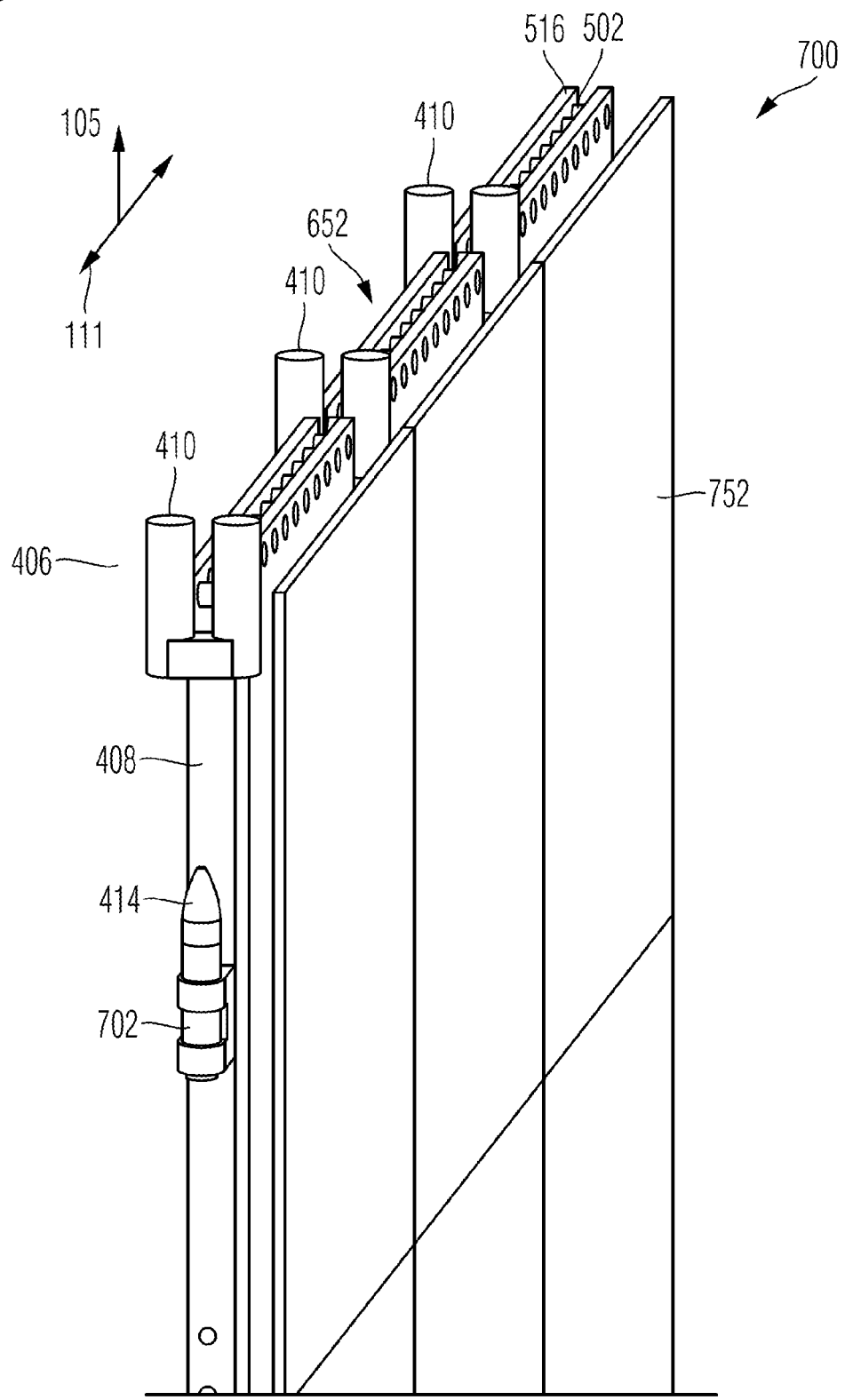

FIG. 7 illustrates a top side of a substrate carrier 400 according to various aspects 700 of the disclosure in a schematic perspective view, which is illustrated with substrates 752 held thereon. The rollers of a roller pair 410 may be arranged above a gap that is formed between two mutually immediately adjacent frames 408.

At the end side of the substrate carrier 400, there may be arranged one or more than one second counterpart coupling device 414, of which an upper second counterpart coupling device 414 is illustrated.

For example, the or each second counterpart coupling device 414 may be provided in the form of a pintle. A pintle may have an L-shaped connecting element, which has a protruding bolt.

Alternatively, the or each second counterpart coupling device 414 may be provided for example by means of a component of a hinge (for example as a hinge bolt) which has the journal 702 (also referred to as hinge pin). This reduces the number of different components.

The bolt of the counterpart coupling device 414 may be tapered. This simplifies the coupling-on, for example by means of a locking device (for example a coupling catch), as will be described in more detail further below. For example, the side walls of the bolt may converge on one another at an angle. The angle may for example be in a range from approximately 1 to approximately 10°, for example 3° or less. This realizes a self-locking action. For example, the bolt of the counterpart coupling device 414 may be of projectile-shaped form (for example having a tip).

Figure 8:
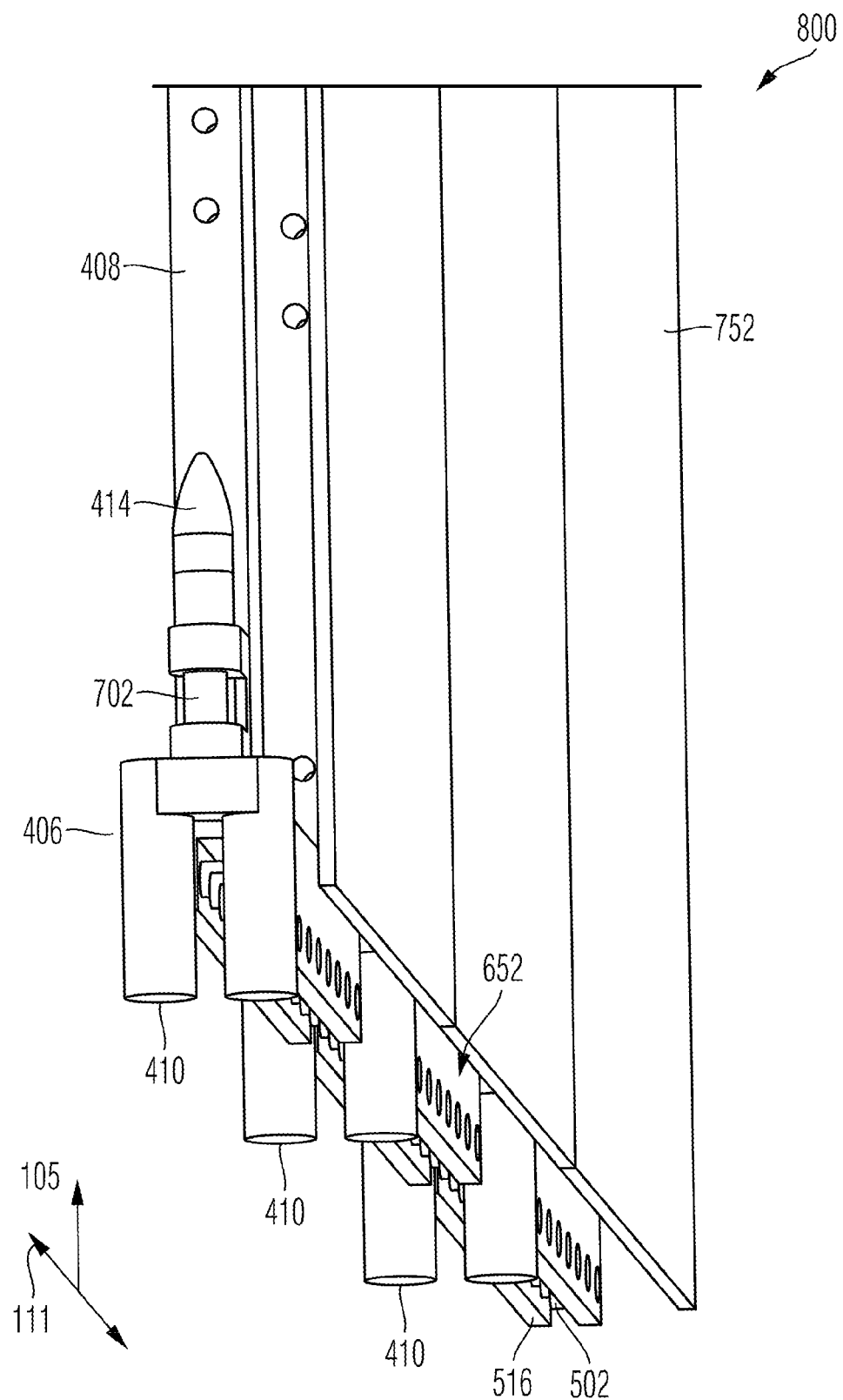

FIG. 8 illustrates a bottom side of a substrate carrier 400 according to various aspects 800 of the disclosure in a schematic perspective view analogous to the aspects 700 of the disclosure, which is illustrated with substrates 752 held thereon. At the end side of the substrate carrier 400, there may be arranged one or more than one second counterpart coupling device 414, of which a lower second counterpart coupling device 414 is illustrated. The lower second counterpart coupling device 414 may be configured analogously to the description given with regard to the aspects 700 of the disclosure.

Below, the substrate carrier 400 and/or the circulation conveyor transport wheel 100 (e.g., circulating conveyor transport wheel) will be referred to in conjunction with more complex assemblies, such as for example a circulation conveyor (e.g., a circulating conveyor), a conveying arrangement or a vacuum arrangement. It may be understood that the substrate carrier 400 or the circulation conveyor transport wheel 100 may also be provided separately, that is to say need not imperatively be part of the more complex assembly, and/or may be provided arranged in a vacuum chamber. The same also applies analogously to the circulation conveyor and the conveying arrangement.

Figure 9:
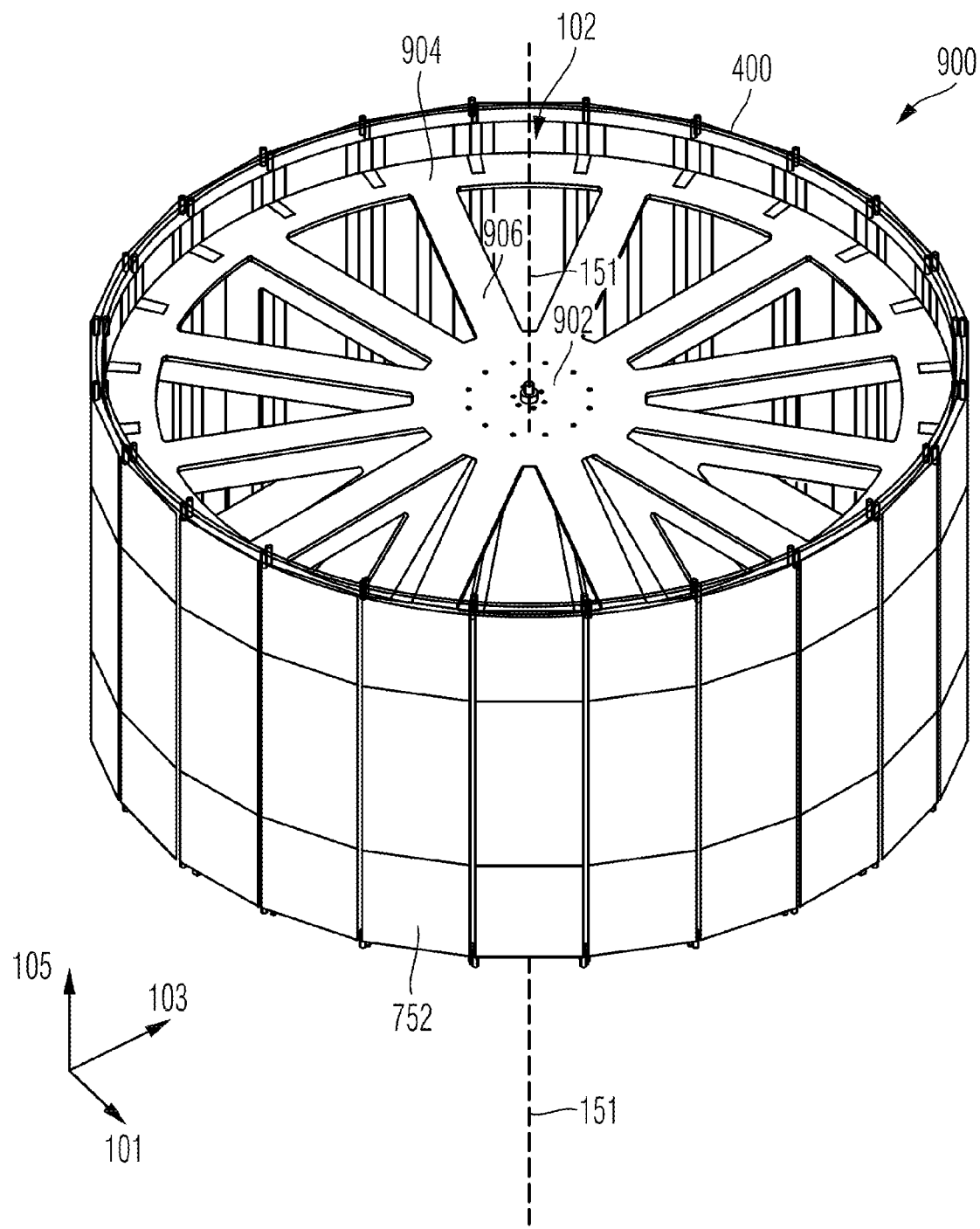

FIG. 9 illustrates a circulation conveyor 900 according to various aspects of the disclosure in a schematic perspective view. The circulation conveyor 900 may have the circulation conveyor transport wheel 100 and a bearing arrangement (concealed here) by means of which the circulation conveyor transport wheel 100 is rotatably mounted. Furthermore, the circulation conveyor 900 may have a drive device (for example a motor) which is configured to transmit a rotation to the circulation conveyor transport wheel 100.

The framework 102 may have one or more than one ring 904 and multiple spokes 906 per ring 904. Furthermore, the framework 102 may have a hub 902 which is connected to the spokes 906. This design reduces the weight. The hub 902 may be mounted by means of, or have, the bearing arrangement. For example, the bearing arrangement may have or be formed from one or more than one rotary bearing (for example axial bearing).

The circulation conveyor transport wheel 100 and the substrate carrier 400 may be configured relative to one another such that multiple substrate carriers 400 fit in series on the circulation conveyor transport wheel 100, for example at least two substrate carriers 400, for example at least three substrate carriers 400, for example at least four substrate carriers 400, for example at least five substrate carriers 400, for example at least six substrate carriers 400, for example at least seven substrate carriers 400, for example at least eight substrate carriers 400.

For example, eight substrate carriers 400, each of which having three members, may be used, which realizes a good compromise between installation size and loading/unloading time.

Figure 10:
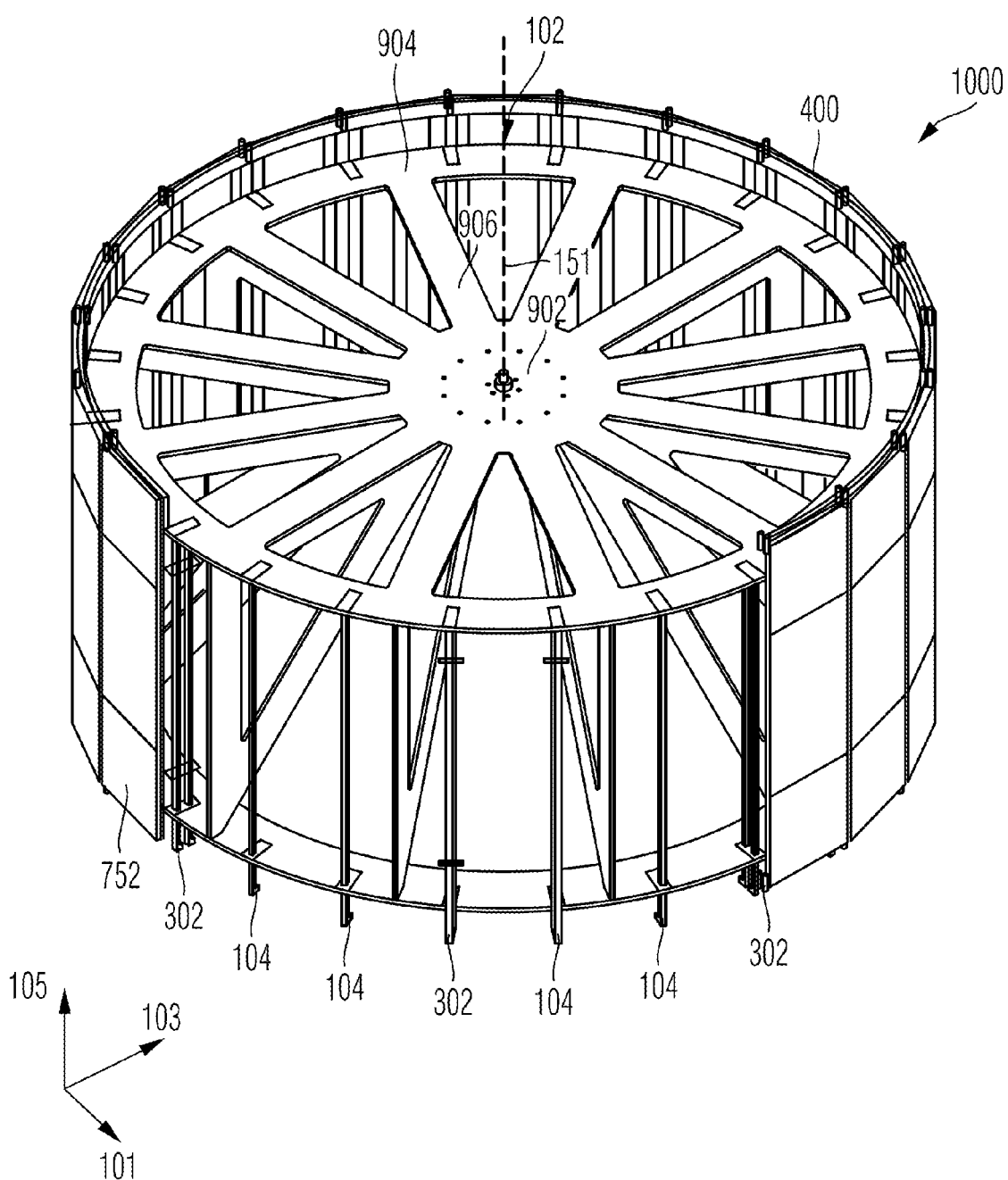

FIG. 10 illustrates a circulation conveyor 900 according to various aspects 1000 of the disclosure in a schematic perspective view, wherein a part of the circulation conveyor transport wheel 100 is unpopulated. At the positions at which a substrate carrier 400 begins or ends, there may be arranged in each case one coupling device pair 302. In other words, the spacing (herein also referred to as distance) between mutually adjacent coupling device pairs 302 measured along the circumference may correspond to the length of the substrate carrier 400 (for example may substantially match the length thereof).

For example, the circulation conveyor transport wheel 100 may have one coupling device pair 302 per substrate carrier 400. Alternatively or in addition, the circulation conveyor transport wheel 100 may have one of the first coupling devices 104, arranged equidistantly with respect to one another, for each member of the substrate carrier 400.

Figure 11:
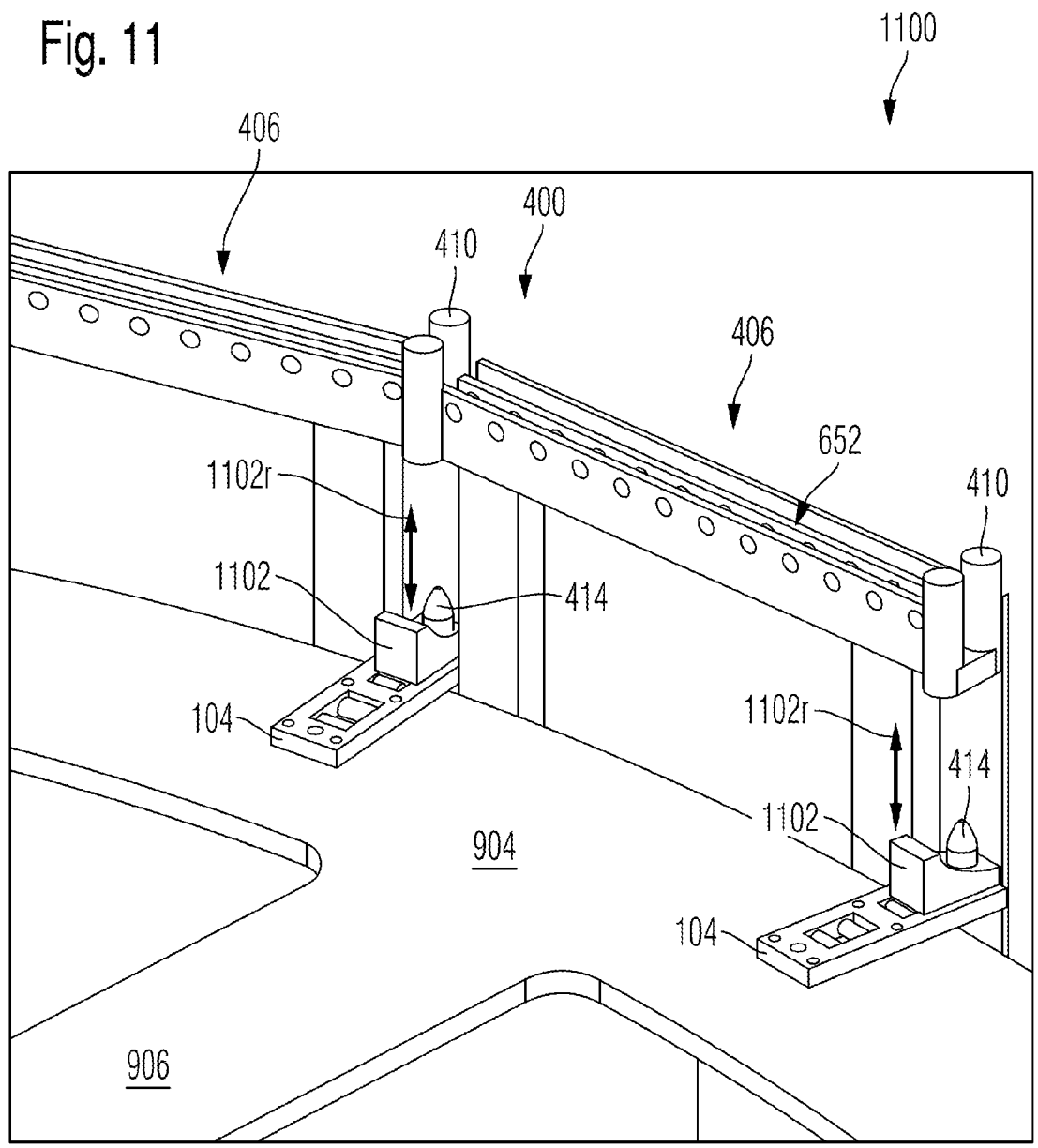

FIG. 11 illustrates a circulation conveyor 900 according to various aspects 1100 of the disclosure in a schematic perspective view. Of the coupling devices 104, each of the coupling devices may have a locking device 1102. In general terms, each locking device 1102 may be changed between at least two states (also referred to as locking states) in order to lock or release the coupling to the substrate carriers 400 (that is to say the locking is established and eliminated). If the coupling between a coupling device and the counterpart coupling device is locked, this may no longer be readily eliminated, for example without the locking being eliminated.

The locking device 1102 may for example have a bracket, which is configured to engage around the bolts of the counterpart coupling devices 414. Below, by way of example, a bracket will be referred to as locking device 1102. The bracket may allow a bracket-bolt locking configuration. The description given may self-evidently apply analogously to a locking device 1102 of some other configuration. For example, the locking device 1102 may likewise have an electromagnet for magnetic locking or may have a coupling catch (for example a hook-type catch, a lock catch, an oblique catch), a latch, a splint or the like. For example, the locking device 1102 may also be part of the substrate carrier.

A coupling catch may for example be configured such that the locking of the coupling is automatically established when (in response to this) the coupling is established (that is to say the coupling-on takes place) or when the coupling catch is arranged at a position defined for this, or is at least exposed to an environment which is defined for this. To establish or eliminate the locking, a locking mechanism may be used, as will be described in more detail further below.

The bracket 1102 may for example be mounted so as to be displaceable 1102r such that it may be displaced between two positions. In a first position, the bracket 1102 may engage around the bolt of the counterpart coupling devices 414. In a second position, the bracket 1102 may be arranged with a spacing to the bolt of the counterpart coupling devices 414 (for example arranged above said bolt), such that the bolt is released.

Figure 12:
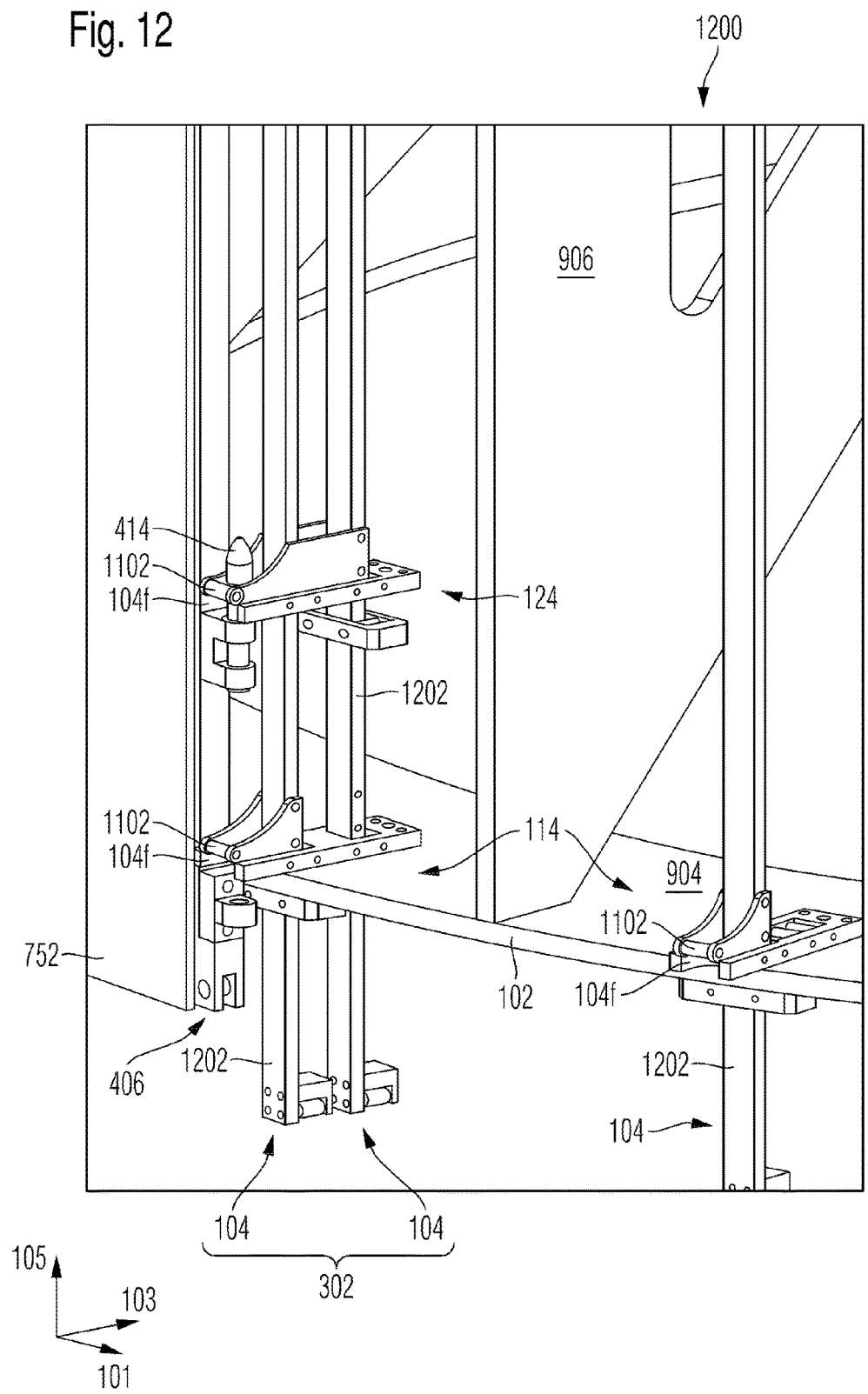

FIG. 12 illustrates a circulation conveyor 900 according to various aspects 1200 of the disclosure in a schematic perspective view. The circulation conveyor 900 may have one or more than one plane pair 114, 124, of which, according to aspects 1200 of the disclosure, a lower plane pair is illustrated.

The coupling device pair 302 may have two coupling devices 104, the form-fit contours 104f of which are arranged one above the other, for example one behind the other along direction 105 or adjacent to one another along the direction of the circumference. In other words, the form-fit contours 104f of the coupling device pair 302 may overlap, for example be congruent, along direction 105.

The coupling device pair 302 may have one of the first coupling devices 104 which, per plane pair 114, 124, has one form-fit contour 104f in the first plane 114 of the plane pair 114, 124. The coupling device pair 302 may have a second coupling device 104 per plane pair 114, 124, which second coupling device has a form-fit contour 104f in the second plane 124 of the plane pair 114, 124.

With a spacing to the coupling device pair 302, there may be arranged an additional one of the first coupling devices 104 which has one form-fit contour 104f per plane pair 114, 124, which form-fit contour is arranged in the first plane 114 of the plane pair 114, 124.

Each of the coupling devices 104 may have a locking device 1102 which may be changed (for example displaced) between two locking states. The illustration shows the locking devices 1102 in the first locking state (that is to say the locking device is closed), in which locking of the substrate carrier 400 that has been coupled on in form-fitting fashion is established by virtue of the bracket of the locking device 1102 been placed over the bolt of the second counterpart coupling device 414.

In general, each of the coupling devices 104 may have a locking mechanism 1202 which is configured to move the locking device 1102 of the coupling device 104 from the first locking state into the second locking state (also referred to as opening) or to move (for example displace) said locking device in the opposite direction (also referred to as closing). The locking mechanism 1202 may for example have a linkage which is configured for transmitting a translational movement to the bracket 1102.

The circulation conveyor 900 may further have an elevation (for example a ramp), as will be described in more detail further below. The linkage 1202 may for example be brought into contact with the elevation by means of the rotational movement of the circulation conveyor transport wheel, such that the linkage 1202 is pushed aside by the elevation and is thus displaced counter to its weight force. The weight force that acts on the linkage 1202 during operation may effect the translational movement in an opposite direction. The movement of the linkage may be transmitted to the bracket, such that said bracket is displaced upward or downward in a vertical direction.

The linkage may optionally have a roller as lower end section. The roller facilitates the sliding movement on the elevation.

Below, a locking mechanism 1202 with a linkage will be referred to by way of example. The linkage may facilitate a purely mechanical actuation of the locking device 1102, which simplifies the construction and makes it less susceptible to faults. The description given may self-evidently apply analogously to a locking mechanism 1202 of some other configuration. For example, the locking mechanism 1202 may also have one or more than one actuator which is configured to move the locking device 1102 of the clutch device 104 from the first state into the second state or vice versa. Alternatively or in addition, the locking mechanism 1202 may have a gearing which transmits a movement to the locking device 1102.

FIG. 13 illustrates a circulation conveyor 900 according to various aspects 1300 of the disclosure in a schematic perspective view. The circulation conveyor 900 may have one or more than one plane pair 114, 124, of which, according to aspects 1300 of the disclosure, an upper plane pair is illustrated. For example, the circulation conveyor 900 according to aspects 1200 of the disclosure may have two plane pairs 114, 124, of which each plane may have one or more than one form-fit contour.

The coupling device pair 302 may have one of the first coupling devices 104 which, per plane pair 114, 124, has one form-fit contour 104f in the first plane 114 of the plane pair 114, 124. The coupling device pair 302 may have a second coupling device 104 per plane pair 114, 124, which second coupling device has a form-fit contour 104f in the second plane 124 of the plane pair 114, 124.

With a spacing to the coupling device pair 302, there may be arranged an additional one of the first coupling devices 104 which has one form-fit contour 104f per plane pair 114, 124, which form-fit contour is arranged in the first plane 114 of the plane pair 114, 124.

Each of the coupling devices 104 may for example have two form-fit contours 104f, of which for example one form-fit contour 104f is arranged in a first plane pair and the other form-fit contour 104f is arranged in a second plane pair (for example arranged one above the other). This stabilizes the substrate carrier more effectively.

Each of the coupling devices 104 may have, per plane pair, a locking device 1102 as described above. For example, a locking device 1102 may be provided for each of the two form-fit contours 104f of the coupling device 104. The two locking devices 1102 may be coupled by means of the same linkage, for example such that they may be changed between the first state and the second state simultaneously.

For example, the first coupling device 104 of the coupling device pair 302 may have a lower form-fit contour 104f in the first plane 114 (cf. FIG. 12) of the lower plane pair and an additional first form-fit contour 104f in the additional first plane 114 (cf FIG. 13) of the upper plane pair. Furthermore, the second coupling device 104 of the coupling device pair 302 may have a second form-fit contour 104f in the second plane 124 (cf. FIG. 12) of the lower plane pair and an additional second form-fit contour 104f in the additional second plane 124 (cf. FIG. 13) of the upper plane pair.

Figure 14:
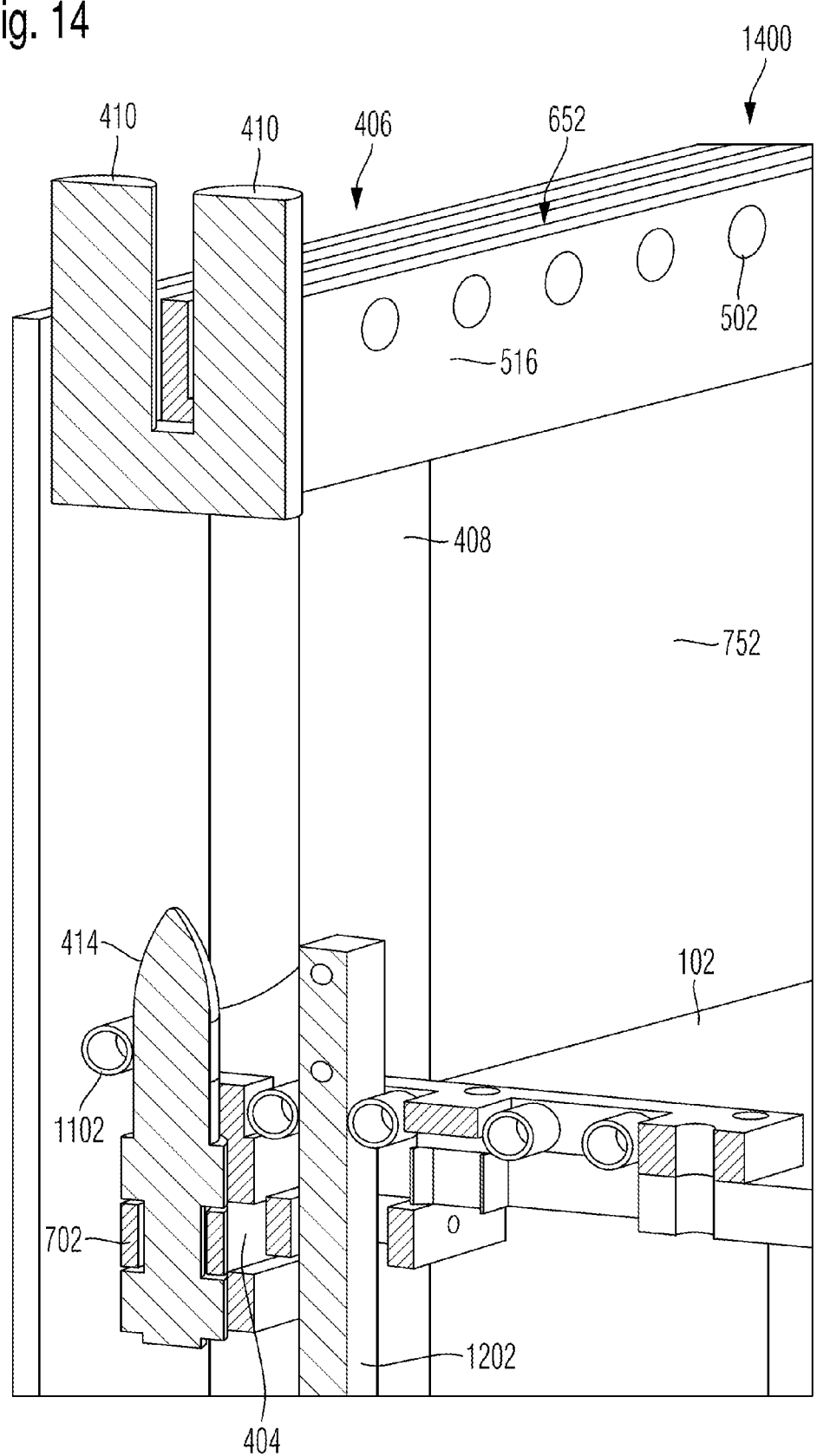

FIG. 14 illustrates a circulation conveyor 900 according to various aspects 1400 of the disclosure in a schematic sectional perspective view, wherein the locking device 1102 has been moved into the first locking state (that is to say closed), such that locking of the substrate carrier that has been coupled on in form-fitting fashion is established.

Figure 15:
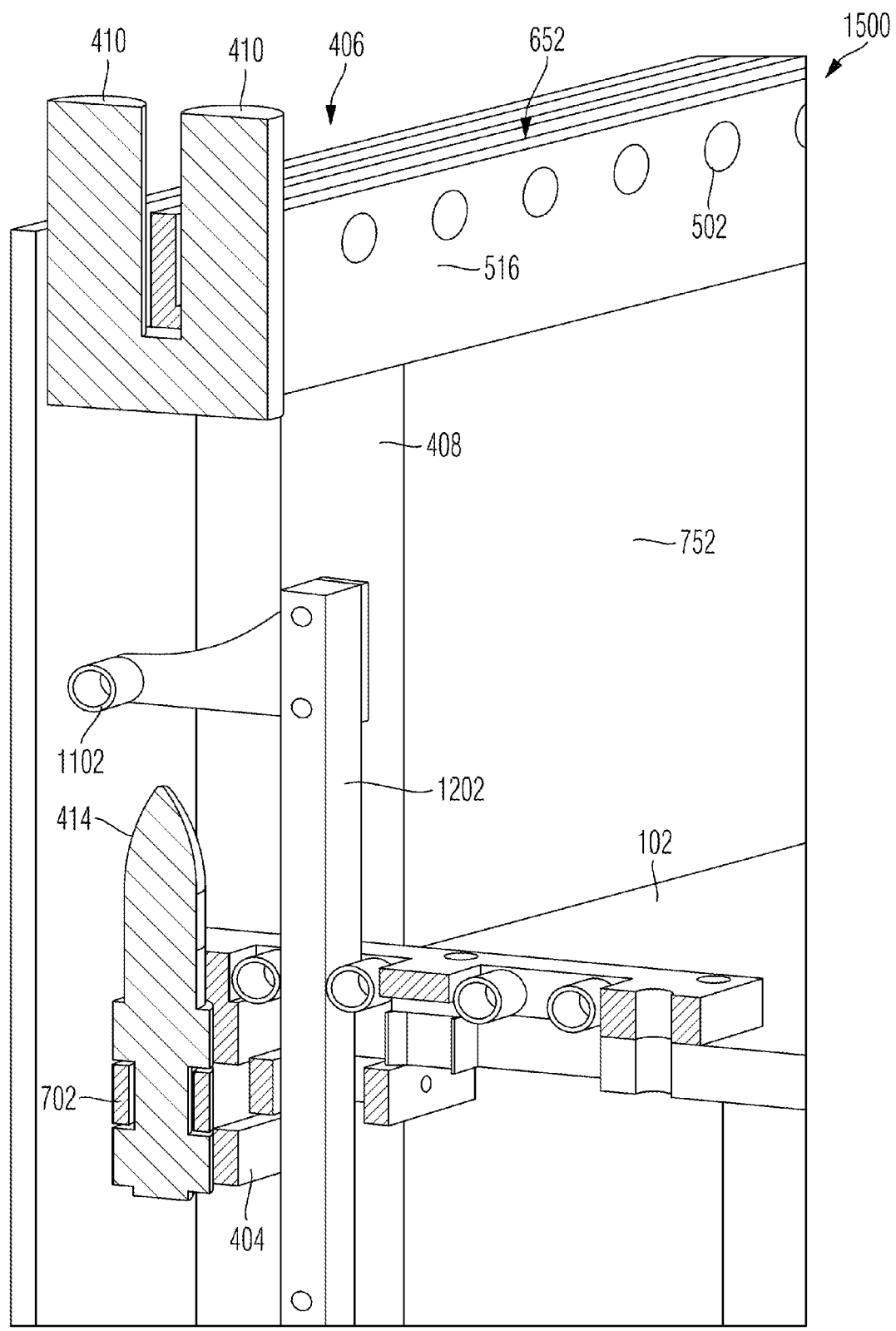

FIG. 15 illustrates a circulation conveyor 900 according to various aspects 1500 of the disclosure in a schematic perspective view, wherein the locking device 1102 has been moved into the second locking state (that is to say opened), such that the locking of the substrate carrier that has been coupled on in form in fitting fashion is eliminated.

FIG. 16 illustrates a circulation conveyor 900 according to various aspects 1600 of the disclosure in a schematic grid view, wherein the locking device 1102 has been moved into the first locking state. The bracket of the locking device 1102 may also, as illustrated in aspects 1600 of the disclosure, have two tetragonal profiles 1606 (for example plates) and a bolt 1604 (also referred to as transverse latch) held therein (in this case also referred to as slide). The transverse latch may also be fastened to only one or more than one tetragonal profile (also referred to as slide).

The bolt of the counterpart coupling device 414 may be configured to taper. This simplifies the coupling-on and/or the locking, for example because the bracket may be pushed over the bolt of the counterpart coupling device 414 more easily. For example, the side walls of the bolt 414 may converge on one another at an angle 1602. The angle 1602 may for example be in a range from approximately 1° to approximately 10°, for example 3° or less. An angle of approximately 100 or less realizes self-locking of the locking device 1102 and thus a secure connection. For example, the bolt of the counterpart coupling device 414 may be conical at least in certain sections, for example optionally with a rounded tip.

Conventionally, the drum 100 of a drum coating installation (also referred to as drum coater or box coater) is populated with substrates either by hand or in a complex manner by means of robots. Populating by hand gives rise to low primary costs but high secondary costs. For populating by hand, the processing chamber must be aerated, and the cathodes must subsequently be freely sputtered again (also referred to as initial sputtering). By contrast, robot technology is cumbersome, expensive and slow.

By means of the circulation conveyor transport wheel 100 described herein, a substrate carrier 400 may, in a continuous process (for example under high vacuum), be coupled to the rotating circulation conveyor transport wheel 100 but also detached therefrom again. The time for the process of the coupling-on and decoupling may be of the order of 1 second. Furthermore, individual substrate carriers may be selectively decoupled whilst one or more than one substrate carrier remain coupled to the drum 100. This makes it possible, for example, for substrate dummies (for example placeholders in the form of a substrate or a discarded substrate) to be used, which remain on the circulation conveyor transport wheel 100 and do not have to be unloaded. In other words, it is not necessary for the entire circumference of the circulation conveyor transport wheel 100 to (e.g., always) be populated with good material, but said circumference may also be partially populated with placeholders.

The closure mechanism 1102, 1202 (including locking device 1102 and locking mechanism 1202) provided herein achieves that each substrate carrier 400 may be held securely and so as to be at rest relative to the circulation conveyor transport wheel. This stabilizes the arrangement, for example in particular at relatively high rotational speeds, when the centrifugal forces become high.

The locking device 1102 with bracket provides a simplified and thus reliable and inexpensive construction.

During operation, a substrate carrier 400 (also referred to as carrier) is brought to the circulation conveyor transport wheel 100 tangentially with respect thereto. The circumferential speed of the circulation conveyor transport wheel 100 may, for this purpose, correspond to the transport speed of the substrate carrier 400. The hinge bolt 414 may be received by means of the fork (also referred to as carrier receptacle) of the circulation conveyor transport wheel 100 (also referred to for simplicity as drum), whereby 5 degrees of freedom are blocked. Only a radial translational degree of freedom is open. The radial translational degree of freedom is blocked by virtue of the transverse latch 1604 being moved behind the hinge bolt 414.

In more general terms, more (for example all) degrees of freedom of the substrate carrier may be blocked in the first locking state than in the second locking state (in which, for example, at least one degree of freedom of the substrate carrier is free).

The locking device (for example the slide) may for example be operated exclusively only by means of gravitational force, such that drives and sensor technology may be omitted. The locking device (for example the slide) may be a component of the drum 100 and move on a circular path during a rotational movement thereof. The region at which the substrate carrier is to be coupled on or decoupled respectively (also referred to as loading point or unloading point respectively) is positionally fixed in the vacuum chamber, as will be described in more detail further below.

This makes it possible for the slide to be pushed upward during the opening process by means of an elevation (for example including a cam disk). For the closing of the slide, said slide is pushed downward by gravitational force. The elevation (for example cam disk) falls again for example after the unloading point or loading point respectively, and the slide drops downward.

Each of the coupling devices 104 may have two or more slides (or transverse latches), for example one slide at the top and one slide on the bottom and/or at least one slide per form-fit contour. This ensures uniform closing, holding and opening actions.

The locking mechanism 1202 may be guided by means of rollers, such that sliding friction may be largely prevented. A coupling device pair 302 may be arranged at the parting points of the substrate carriers. This has the effect that the carrier shell may be opened up and carriers may be reliably removed from the drum (that is to say these may be coupled on and decoupled separately from one another).

The holding and the locking (also referred to as closing) by means of the locking device on the basis of gravitational force is achieved by means of a simplified mechanism and makes it possible to be able to dispense with drives, sensors, cables, leadthroughs etc.

The mounting of the locking mechanism 1202 by means of rollers reduces wear and sliding friction.

FIG. 17A to 17H each illustrate a conveying arrangement 1700 according to various aspects 1700a to 1700h of the disclosure in a schematic plan view, which conveying arrangement has a circulation conveyor 900 according to various aspects of the disclosure and one or more than one linear conveyor 1702 (in other words, it is not imperatively necessary for two linear conveyors 1702 to be present). As illustrated, various configurations may be provided for providing a transport path 711 for one or more than one substrate carrier to and/or away from the circulation conveyor transport wheel 100.

Figure 17A:
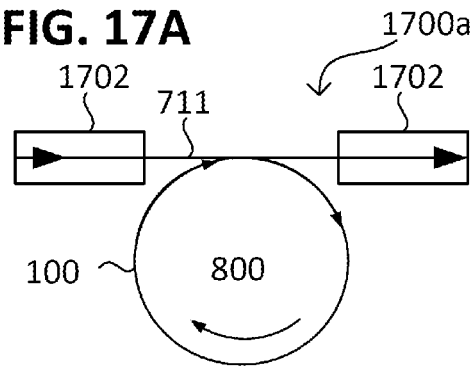
FIGS. 17A to 17H each show a conveying arrangement according to various aspects of the disclosure in a schematic plan view.
Figure 17B:
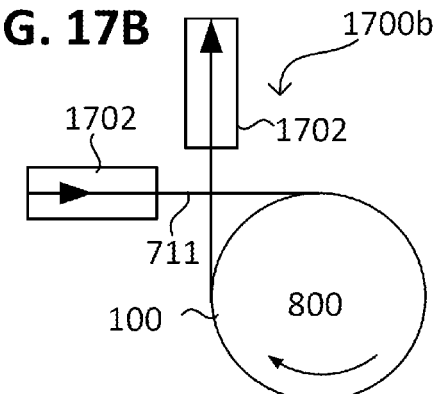
Figure 17C:
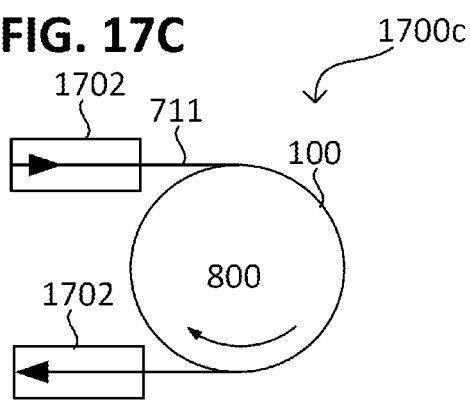
Figure 17D:
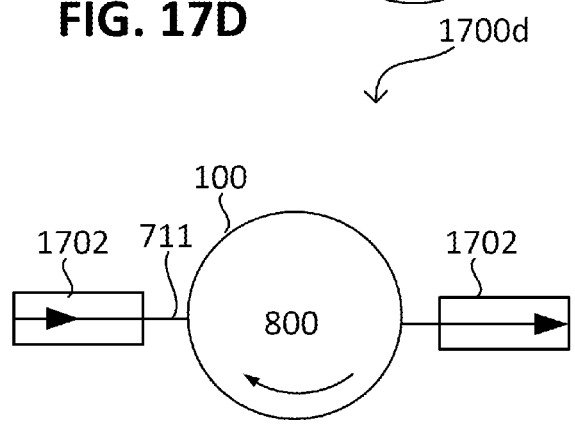
Figure 17E:
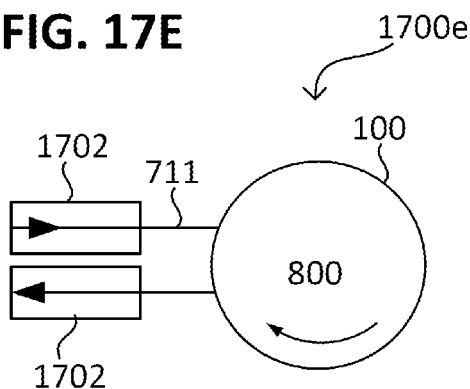
Figure 17F:
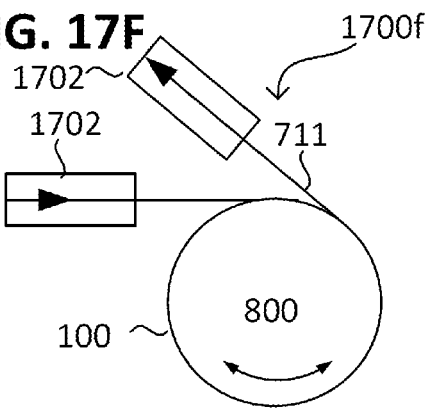
Figure 17G:
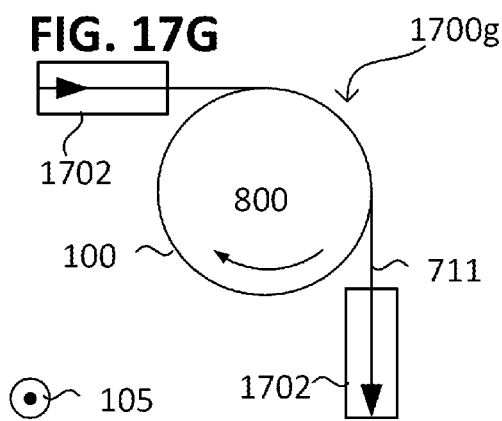
Figure 17H:
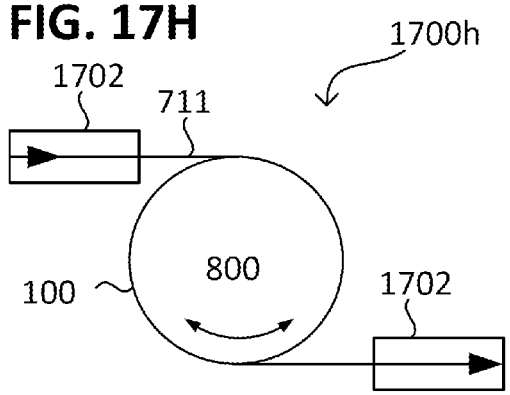

For example, the transport path 711 may run in a crisscrossing manner (cf. FIG. 17A or FIG. 17B). This allows more space for coating devices, because more than half (for example approximately ¾) of the revolution may be utilized for coating devices, as will be described in more detail below.

Below, the conveying arrangement 1700 and/or the circulation conveyor 900 will be referred to in conjunction with a vacuum arrangement. It may be understood that the conveying arrangement 1700 and/or the circulation conveyor 900 may also be provided separately, that is to say need not necessarily be part of the vacuum arrangement.

Figure 18:
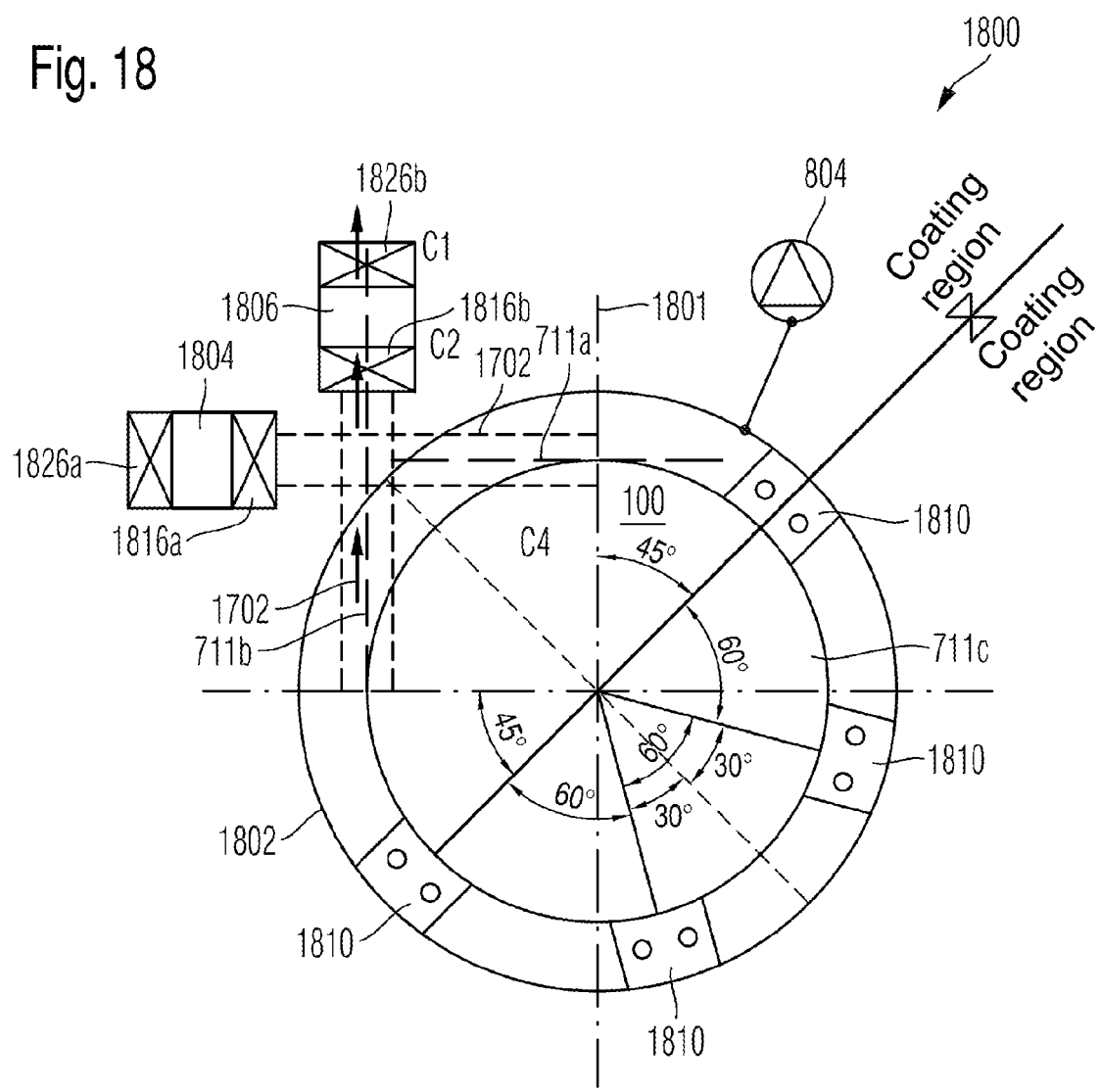

FIG. 18 illustrates a vacuum arrangement 1800 according to various aspects of the disclosure in a schematic plan view, which vacuum arrangement has the conveying arrangement 1700 according to aspects 1700b of the disclosure. The vacuum arrangement 1800 may further have one or more than one vacuum chamber 1802, 1804, 1806.

According to various aspects of the disclosure, a vacuum chamber may be provided by means of a chamber housing, in which one chamber or multiple chambers may be provided. The chamber housing may, for example for the provision of a negative pressure or of a vacuum (vacuum chamber housing), be coupled (for example in gas-conducting fashion) to a pump system 804, for example of a vacuum pump arrangement, and be configured to be of such stability that it withstands the action of the air pressure in the evacuated state. The pump arrangement (including at least one vacuum pump, for example a high-vacuum pump, for example a turbomolecular pump) may make it possible for the interior of the processing chamber, for example the processing space, to be evacuated of a proportion of the gas. It is accordingly possible for one vacuum chamber or multiple vacuum chambers to be provided in one chamber housing.

For example, the or each vacuum chamber housing may be coupled to a pump system 804 (including at least one coarse-vacuum pump and optionally at least one high-vacuum pump). The pump system 804 may be configured to extract a gas (for example the process gas) from the vacuum chamber housing, for example from the or each chamber provided therein, such that a vacuum (that is to say a pressure lower than 0.3 bar) or lower may be provided within the vacuum chamber housing, for example a pressure in a range from approximately 1 mbar to approximately $10^{-3}$ mbar (in other words fine vacuum) or lower, for example a pressure in a range from approximately $10^{-3}$ mbar to approximately $10^{-7}$ mbar (in other words high vacuum) or lower, for example a pressure lower than high vacuum, for example lower than approximately $10^{-7}$ mbar (in other words ultra-high vacuum). The process pressure may form from an equilibrium of process gas, which is fed by means of a gas feed device and extracted by means of the pump system 804.

The vacuum arrangement 1800 may for example have a first vacuum chamber 1802 (also referred to as processing chamber) in which the circulation conveyor transport wheel 100, a first linear conveyor 1702 and a second linear conveyor 1702 are arranged. The first linear conveyor 1702 and the second linear conveyor 1702 (for example the guide rails thereof) may cross one another, such that the transport path 711 runs in a crisscrossing manner. The first linear conveyor 1702 may provide a first section 711a of the transport path 711 (also referred to as first transport section) toward the circulation conveyor transport wheel 100, and the second linear conveyor 1702 may provide a second section of the transport path 711 (also referred to as second transport section) away from the circulation conveyor transport path 100 (indicated by arrows) or vice versa.

Between the first transport section 711a and the second transport section 711b, the transport path 711 may have a third section (also referred to as third transport section 711c or processing section 711c) (as viewed along the circumference of the circulation conveyor transport wheel 100). The third transport section 711c may for example have a curvature of approximately 270°. The processing, for example coating, of a substrate may take place along the processing section. For this purpose, one or more than one processing device 1810 may be arranged in the interior space, adjoining the processing section 711c, of the processing chamber 1802 (also referred to as processing region). In general, a processing device 1810 may be configured for processing (including for example warming, coating and/or chemically changing, etc.) a substrate. For example, the processing device 1810 may be configured for coating the substrate with a coating material provided by the processing device 1810 (then also referred to as coating device or coating material source).

The coating material source may, in various aspects of the disclosure, be configured for coating at least one substrate (that is to say one substrate or multiple substrates) which is for example transported through the processing region. For example, the coating material source may be configured for providing a gaseous coating material (material vapor) and/or liquid coating material, which may for example be deposited on the at least one substrate in order to form a layer. A coating material source may have at least one of the following: a sputtering device, a thermal evaporation device (for example a laser beam evaporator, an arc evaporator, an electron beam evaporator and/or a thermal evaporator), a precursor gas source, a liquid phase atomizer. A sputtering device may be configured for atomizing the coating material by means of a plasma. A thermal evaporation device may be configured for evaporating the coating material by means of thermal energy. Depending on the nature of the coating material, it is also possible for a sublimation, that is to say a thermal change from a solid state (solid phase) into a gaseous state, to occur alternatively or in addition to the thermal evaporation, that is to say a thermal change from a liquid state (liquid phase) into a gaseous state (gaseous phase). In other words, the thermal evaporation device may also sublimate the coating material. A liquid phase atomizer may be configured for the application of a coating material from the liquid phase, for example of a paint. A sputtering device as coating device will be referred to below. The description given may however also apply analogously to a coating device of some other configuration.

For example, the coating material may have or be formed from at least one material of the following materials: a metal; a transition metal, an oxide (for example a metal oxide or a transition metal oxide); a dielectric; a polymer (for example a carbon-based polymer or a silicon-based polymer); an oxynitride; a nitride; a carbide; a ceramic; a metalloid (for example carbon); a perovskite; a glass or glass-like material (for example a sulfide glass); a semiconductor; a semiconductor oxide; a semiorganic material, and/or an organic material.

The vacuum arrangement 1800 may for example have a second vacuum chamber 1804 (also referred to as first load lock chamber or first load lock) which may be arranged between a first load lock valve 1816a and an additional first load lock valve 1826b. The first load lock valve 1816a may couple the first load lock chamber to the processing chamber 1802. In the first load lock chamber 1804, there may be arranged a linear conveyor which forms a continuation of the first transport section 711a.

The vacuum arrangement 1800 may for example have a third vacuum chamber 1806 (also referred to as second load lock chamber or second load lock), which may be arranged between a second load lock valve 1816b and an additional second load lock valve 1826a. The second load lock valve 1816b may couple the second load lock chamber to the processing chamber 1802. In the second lock chamber 1806, there may be arranged a linear conveyor which forms a continuation of the second transport section 711b.

As described above, at least two linear conveyors may be present which form a continuation of one another (that is to say provide a common section of the transport path 711), wherein a load lock valve is arranged between the two linear conveyors. By way of illustration, one of the two linear conveyors is arranged in the processing chamber 1802 and provides one of the two transport sections 711a, 711b, whereas the other of the two linear conveyors is arranged in the load lock chamber. This functional separation (also referred to as throughput configuration) into two linear conveyors makes it easier for these (for example the drive device thereof) to be controlled independently of one another, such that a substrate carrier in the load lock chamber remains in a fixed position whilst a substrate carrier in the processing chamber 1802 is transported toward or away from the circulation conveyor transport wheel 100. This makes it easier for a greater number of substrate carriers to be transported in a cyclic manner and for these to be sequenced into the rotation cycle of the circulation conveyor transport wheel 100 (that is to say for the transport to be synchronized).

It is however also possible for a linear conveyor to be used which has two sections (also referred to as linear conveyor sections), wherein the load lock valve is arranged between the two linear conveyor sections. By way of illustration, one of the two linear conveyor sections is arranged in the processing chamber 1802 and provides one of the two transport sections 711a, 711b, whereas the other of the two linear conveyor sections is arranged in the load lock chamber. The functional unit (also referred to as simplified configuration) of the two linear conveyor sections makes it easier for these (for example the drive device thereof) to be controlled in a coupled-together manner, such that the control is simplified. In this case, it may however be necessary for no substrate carrier to be arranged in the load lock chamber when a substrate carrier in the processing chamber 1802 is transported toward or away from the circulation conveyor transport wheel 100.

Below, the simplified configuration or the throughput configuration will be referred to by way of example. The description given for the linear conveyor sections may self-evidently apply analogously to correspondingly mutually independently controllable linear conveyors, which are used instead of the linear conveyor sections, and vice versa.

FIG. 19 illustrates a vacuum arrangement 1800 according to various aspects 1900 of the disclosure in a schematic plan view, which vacuum arrangement has the conveying arrangement 1700 according to aspects 1700a of the disclosure, wherein the two linear conveyors 1702 are arranged in series. For example, the first transport section 711a and the second transport section 711b may adjoin one another, for example at the location at which these adjoin the circulation conveyor transport wheel 100 and the third transport section 711*c*.

This has the effect that the third transport section 711*c* may have for example a curvature of more than approximately 270°, for example of approximately 360°. This likewise realizes an increase of the distance along which the processing may be performed.

The conveying arrangement 1700 according to aspects 1700*b* of the disclosure will be referred to below. The description given may however also apply analogously to a conveying arrangement 1700 of some other configuration.

Figure 20:
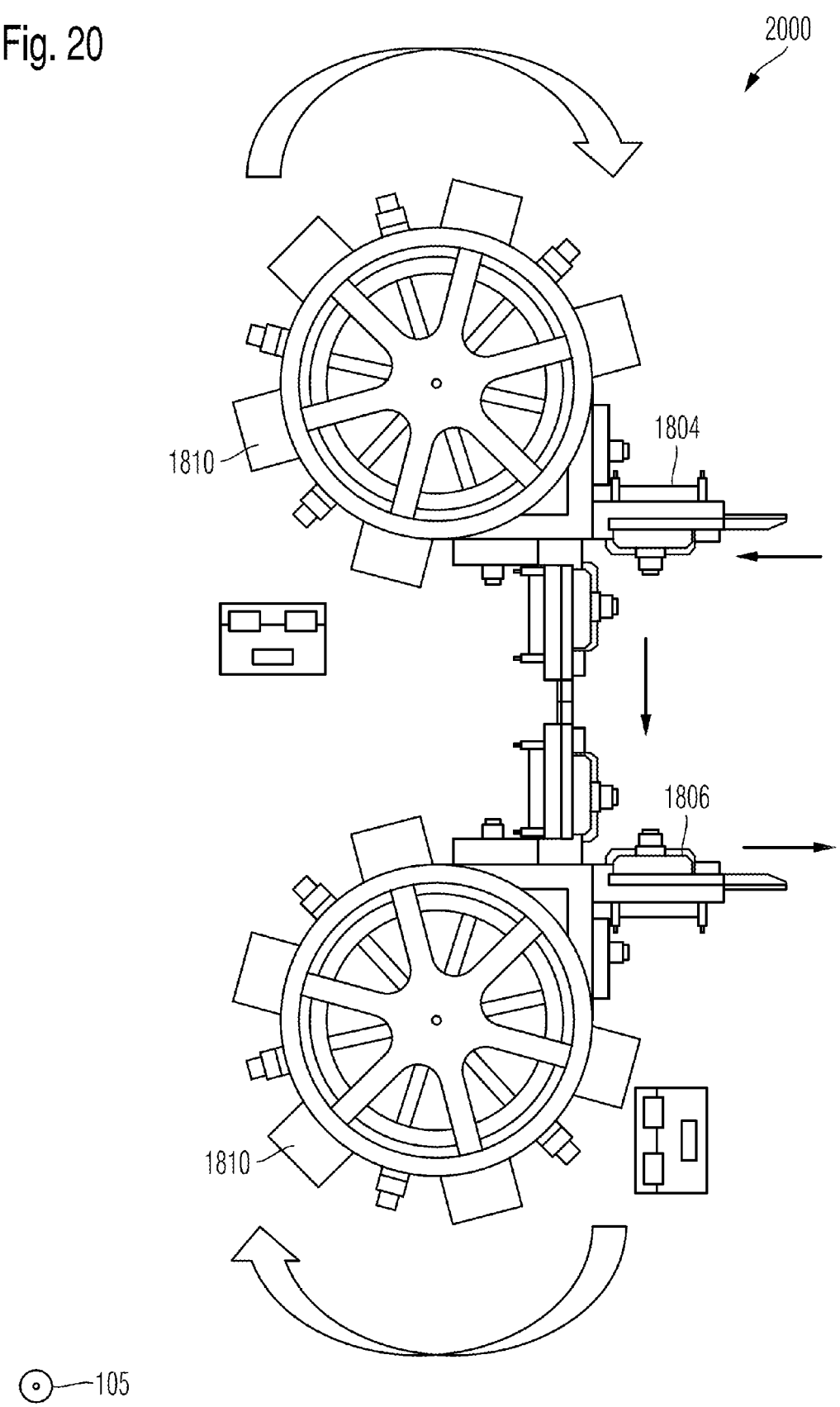

FIG. 20 illustrates a vacuum arrangement 1800 according to various aspects 2000 of the disclosure in a schematic plan view, which has two conveying arrangements 1700 according to aspects 1700*b* of the disclosure. This achieves a concatenation to form a larger assembly which has a larger number of processing devices and thus allows greater layer complexity and/or greater throughput.

According to various aspects of the disclosure, a drum 100 of a drum coating installation (also referred to as drum coat) may be populated with carriers which join to the wall (shell of the drum) without the use of robots.

The carriers may be individually wound onto and wound off from the drum 100 again without the need for the processing chamber to be aerated. The carriers may be loaded tangentially with respect to the drum via a load lock chamber 1804, 1806. This may generally take place in a crisscrossing or in-line configuration.

If the carriers are loaded in a crisscrossing configuration, it is furthermore possible for unloading and loading time to be saved, resulting in an increase in production time. With the omission of the intermediate step of chamber aeration, the intermediate step of initial sputtering may also be omitted.

Figure 21:
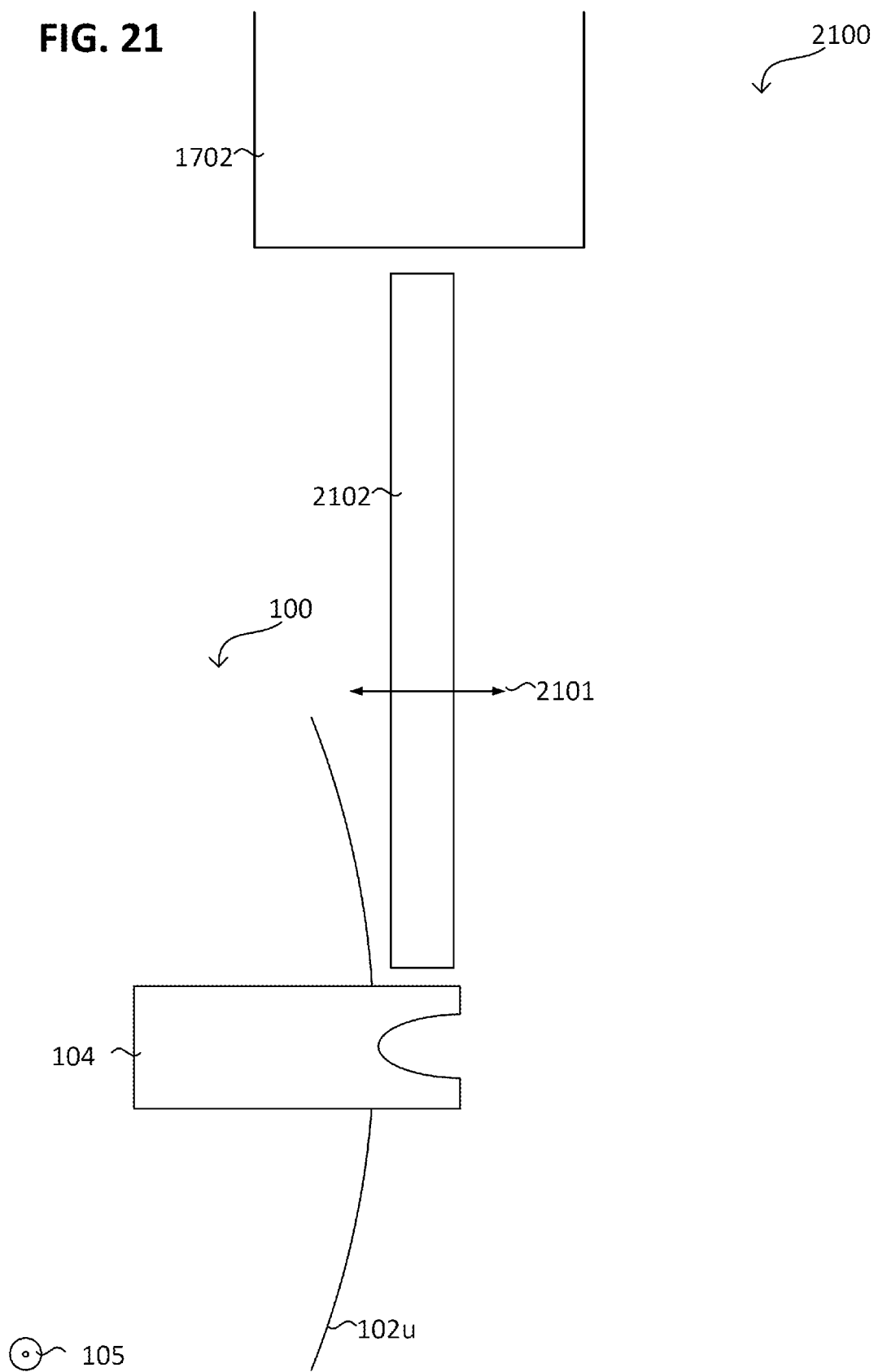

FIG. 21 illustrates a vacuum arrangement 1800 according to various aspects 2100 of the disclosure in a schematic plan view, wherein the conveying arrangement has a switch 2102 which is arranged between a linear conveyor 1702 and the circulation conveyor transport wheel 100.

The switch 2102 may be configured to be changed between two states, of which the switch 2102, in a first state (also referred to as first switch state), lies against the circulation conveyor transport wheel 100 and, in the second state (also referred to as second switch state), has a greater spacing (herein also referred to as distance) to the circulation conveyor transport wheel 100 than in the first switch state.

To change the switch state (between the first and the second switch state), a guide profile of the switch 2102 may for example be displaced 2101, for example along direction 105 or transversely with respect to direction 105. The change of the switch state may be performed for example by means of an actuator of the switch 2102. The displacement of the guide profile along direction 105 may for example be performed by virtue of the guide profile being rotated about an axis of rotation. For this purpose, the switch 2102 may have a rotary bearing by means of which the guide profile is rotatably mounted.

The guide profile may for example have a rail-like carrier (also referred to for simplicity herein as rail or guide rail). For example, the guide profile may be (for example rotatably) mounted at an end section such that said guide profile is configured as a rail-like cantilever beam, as will be described in more detail below. A guide rail may be understood to mean an elongate body which provides a section of the transport path.

For example, the or each guide rail may have or be formed from a plastic. This reduces wear.

Figure 22:
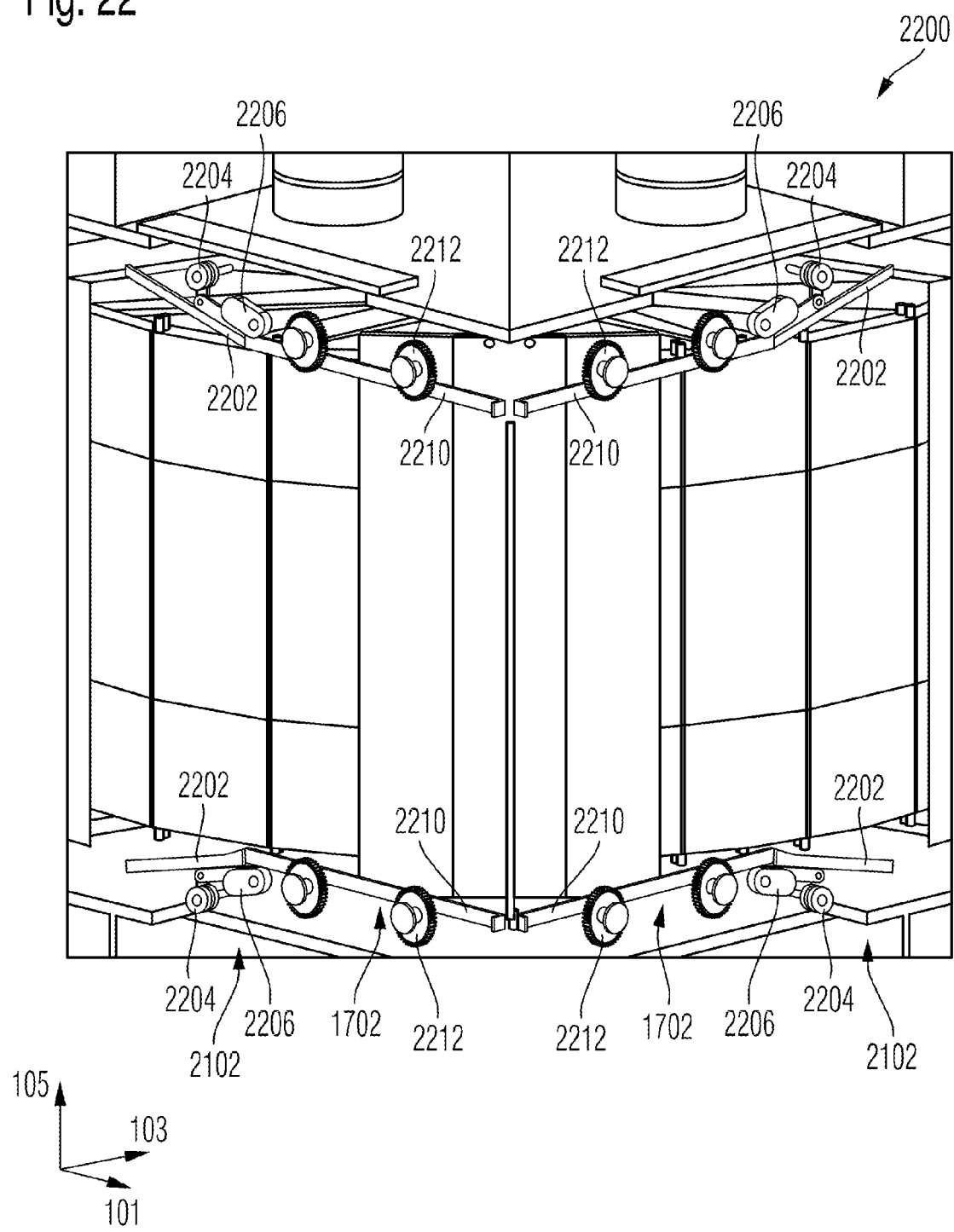

FIG. 22 illustrates a vacuum arrangement 1800 according to various aspects 2200 of the disclosure in a schematic perspective view, which vacuum arrangement has a first switch 2102 between the first linear conveyor and the circulation conveyor transport wheel 100 and a second switch 2102 between the second linear conveyor and the circulation conveyor transport wheel 100. The switches 2102 are illustrated in the second switch state (that is to say open).

One of the switches and one of the linear conveyors will be referred to below, and the statements made may apply in each case to both switches and linear conveyors (if present).

The switch 2102 may have two rail-like cantilever beams 2202, of which each cantilever beam 2202 may be displaced by means of a gearing 2204 (including for example an eccentric, a crankshaft or a knee lever) of the switch 2102 and may be mounted by means of a joint 2206 (including for example a rotary bearing). If the switch 2102 is brought into the second switch state (also referred to as opening of the switch), the two rail-like cantilever beams 2202 may be rotated away from one another. If the switch 2102 is moved into the first switch state (also referred to as closing of the switch), the two rail-like cantilever beams 2202 may be rotated toward one another.

The cantilever beams 2202, in the first switch state, may form a continuation of the upper and lower guide rails 2210 of the linear conveyor 1702 and/or connect these to the circulation conveyor transport wheel 100 along the transport path. The cantilever beams 2202, in the second switch state, may interrupt the transport path.

The linear conveyor 1702 may have the guide rail 2210 and one or more than one toothed gear 2212 (cf. also the description below) for transmitting a translational movement to a substrate carrier 400 held by means of the linear conveyor 1702. The or each toothed gear 2212 may be part of a drive train of the linear conveyor 1702, which further has a drive device (for example a motor) for driving the toothed gear 2212. The or each toothed gear 2212 may be arranged so as to engage with its teeth into a lantern-gear rack of the substrate carrier 400, as will be described in more detail further below.

A switch 2102 with a gearing will be referred to by way of example below. The description given may self-evidently apply analogously to a switch 2102 of some other configuration. The transmission 2204 allows a transmission and/or conversion between translational movement and rotational movement in order to facilitate the displacement of the rail of the switch. For example, the vacuum arrangement 1800 may have a drive device (for example a motor) which is configured to transmit a movement (for example rotational movement) to the gearing 2204. The drive device for the switch may for example be arranged outside the vacuum chamber (for example in the atmosphere), such that the movement thereof may be transmitted to the gearing by means of a vacuum leadthrough (for example rotary leadthrough). The gearing may however basically also be omitted, for example if the force generated by the drive device is transmitted directly to the switch.

Figure 23:
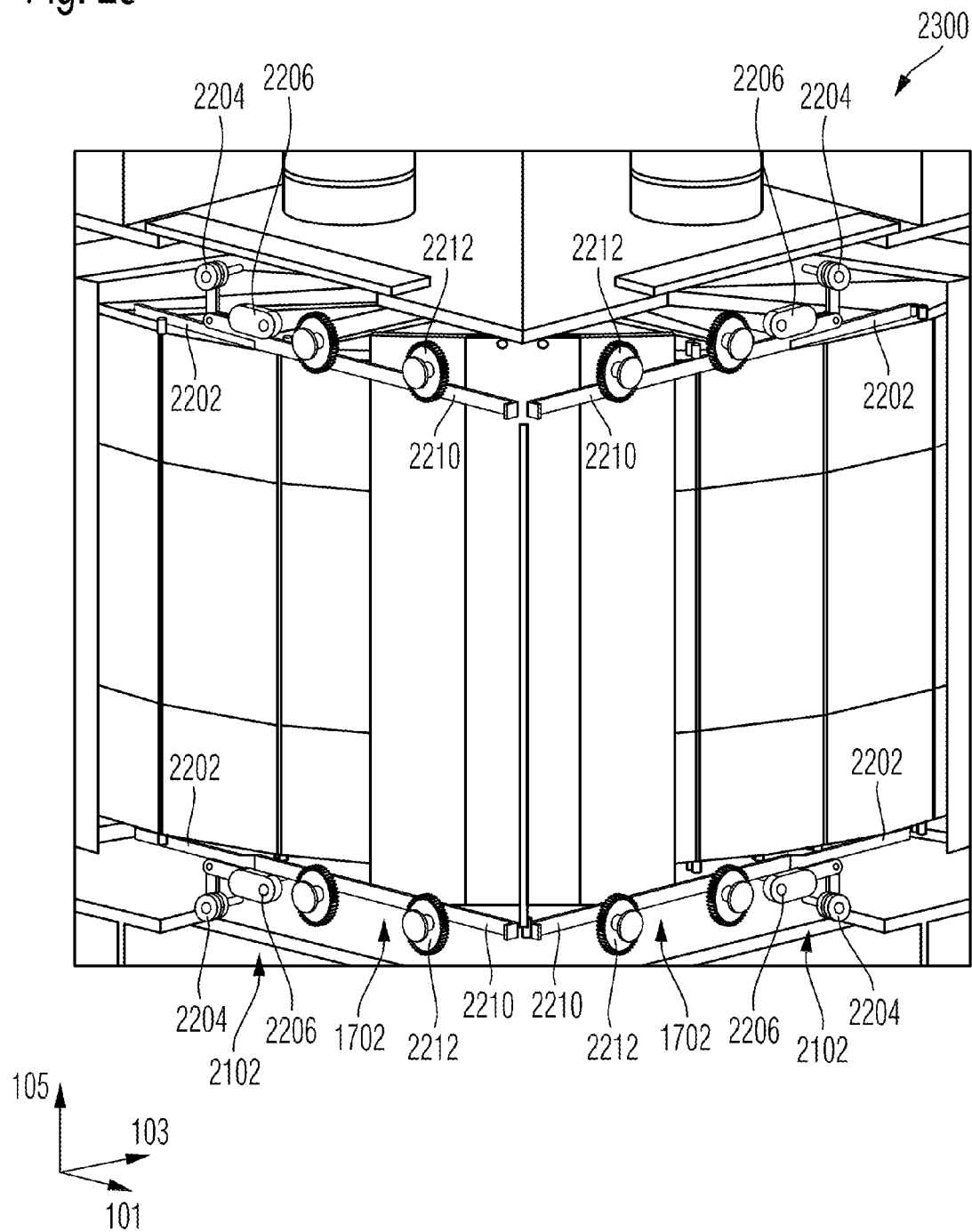

FIG. 23 illustrates a vacuum arrangement 1800 according to various aspects 2300 of the disclosure in a schematic perspective view, wherein the switches 2102 of the aspects 2200 of the disclosure are illustrated in the first switch state (that is to say closed).

FIG. 24 illustrates a vacuum arrangement 1800 according to various aspects 2400 of the disclosure in a schematic plan view, wherein the switch 2102 of the aspects 2300 of the disclosure is in the first switch state. In the first switch state, the switch 2102 may, for example by way of its rail 2202, adjoin the path along which the gap between the rollers of the roller pair 410 is moved when the circulation conveyor transport wheel 100 rotates.

In more general terms, the switch 2102 and the substrate carrier 400 may be configured relative to one another such that the switch 2102, when it is in the first switch state, engages into the carriage 406 of the substrate carrier 400 when said carriage is transported by means of the circulation conveyor transport wheel 100. This has the effect that the winding-off is commenced.

Figure 25:
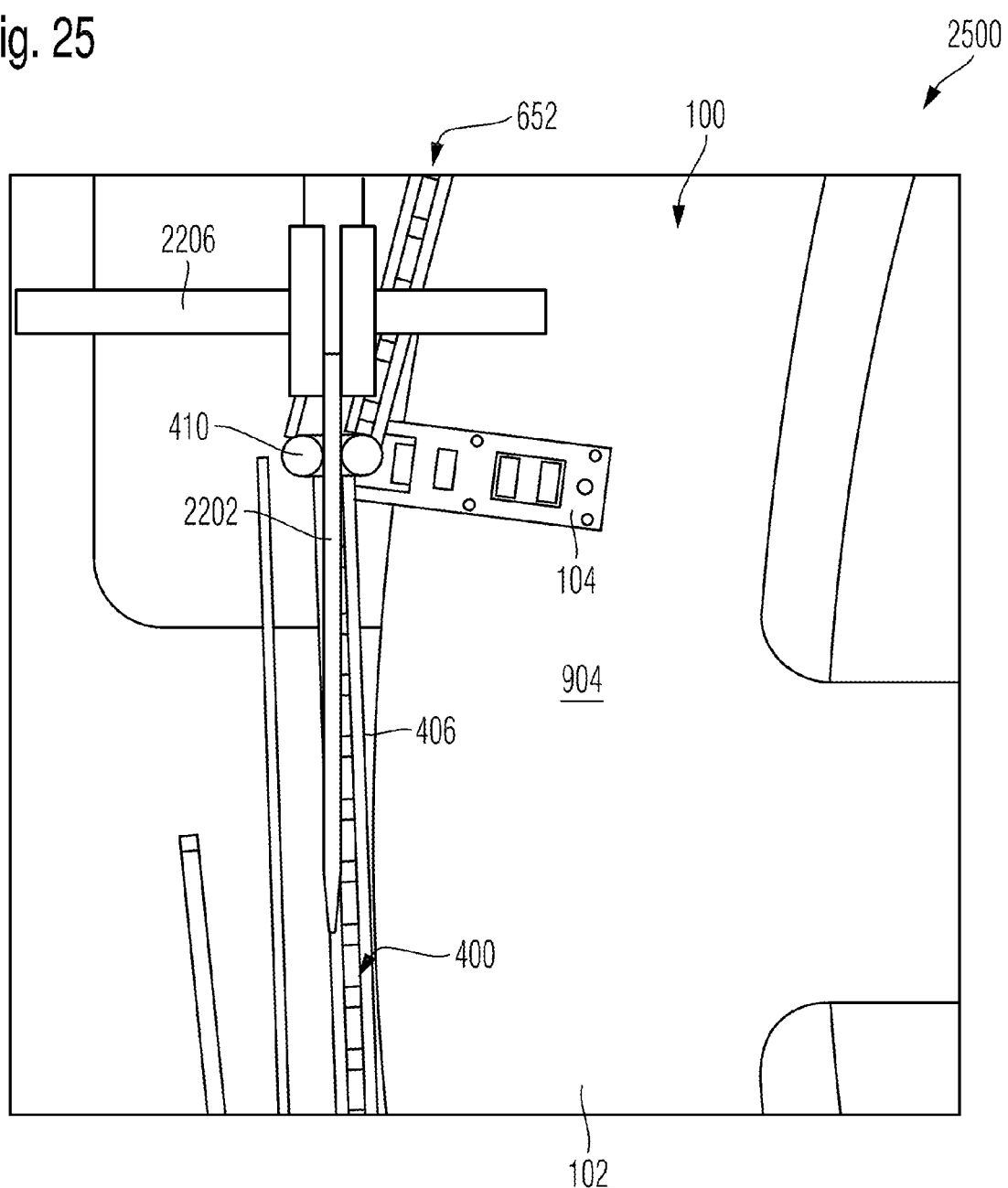

FIG. 25 illustrates a vacuum arrangement 1800 according to aspects 2400 of the disclosure in a schematic plan view, wherein the circulation conveyor transport wheel 100 is illustrated at a later point in time in relation to the aspects 2400 of the disclosure, such that said circulation conveyor transport wheel has rotated to a certain degree.

By means of the engagement, the carriage 406 may be guided from the circulation conveyor transport wheel 100 along the rail 2202 of the switch 2102, or guided from the third transport section 711c to the second transport section 711b (also referred to as winding-off). The substrate carrier 400 is thus detached (that is to say decoupled) from the circulation conveyor transport wheel 100.

In the opposite transport direction, the carriage 406 may be guided from the rail 2202 of the switch 2102, when the latter is in the first switch state, onto the circulation conveyor transport wheel 100, or from the second transport section 711b to the third transport section 711c (also referred to as winding-on). The substrate carrier 400 is thus joined to (that is to say coupled onto) the circulation conveyor transport wheel 100.

This has the effect that the carriers (also referred to as substrate carriers) are automatically guided on the drum from a translational movement into a rotational movement. This may take place for example without the need to aerate the chamber and bring the drum to a standstill from the rotational movement. This therefore realizes a flowing sequence.

The carriers are guided to the drum for example by means of a rail system and are subsequently joined to the receiving points of the drum by means of a switch. The switch has for example an articulated strip as guide rail. The switch has for example a joint and a receptacle in order to close and open. After the joining process, the switch may be opened again so as not to impede the drum together with the carriers during the coating process.

To carry out the unloading process, the switch may be closed, and the carriers may be forcibly guided from the rotational movement into a translational movement and thus forcibly unloaded.

The switch may for example have a crank drive as gearing. Furthermore, a rotary leadthrough is inexpensive. Furthermore, the sensor arrangement for the control of the switch (for example including limit switches) may be arranged outside the vacuum chamber. This simplifies the construction.

The drive mechanism by means of which engagement of the lantern-gear rack and of the toothed gears 2212 (also referred to as lantern-gear toothing) is provided will be discussed below.

FIG. 26 illustrates a substrate carrier 400 according to various aspects 2600 of the disclosure in a schematic cross-sectional view (with a view in a transport direction) which simplifies the construction of the lantern-gear rack.

The or each bolt axle 504 of the lantern-gear rack may be provided by means of a shoulder screw (also referred to as cylinder journal screw). This simplifies the construction. The shoulder screw may have, at one end section, a thread and, at the opposite end section, a so-called shoulder 2604 (the screw head), between which there is arranged a cylindrical section. A nut 2602 may be screwed onto the thread such that the side walls 516 are arranged between the shoulder 2604 and the nut 2602. Between the side walls, there may be formed a groove through which the cylindrical section of the shoulder screw extends.

For example, a U-shaped beam may be used which provides the groove and the side walls 516.

Figure 27:
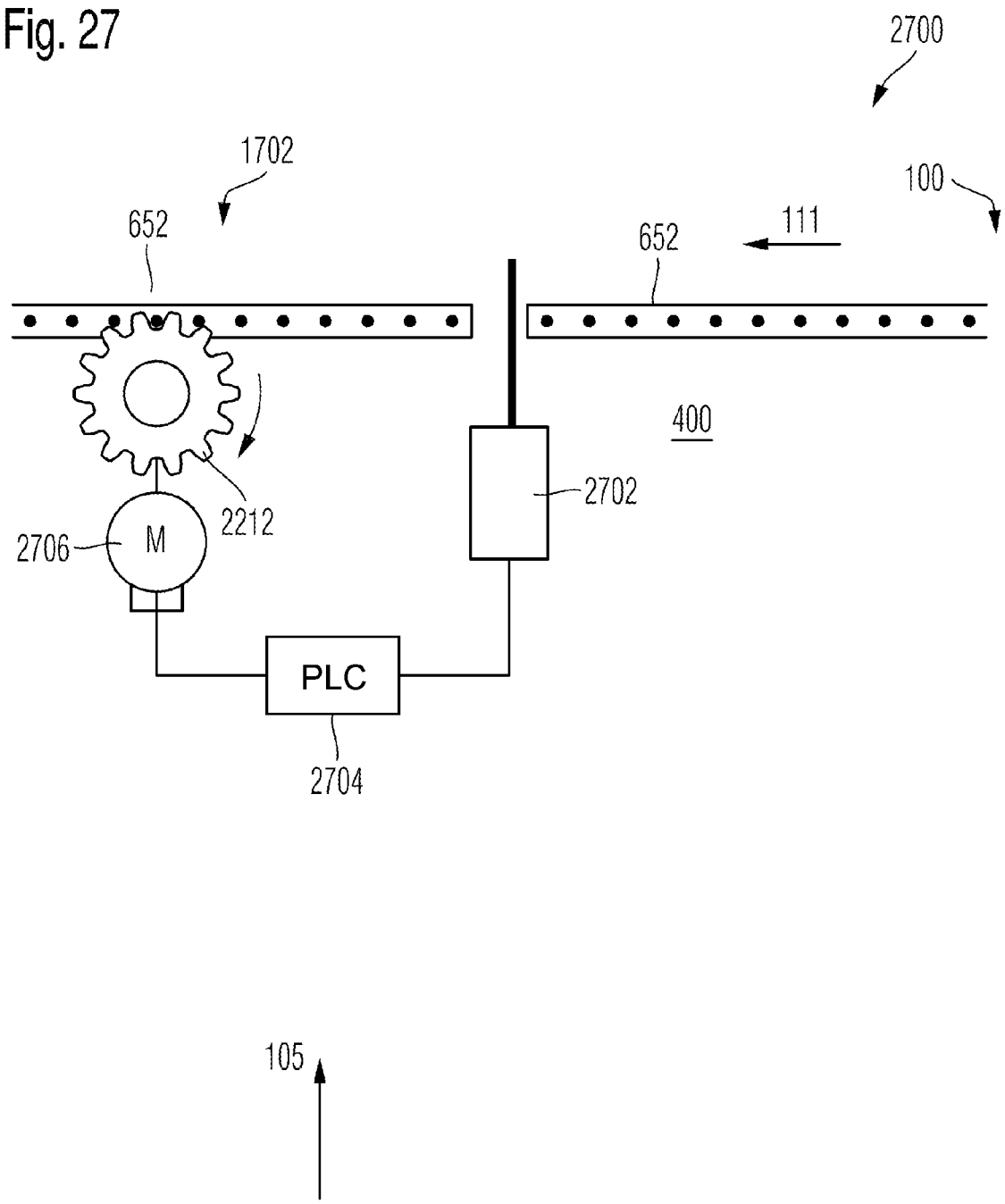
FIG. 27 shows a conveying arrangement according to various aspects of the disclosure in a schematic cross-sectional view.

FIG. 27 illustrates a conveying arrangement 1700 according to various aspects 2700 of the disclosure in a schematic cross-sectional view (with a view transverse with respect to the transport direction 111), which allow a simplified construction.

The or each linear conveyor 1702 of the conveying arrangement 1700 (for example the drive train thereof) may have one or more than one toothed gear 2212 for transmitting a translational movement to a substrate carrier 400 by means of engagement of the toothed gear 2212 and of the lantern-gear rack 652 of the substrate carrier 400 into one another. The or each linear conveyor 1702 of the conveying arrangement 1700 (for example the drive train thereof) may further have a drive device 2706 (for example including a motor) for driving the or each toothed gear 2212. The drive device 2706 may be configured to supply a torque to the or each toothed gear 2212.

The or each toothed gear 2212 may be arranged so as to engage by way of its teeth into a lantern-gear rack (for example between the bolts thereof) of the substrate carrier 400.

The conveying arrangement 1700 may further have a control device 2704 which is configured to control the drive device 2706, for example the torque output thereby. Furthermore, the linear conveyor 1702 may have one or more than one sensor 2702 (also referred to as transport sensor 2702) which is configured to detect the process of transport of the substrate carrier 400.

The control device 2704 may be configured to control the transport sensor 2702, process the detected measured variable thereof as input variable, and on the basis of this provide an electrical signal as output variable, which represents the state of the input variable at the time of the detection. The detection may generally take place optically, mechanically, electrically and/or magnetically (for example inductively).

A transport sensor 2702 may for example be configured to detect a physical variable which represents a position and/or a speed of the substrate carrier 400. The detection of the substrate carrier 400 may generally take place optically, mechanically, electrically and/or magnetically (for example inductively). For example, the transport sensor 2702 may also be configured for mechanical detection (for example in the manner of a limit switch) or for electromagnetic detection.

Alternatively or in addition, a transport sensor 2702 may for example be configured for detecting a physical variable, which represents a position and/or a speed of a toothed gear 2212. For example, the transport sensor 2702 may be provided by means of an absolute value encoder of a servomotor, which drives the toothed gear 2212, of the drive device 2706. The latter makes it easier to detect the position and/or speed of the toothed gear as an alternative or in addition to the position and/or speed of the substrate carrier 400. Alternatively or in addition, it is however also possible for the toothed gear to be detected directly, for example optically, mechanically, electrically and/or magnetically (for example inductively), for example by means of a light barrier, the light beam of which is cyclically interrupted by the rotating teeth.

A servomotor may be understood to mean a drive device which is configured for detecting the angular position, the rotational speed and/or acceleration of its motor shaft. A servomotor may have an electric motor and may have a transport sensor for detecting the motor shaft (for example the angular position, the rotational speed and/or acceleration thereof) of the electric motor. A control device (which implements a so-called servo controller) may control the electric motor on the basis of the motor shaft (that is to say the detected state thereof), detected by the sensor, of the electric motor and on the basis of one or more than one setpoint value (for example a setpoint angular position of the motor shaft, a setpoint rotational speed of the motor shaft and/or a setpoint acceleration of the motor shaft), such that a closed control loop is implemented.

If the absolute value encoder is sufficient as transport sensor 2702, it is possible to dispense with additional transport sensors 2702 in the vacuum. For example, the servomotor may be coupled to the toothed gear by means of a vacuum leadthrough.

Alternatively or in addition to a servomotor, use may also be made of an electric stepper motor, which makes it possible to be able to dispense with the sensor arrangement and the closed control loop. In other words, the transport sensor 2702 may also be omitted, for example if the drive device has a stepper motor.

In another example, the transport sensor 2702 may be configured for detecting the substrate carrier 400. For example, the transport sensor 2702 may have a light barrier, which detects an interruption of a light beam owing to the substrate carrier 400. A light barrier as transport sensor 2702 will be referred to below by way of example. The description given may self-evidently apply analogously to a transport sensor 2702 of some other configuration.

The light barrier allows a simplified construction. For example, the light barrier may be configured to detect a gap between two mutually immediately adjacent lantern-gear racks or immediately successively transported substrate carriers 400.

The control device 2704 may be configured to control the drive device 2706 of the linear conveyor 1702 based on the transport process detected by means of the sensor 2702, that is to say the actual state of the transport process. Alternatively or in addition, the control device 2704 may be configured to control the drive device of the circulation conveyor 900 based on the transport process detected by means of the sensor 2702, that is to say the actual state of the transport process. The control may be performed for example such that the circumferential speed of the circulation conveyor transport wheel 100 corresponds to the transport speed of the substrate carrier 400 transported by means of the linear conveyor 1702. This synchronizes the transport by means of the circulation conveyor 900 and by means of the linear conveyor 1702.

A lantern-gear toothing provides a simplified, reliable and most form-fitting form of drive. For example, the lantern-gear toothing restricts slippage errors during the process of joining of the carriers to the drum. Furthermore, the positions of the lantern-gear racks (for example of the carriers) may be detected by means of the absolute value encoders of servomotors. This makes it possible that additional sensors are not necessarily required in the vacuum.

The or each carrier may for example be transported without slippage to particular positions. Measurement errors may be minimized by means of a transport sensor 2702. The drive trains may further be reduced to a minimum. The lantern-gear toothing (for example the rotary bearing thereof) further reduces the wear or abrasion, which reduces contamination with particles.

In one example, the carriers are guided to the drum by means of a lantern-gear rack rail system and are subsequently joined to the receiving points of the drum by means of a switch. The lantern-gear racks are then part of the carriers. Said lantern-gear racks have a loose bearing sleeve composed of plastic. The carrier may roll on said bearing sleeve. Here, rolling friction and form-fitting drive are combined. Alternatively or in addition, the or each guide rail is composed of a wear-resistant plastic. The bearing sleeves of the lantern-gear racks roll thereon, which reduces wear.

The drive train may have a vacuum rotary leadthrough by means of which drive energy to be supplied to the lantern-gear rack is led through a chamber wall of a vacuum chamber.

Furthermore, the sensor technology may be arranged, reliably with regard to the process, outside the vacuum chamber.

As illustrated in FIG. 27, the linear conveyor 1702 may have two guide rails (also referred to as upper and lower rails) between which the substrate carrier 400 is transported. By means of the upper and lower rails, a highly uniform transport process, for example an acceleration, may be provided, because a tilting action is inhibited.

This has the effect that intense acceleration and fast movement of the carriers is made possible, because slippage and tilting action are inhibited. Furthermore, no complex PLC is required in order to implement the open-loop and/or closed-loop control of the transport process.

Figure 28:
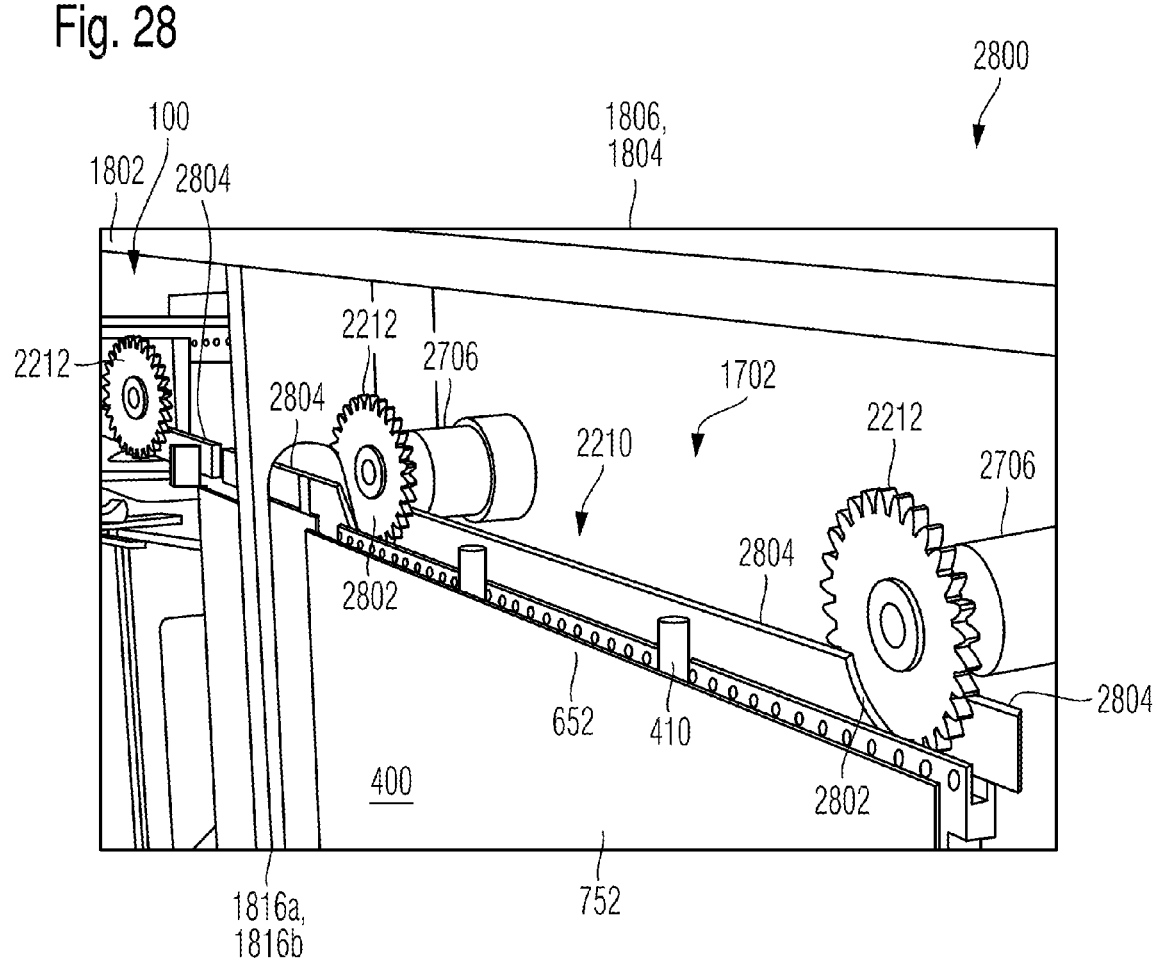

FIG. 28 illustrates a vacuum arrangement 1800 according to various aspects 2800 of the disclosure in a schematic perspective view. The guide rail 2210 of the or each linear conveyor 1702 of the vacuum arrangement 1800 may have multiple mutually spatially separate segments 2804 (also referred to as rail segments). In other words, the guide rail 2210 may have one or more than one recess 2802 (that is to say may be interrupted).

For example, the linear conveyor section in the load lock chamber 1806, 1804 may have one or more than one rail segment. Alternatively or in addition, the linear conveyor section in the processing chamber 1802 may have one or more than one rail segment.

A toothed gear 2212 may for example be arranged between two mutually immediately adjacent segments 2804 of the or each linear conveyor section. For example, the toothed gear 2212 may extend through the recess 2802. Alternatively or in addition, the load lock valve 1816a, 1816b may be arranged between two mutually immediately adjacent linear conveyor sections.

FIG. 29 illustrates a vacuum arrangement 1800 according to various aspects 2900 of the disclosure in a schematic cross-sectional view (with a view transverse with respect to the transport direction 111), which illustrates a simplified construction.

A method for operating the vacuum arrangement 1800 may include: transport of a substrate carrier 400 by means of a linear conveyor 1702 to a circulation conveyor transport wheel 100, and coupling-on of the substrate carrier 400 onto the circulation conveyor transport wheel 100.

The transport of the substrate carrier 400 to the circulation conveyor transport wheel 100 may include that the switch 2102 is moved into the first switch state and the substrate carrier 400 is transferred by means of the switch 2102 from the linear conveyor 1702 to the circulation conveyor transport wheel 100.

The coupling-on of the substrate carrier 400 may include that a counterpart coupling device of the substrate carrier 400 is joined together with a coupling device of the circulation conveyor transport wheel 100 (which involves these being brought into contact) when a locking device of the circulation conveyor transport wheel 100 is in the second locking state (that is to say open); and that the locking device is moved into the first locking state (also referred to as closing) when the counterpart coupling device of the substrate carrier 400 is joined together with the coupling device of the circulation conveyor transport wheel 100.

By virtue of the counterpart coupling device of the substrate carrier 400 being joined together with a coupling device of the circulation conveyor transport wheel 100, one or more than one (hitherto free) degree of freedom of the substrate carrier 400 may be blocked. By virtue of the locking device being moved into the first locking state, at least one or more than one (hitherto free) additional degree of freedom of the substrate carrier 400 may be blocked.

FIG. 30 illustrates a circulation conveyor 900 according to various aspects of the disclosure in a schematic plan view in a method 3000. The coupling device 104 (for example the form-fit contour 104*f* thereof and/or the locking device 1102 thereof) may be configured so as to form, when in engagement with the substrate carrier 400, a rotary joint. In other words, the substrate carrier 400, for example the frame 408 thereof, may be provided with at least one rotational degree of freedom when the coupling device 104 has been joined together with the counterpart coupling device of the substrate carrier 400 and/or when the locking device 1102 is in the first locking state.

This has the effect that the or each support frame 408 (or each member) may be rotated 3001 relative to the circulation conveyor transport wheel 100 when said support frame has been coupled on only on one side by means of a coupling device 104. If the frame 408 (or the member) has been coupled on mutually opposite sides onto the circulation conveyor transport wheel 100, it is possible for more (for example all) degrees of freedom of the frame 408 (or of the member) to be blocked.

For example, the substrate carrier 400 may, (without any guidance or coupling-on) have the general three translational degrees of freedom and three rotational degrees of freedom. Furthermore, the substrate carrier 400 may have one additional degree of freedom (also referred to as member degree of freedom) per rotary connection between two carrier members (by way of illustration, the angle, which may be changed, between two of the carrier members). A substrate carrier 400 which has three members may thus have 8 degrees of freedom.

The form-fitting joining-together in 3011 of the end-side (foremost) counterpart coupling device 414 of the substrate carrier 400 with a coupling device 104 may bilaterally block two translational degrees of freedom and two rotational degrees of freedom of the substrate carrier 400. If the corresponding locking is established, the third translational degree of freedom (away from the circulation conveyor transport wheel 100) may be bilaterally blocked. In more general terms, more degrees of freedom of the substrate carrier may be blocked in the first state of the locking device than in the second state of the locking device (in which for example at least one member degree of freedom of the substrate carrier or one translational degree of freedom is unilaterally free).

In 3013, the circulation conveyor transport wheel 100 may be rotated until the next counterpart coupling device 414 of the substrate carrier 400 comes into contact with a coupling device 104 of the circulation conveyor transport wheel 100. One member degree of freedom of the substrate carrier 400 may be blocked per instance of form-fitting joining-together, in 3013, of one of the next counterpart coupling devices 414 of the substrate carrier 400 with a coupling device 104 and establishment of the locking. This may be repeated until the counterpart coupling device 414 at the rear end side of the substrate carrier 400 comes into contact with a coupling device 104 of the circulation conveyor transport wheel 100.

The form-fitting joining-together, in 3015, of the rear counterpart coupling device 414 of the substrate carrier 400 with a coupling device 104 and establishment of the locking may block the final member degree of freedom of the substrate carrier 400.

By means of the sequence 3011, 3013, 3015 of the method 3000, the substrate carrier 400 may be wound on (that is to say the members of the substrate carrier may be coupled on in succession). In an opposite direction of the sequence 3011, 3013, 3015, the substrate carrier 400 may be wound off (that is to say the members of the substrate carrier may be decoupled in succession).

FIG. 31 illustrates a conveying arrangement 1700 according to various aspects of the disclosure in a schematic plan view in a method 3100. The conveying arrangement 1700 may have an adjustable ramp 3102.

The ramp 3102 may be configured to be able to be changed between two states, of which the ramp 3102, in a first state (also referred to as first ramp state), actuates 3111 the locking mechanism 1202 during the rotation of the circulation conveyor transport wheel 100 and, in a second state (also referred to as second ramp state), has a greater spacing (herein also referred to as distance) to the locking mechanism 1202 than in the first ramp state. For example, the ramp 3102 may also be configured to be tiltable or height-adjustable. The (for example mechanical) adjustment of the ramp 3102 may be performed for example by means of an actuating element.

In the first ramp state (in 3103), the locking mechanism 1202 may be actuated such that the locking is eliminated. In the second ramp state (in 3101), the locking mechanism 1202 may not be actuated, or said locking mechanism may pass the ramp without making contact during the rotation of the circulation conveyor transport wheel 100, such that the locking is maintained.

The adjustment of the ramp 3102 and the adjustment of the switch 2102 may for example take place jointly or be coupled to one another or synchronized.

If the switch 2102 is brought 3101 into the second switch state, the ramp 3102 may be brought into the second ramp state. This has the effect that the locking is maintained if the switch does not engage into the gap of the roller pair (not illustrated) or the first transport section 711*a* and/or the second transport section 711*b* is interrupted.

If the switch 2102 is moved 3103 into the first switch state, the ramp 3102 may be moved into the first ramp state. This has the effect that the locking is eliminated if the switch engages into the gap of the roller pair (not illustrated) or the first transport section 711*a* and/or the second transport section 711b is established. The substrate carrier may thereupon be wound off. In an opposite direction, the winding-on may be performed.

FIG. 32 illustrates a method 3200 according to various aspects of the disclosure in a schematic flow diagram.

The substrate carrier may have, in a transport direction, a first side (also referred to as first end side) and, out of the transport direction, a second side (also referred to as second end side). The first end side and the second end side may be situated opposite one another.

The method 3200 may include, in 3201, coupling-on of the substrate carrier onto a circulation conveyor transport wheel which is arranged in a vacuum; and in 3205, decoupling of the substrate carrier from the circulation conveyor transport wheel which is arranged in the vacuum, wherein the coupling-on and the decoupling of the substrate carrier begins at the first side of the substrate carrier; and/or wherein the coupling-on and the decoupling of the substrate carrier ends at the second side of the substrate carrier.

The method 3200 may include, in 3203, processing one or more than one substrate which is carried by the substrate carrier coupled onto the circulation conveyor transport wheel, wherein the circulation conveyor transport wheel is rotated during the processing. The processing may for example include coating of the or each substrate with a coating material.

The processing (for example coating) of the or each substrate may take place along more than half (for example three quarters) of one revolution per rotation of the circulation conveyor transport wheel. The revolution may correspond to an angle of revolution of 360°, wherein half of the revolution then corresponds to an angle of revolution of 180°. The processing may take place along the third transport section 711c, which has more than half (corresponds to an angle of revolution of 180°) of one revolution per rotation, for example more than three quarters (corresponds to an angle of revolution of 270°) of one revolution per rotation.

In general, the processing may include one or more than one of the following: warming, coating, blasting, abrading (for example cleaning) and/or chemically changing. The processing may be performed by means of one or more than one processing device 1810 (for example per revolution). The processing of the or each substrate may be performed sequentially, for example multiple times per revolution or by means of multiple revolutions. For example, the or each substrate may be transported through a gaseous coating material which is emitted by one or more than one coating device. The coating may for example be performed by means of physical vapor deposition.

The substrate carrier may be transported along the first transport section 711a before the coupling-on and along the second transport section 711b after the coupling-on, or vice versa. The first transport section 711a and the second transport section 711b may differ from one another, for example in terms of length, position, profile, starting point and/or end point.

Alternatively or in addition, the first transport section 711a and the second transport section 711b may adjoin one another at at least one point, or cross one another at said point.

The coupling-on of the substrate carrier may include coupling-on of the multiple members of the substrate carrier in succession (also referred to as winding on), as described herein. The decoupling of the substrate carrier may include decoupling of the multiple members of the substrate carrier in succession (also referred to as winding off), as described herein.

The coupling-on of the substrate carrier may include locking the coupling of the substrate carrier to the circulation conveyor transport wheel (for example by closure of the locking device). The decoupling of the substrate carrier may include the elimination of the locking of the coupling of the substrate carrier to the circulation conveyor transport wheel (for example by opening of the locking device).

The decoupling of the substrate carrier and/or the coupling-on of the substrate carrier may be performed while the circulation conveyor transport wheel is rotating and/or is in the vacuum.

The decoupling of the substrate carrier may be performed after or before the coupling-on of another substrate carrier, for example before the circulation conveyor transport wheel has rotated through one rotation.

FIG. 33 illustrates a method 3300 according to various aspects of the disclosure in a schematic flow diagram. The method 3300 may include, in 3301, guiding a substrate carrier by means of a guide profile along a transport path; and, in 3303, generating a feed movement (in other words driving a transport movement) of the substrate carrier by means of a toothing.

Exemplary values for a vacuum arrangement and the method are stated below: substrate carriers that may be coupled on simultaneously: 24 (this has the advantage that the number 24 is multiply divisible. It is thus possible for 8 triple carriers to be placed together); time for the coupling-on/decoupling of a substrate carrier: approximately 12 minutes for 12 substrate carriers; coating window: approximately 650 mm (mm)×360 mm (height×width); footprint area of the circulation conveyor transport wheel: approximately 4100 mm×6200 mm×2800 mm (length×diameter×height); rotational speed range of the circulation conveyor transport wheel: approximately 10 to 100 revolutions per minute (rpm); coating time: approximately 100 rotations, which at 100 rpm is equal to 0.025 s/substrate carrier or 1/40 seconds; speed of the substrate carrier on the circulation conveyor transport wheel at 100 rpm is approximately 886 m/min.

Below, various examples will be described which relate to the description given above and the illustration in the figures.

Example 1 is a circulation conveyor transport wheel, having: a framework (e.g., a stillage, carrier and/or chassis) at which the circulation conveyor transport wheel may be rotatably mounted; a multiplicity of (e.g., 3 or more) coupling devices which are arranged at (e.g., along and/or on) an outer circumference of the framework (e.g., stillage, carrier and/or chassis) and of which each of the coupling devices has at least one form-fit contour (herein also referred to as tight fit contour) to couple a substrate carrier (400) in a form-fitting manner (e.g., for the form-fitting coupling-on of a substrate carrier), wherein the multiplicity of coupling devices has a pair of coupling devices, the form-fit contours of which have a smaller spacing (for example no spacing) to one another along (for example a direction) of the circumference (for example projected onto the path of the circumference) than to the form-fit contours of the multiplicity of coupling devices which are arranged immediately adjacent (herein also referred to as directly adjacent) to the pair, wherein, for example, the form-fit contours of the pair are arranged (for example laterally) offset with respect to one another along (for example the direction) of the circumference (that is to say on mutually opposite sides of a path along the circumference), for example adjacent to one another (for example having no spacing along the path), wherein, for example, the or each pair has a first coupling device of multiple (for example equidistant) first coupling devices of the multiplicity of coupling devices and a second coupling device of multiple (for example equidistant) second coupling devices of the multiplicity of coupling devices.

Example 2 is a circulation conveyor transport wheel (for example according to example 1), having: a framework (e.g., stillage, carrier and/or chassis) at which the circulation conveyor transport wheel may be rotatably mounted; a multiplicity of coupling devices which are arranged at (e.g., along and/or on) an outer circumference of the framework (e.g., stillage, carrier and/or chassis) and of which each of the coupling devices has at least one (for example two) form-fit contour for the form-fitting coupling-on of a substrate carrier, wherein the multiplicity of coupling devices has multiple first coupling devices which for example in each case have a spacing to one another along (for example a direction) of the circumference (e.g., projected on the circumference, e.g., onto the path of the circumference), and wherein the multiplicity of coupling devices has at least one second coupling device, to the form-fit contour of which a form-fit contour (which for example forms a pair with the second coupling device) of the multiple first coupling devices has a smaller spacing (for example no spacing) along (for example a direction) of the circumference (for example projected on the circumference, e.g., onto the path of the circumference) than to first coupling devices (for example the form fit contours thereof) immediately adjacent thereto. For example, the multiplicity of coupling devices includes a pair of coupling devices, each coupling device of the pair of coupling devices including a form-fit contour, wherein a first distance between the form-fit contours of the pair of coupling devices is less than a (e.g., smallest) second distance between the form-fit contours of the pair of coupling devices and a (e.g., each) form-fit contour of the multiplicity of coupling that are arranged immediately adjacent (e.g., neighbouring) to the pair of coupling devices.

Example 3 is the circulation conveyor transport wheel according to example 1 or 2, wherein each of the form-fit contours is provided by means of a projection or by means of a cutout.

Example 4 is the circulation conveyor transport wheel according to any of examples 1 to 3, wherein the multiplicity of coupling devices have multiple pairs of coupling devices; wherein the form-fit contours of each pair have a smaller spacing to one another along (for example a direction) of the circumference than to the form-fit contours of the multiplicity of coupling devices which are arranged between the multiple pairs; and/or between which there are arranged multiple equidistant coupling devices.

Example 5 is the circulation conveyor transport wheel according to any of examples 1 to 4, wherein the at least one second coupling device has multiple second coupling devices, of which for example each second coupling device has a form-fit contour which has a smaller spacing to the form-fit contour of one of the multiple first coupling devices than the multiple first coupling devices (for example the form-fit contours thereof) have to one another.

Example 6 is the circulation conveyor transport wheel according to any of examples 1 to 5, wherein a number of the multiple second coupling devices is smaller than a number of the multiple first coupling devices.

Example 7 is the circulation conveyor transport wheel according to example 6, wherein a spacing of the multiple second coupling devices to one another along the circumference is greater than the spacing of the multiple first coupling devices to one another; and/or wherein in each case mutually immediately adjacent coupling devices of the multiple second coupling devices have substantially the same spacing to one another (that is to say these are equidistant).

Example 8 is the circulation conveyor transport wheel according to any of examples 1 to 7, wherein the form-fit contour of each second coupling device has a smaller spacing to the form-fit contour of a first coupling device of the multiple first coupling devices along (for example the direction) of the circumference than the form-fit contours of the first coupling device and of those coupling devices of the multiple first coupling devices which are immediately adjacent to the first coupling devices have to one another.

Example 9 is the circulation conveyor transport wheel according to any of examples 1 to 8, wherein the form-fit contour of the at least one second coupling device is, with respect to (for example the direction) of the circumference, arranged adjacent to the form-fit contour of one of the multiple first coupling devices.

Example 10 is the circulation conveyor transport wheel according to any of examples 1 to 9, wherein the form-fit contour of the at least one second coupling device is arranged between two form-fit contours of one of the multiple first coupling devices.

Example 11 is the circulation conveyor transport wheel according to any of examples 1 to 10, wherein in each case mutually immediately adjacent coupling devices of the multiple first coupling devices have substantially the same spacing to one another (that is to say these are equidistant).

Example 12 is the circulation conveyor transport wheel according to any of examples 1 to 11, wherein the form-fit contours of the multiplicity of coupling devices adjoin a cylinder, the cylinder axis of which is arranged for example on an axis of rotation of the circulation conveyor transport wheel.

Example 13 is the circulation conveyor transport wheel according to any of examples 1 to 12, wherein the multiplicity of coupling devices has multiple groups, of which each group has exactly one second coupling device and multiple first coupling devices.

Example 14 is the circulation conveyor transport wheel according to any of examples 1 to 13, wherein the framework (e.g., stillage, carrier and/or chassis) has a first plane and a second plane which are arranged one behind the other with respect to an axis of rotation of the circulation conveyor transport wheel, wherein the at least one (for example two) form-fit contour has a first form-fit contour at the first plane and a second form-fit contour at the second plane.

Example 15 is the circulation conveyor transport wheel according to any of examples 1 to 14, wherein the form-fit contours of the multiple first coupling devices are arranged equidistantly with respect to one another; and/or wherein the form-fit contours of the multiple second coupling devices are arranged equidistantly with respect to one another.

Example 16 is the circulation conveyor transport wheel according to any of examples 1 to 15, wherein the framework (e.g., stillage, carrier and/or chassis) has a hub at which the circulation conveyor transport wheel may be mounted so as to be rotatable about an axis of rotation.

Example 17 is the circulation conveyor transport wheel according to example 16, wherein the hub has an axial bearing which provides the axis of rotation.

Example 18 is the circulation conveyor transport wheel according to any of examples 1 to 17, wherein the multiplicity of coupling devices are arranged around the hub and/or an axis of rotation of the circulation conveyor transport wheel.

Example 19 is the circulation conveyor transport wheel according to any of examples 1 to 18, wherein the form-fit contour of each of the multiplicity of coupling devices is provided by means of a segment of a cylinder surface (for example of a circular cylinder or of a parabolic cylinder).

Example 20 is the circulation conveyor transport wheel according to any of examples 1 to 19, wherein the form-fit contour of each of the multiplicity of coupling devices is provided by means of a segment of a surface of revolution.

Example 21 is the circulation conveyor transport wheel according to any of examples 1 to 20, wherein a rotational speed during the operation of the circulation conveyor transport wheel is in a range from approximately 10 revolutions per minute (rpm) to approximately 100 revolutions per minute.

Example 22 is the circulation conveyor transport wheel according to any of examples 1 to 21, wherein a circumferential speed during the operation of the circulation conveyor transport wheel is in a range from approximately 80 meters per minute to approximately 900 meters per minute.

Example 23 is the circulation conveyor transport wheel according to any of examples 1 to 22, wherein the at least one form-fit contour is configured to, in engagement with the substrate carrier, provide a rotary joint.

Example 24 is the circulation conveyor transport wheel according to any of examples 1 to 23, wherein the at least one form-fit contour is curved toward an axis of rotation of the circulation conveyor transport wheel or away from the axis of rotation.

Example 25 is the circulation conveyor transport wheel according to any of examples 1 to 24, wherein the at least one form-fit contour of each of the multiplicity of coupling devices are curved toward one another or away from one another.

Example 26 is the circulation conveyor transport wheel according to any of examples 1 to 25, wherein each of the multiplicity of coupling devices has a fork or a bolt which provides the form-fit contour.

Example 27 is the circulation conveyor transport wheel according to any of examples 1 to 26, wherein each of the multiplicity of coupling devices has a locking device which may be brought (e.g., switched and/or changed) into a first state and a second state, wherein, in the first state, a form-fitting coupling to the substrate carrier is locked, and in the second state, the locking is eliminated, wherein, for example, more degrees of freedom of the coupling are blocked when the locking is established than when the locking is eliminated (e.g., removed and/or reversed); wherein, for example, the locking device has a bracket for locking the coupling.

Example 28 is the circulation conveyor transport wheel according to example 27, wherein each of the multiplicity of coupling devices has a locking mechanism which is configured: to move the locking device into the second state when the locking mechanism is actuated counter to its weight force; and/or to move the locking device into the first state by means of the weight force.

Example 29 is the circulation conveyor transport wheel according to example 28, wherein the locking mechanism is configured to be actuated by means of a rotational movement of the circulation conveyor transport wheel.

Example 30 is the circulation conveyor transport wheel according to any of examples 27 to 29, wherein each of the multiplicity of coupling devices (for example the locking device thereof and/or the locking mechanism thereof) is configured such that the locking devices may be in the first state or the second state independently of one another.

Example 31 is a circulation conveyor (e.g., a circulating conveyor) having: a circulation conveyor transport wheel according to any of examples 1 to 30, a bearing arrangement by means of which the circulation conveyor transport wheel is rotatably mounted.

Example 32 is the circulation conveyor according to example 31, wherein the circulation conveyor transport wheel provides a transport path which runs in curved fashion along the circumference.

Example 33 is the circulation conveyor according to example 31 or 32, wherein the circulation conveyor transport wheel is mounted so as to be rotatable about an axis of rotation, wherein the axis of rotation runs along a direction of gravity.

Example 34 is the circulation conveyor according to any of examples 31 to 33, further having: at least one substrate carrier for carrying one or more than one substrate, which at least one substrate carrier is for example configured according to any of examples 50 to 74.

Example 35 is a conveying arrangement having: a circulation conveyor according to any of examples 31 to 34, a first linear conveyor for providing a transport path toward the circulation conveyor transport wheel and/or a second linear conveyor for providing a transport path away from the circulation conveyor transport wheel, wherein the first linear conveyor and/or the second linear conveyor are configured according to any of examples 76 to 87.

Example 36 is the conveying arrangement according to example 35, wherein the transport path is diverted from the first linear conveyor to the second linear conveyor by means of the circulation conveyor transport wheel.

Example 37 is the conveying arrangement according to example 35 or 36, wherein the circumference of the circulation conveyor transport wheel has a greater length than the first linear conveyor and/or the second linear conveyor.

Example 38 is the conveying arrangement according to any of examples 35 to 37, further having: a synchronization mechanism which synchronizes a translational movement generated by means of the first linear conveyor and/or the second linear conveyor and a rotational movement of the circulation conveyor transport wheel with one another.

Example 39 is the conveying arrangement according to any of examples 35 to 38, wherein the transport path extends (e.g., runs) in crosswise direction (e.g., in a crisscrossing manner).

Example 40 is the conveying arrangement according to any of examples 35 to 39, which conveying arrangement is configured for bidirectional transport along the transport path.

Example 41 is the conveying arrangement according to any of examples 35 to 40, further having: at least one switch which may be changed between two states, of which the switch, in a first state, provides a section of the transport path toward or away from the circulation conveyor transport wheel and, in the second state, interrupts the section of the transport path, wherein the at least one switch has a guide rail.

Example 42 is the conveying arrangement according to example 41, wherein the at least one switch has a first switch, which is arranged between the first linear conveyor and the circulation conveyor transport wheel, and/or wherein the at least one switch has a second switch, which is arranged between the second linear conveyor and the circulation conveyor transport wheel.

Example 43 is the conveying arrangement according to example 41 or 42, wherein the at least one switch has an actuating mechanism which is configured to, in the first state of the at least one switch, actuate the locking mechanism of the circulation conveyor transport wheel, wherein the actuating mechanism has for example an elevation (for example a ramp).

Example 44 is the conveying arrangement according to any of examples 41 to 43, wherein the guide rail of the at least one switch has a cantilever beam.

Example 45 is the conveying arrangement according to any of examples 41 to 44, further having: a joint by means of which the guide rail of the at least one switch is mounted so as to be rotatable about an axis of rotation, wherein the axis of rotation of the switch is transverse with respect to an axis of rotation of the circulation conveyor transport wheel.

Example 46 is the conveying arrangement according to any of examples 41 to 45, further having: a gearing which is configured to transmit a movement to the guide rail of the at least one switch, wherein the gearing has for example a vacuum leadthrough.

Example 47 is a vacuum arrangement having: a conveying arrangement according to any of examples 35 to 46, and a vacuum chamber in which the circulation conveyor transport wheel, the substrate carrier and/or the linear conveyor are arranged.

Example 48 is the vacuum arrangement according to example 47, further having: multiple coating devices which are arranged around the circulation conveyor transport wheel.

Example 49 is the vacuum arrangement according to example 47 or 48, further having: wherein the vacuum chamber has a chamber wall (configured for example as a chamber cover); wherein the vacuum chamber has for example a chamber opening which is sealed off when the chamber cover and the vacuum chamber are joined together, wherein the chamber cover optionally has a housing in which one of the coating devices is accommodated.

Example 50 is a substrate carrier having: multiple members which are connected to one another (for example in pairwise fashion) by means of a rotary connection (for example a hinge); and two carriages which are arranged on mutually opposite sides of the substrate carrier (for example top and bottom) and which serve for guiding the substrate carrier along a transport path.

Example 51 is a substrate carrier (for example the substrate carrier according to example 50), further having: multiple coupling devices (also referred to as counterpart coupling devices), of which for example each counterpart coupling device is configured to be coupled to a coupling device of the multiplicity of coupling devices of the circulation conveyor transport wheel.

Example 52 is the substrate carrier according to example 50 or 51, wherein at least one (that is to say one or more than one) of the two carriages has a multiplicity of drive teeth, and/or wherein for example one (that is to say one or more than one) of the two carriages has a toothed rack (for example a lantern-gear rack) which has for example the multiplicity of drive teeth.

Example 53 is the substrate carrier according to any of examples 50 to 52, wherein at least one (for example two or each) of the two carriages (for example each carriage of the substrate carrier) has a multiplicity of bolts (which for example provide the drive teeth), of which each bolt has for example a rotary bearing.

Example 54 is the substrate carrier according to any of examples 50 to 53, wherein each of the multiple counterpart coupling devices has a form-fit contour which is arranged between the two carriages.

Example 55 is the substrate carrier according to any of examples 50 to 54, wherein two form-fit contours of the multiple coupling devices are arranged offset (e.g., staggered and/or displaced) with respect to one another, for example adjacent to one another, along the transport path of the substrate carrier, wherein the two form-fit contours are arranged for example on mutually opposite sides of the transport path.

Example 56 is the substrate carrier according to any of examples 50 to 55, wherein the at least one form-fit contour of each of the multiple counterpart coupling devices: is arranged on one side of the substrate carrier, wherein, for example, an axis of rotation of the rotary connection is arranged on the side.

Example 57 is the substrate carrier according to any of examples 50 to 56, wherein the multiple counterpart coupling devices in each case have a spacing to one another (for example in pairwise fashion) along the transport path of the substrate carrier.

Example 58 is the substrate carrier according to any of examples 50 to 57, wherein the multiple counterpart coupling devices are configured so as to be equidistant with respect to one another along the transport path of the substrate carrier.

Example 59 is the substrate carrier according to any of examples 50 to 58, wherein the multiple counterpart coupling devices have at least one first counterpart coupling device and at least one second counterpart coupling device, the form-fit contours of which are arranged offset with respect to one another laterally in relation to the transport path of the substrate carrier (for example, the form-fit contours are arranged adjacent to one another in a projection onto an area arranged transversely with respect to the transport path and between the form-fit contours), and/or form-fit contours of which have a spacing to one another (along a direction) transversely with respect to the transport path of the substrate carrier.

Example 60 is the substrate carrier according to example 59, wherein the at least one second counterpart coupling device has two second counterpart coupling devices which are arranged on mutually opposite end sides of the substrate carrier.

Example 61 is the substrate carrier according to any of examples 50 to 60, wherein at least one (for example two or each) of the two carriages (for example each carriage of the substrate carrier) has one or more than one pair of rotatably mounted rollers, the axes of rotation (which are for example oriented parallel to one another) of which are arranged adjacent to one another, wherein a gap is formed for example between the rollers or the axes of rotation thereof, wherein for example the rollers or the axes of rotation thereof have a spacing to one another which is along a direction transverse with respect to the axes of rotation.

Example 62 is the substrate carrier according to any of examples 50 to 61, further having: a first extent along the transport path and a second extent transversely with respect to the transport path, wherein the first extent and the second extent are substantially equal (for example deviate from one another by less than 20%).

Example 63 is the substrate carrier according to any of examples 50 to 62, wherein each of the multiple members has a frame and a substrate holding device fastened thereto.

Example 64 is the substrate carrier according to any of examples 50 to 63, wherein a first member of the multiple members has the two carriages arranged on mutually opposite sides of the first member (for example top and bottom).

Example 65 is the substrate carrier according to any of examples 50 to 64, wherein second member of the multiple members has two additional carriages arranged on mutually opposite sides of the second member (for example top and bottom).

Example 66 is the substrate carrier according to any of examples 50 to 65, wherein the multiple counterpart coupling devices have, per member, one counterpart coupling device and have at least one additional counterpart coupling device.

Example 67 is the substrate carrier according to any of examples 50 to 66, wherein each rotary connection which couples two members to one another has or is formed from a hinge.

Example 68 is the substrate carrier according to example 67, wherein the hinge has multiple mutually spatially separate hinge segments.

Example 69 if the substrate carrier according to any of examples 50 to 68, wherein each rotary connection (for example each of the hinge segments) has a hinge pin which supports one of the multiple counterpart coupling devices.

Example 70 is the substrate carrier according to any of examples 50 to 69, wherein each of the multiple counterpart coupling devices has a bolt or a fork which provides the form-fit contour.

Example 71 is the substrate carrier according to example 70, wherein the bolt tapers, for example by an angle of 10° (for example 3) or less.

Example 72 is the substrate carrier according to any of examples 50 to 71, wherein one or each rotary connection has a bolt which protrudes and which provides one of the multiple counterpart coupling devices.

Example 73 is the substrate carrier according to any of examples 50 to 72, wherein each of the counterpart coupling devices has a rotary bearing by means of which the form-fit contour is rotatably mounted.

Example 74 is the substrate carrier according to any of examples 50 to 73, wherein a length of the substrate carrier is less than 1/10 of the circumference of the circulation conveyor transport wheel, for example is less than 1/20 of the circumference of the circulation conveyor transport wheel, for example is less than 1/26 of the circumference of the circulation conveyor transport wheel.

Example 75 is a vacuum arrangement having: a substrate carrier according to any of examples 50 to 74, and a vacuum chamber in which the substrate carrier is arranged.

Example 76 is a linear conveyor having: an elongate guide profile which provides a transport path for a substrate carrier (for example according to any of examples 50 to 74), multiple bodies which are arranged and rotatably mounted on the guide profile, of which each body has a multiplicity of drive teeth for forming a toothing (e.g., interlocking and/or gearing) with the substrate carrier; a drive device for transmitting a torque to each of the multiple bodies, for example such that the drive teeth thereof pass the guide profile with the same cycle timing (in other words with the same frequency).

Example 77 is the linear conveyor according to example 76, wherein the bodies correspond in terms of a tooth width of the multiplicity of drive teeth.

Example 78 is the linear conveyor according to example 76 or 77, wherein the bodies correspond in terms of a diameter and/or a circumference.

Example 79 is the linear conveyor according to any of examples 76 to 78, wherein the bodies correspond in terms of a diametral pitch (corresponds to the tooth pitch divided by pi) or a tooth pitch (corresponds to the spacing of two adjacent teeth, also referred to as circumferential pitch, measured for example in part of the circumference per tooth).

Example 80 is the linear conveyor according to example 76 or 79, wherein the bodies correspond in terms of a pitch circle diameter and/or rolling circle diameter.

Example 81 is the linear conveyor according to any of examples 76 to 80, wherein the bodies correspond in terms of a number of the multiplicity of drive teeth.

Example 82 is the linear conveyor according to any of examples 76 to 81, wherein each of the multiple bodies has a toothed gear.

Example 83 is the linear conveyor according to any of examples 76 to 82, wherein each of the multiple bodies is rotationally symmetrical, for example with an order of symmetry which corresponds to the number of the multiplicity of teeth.

Example 84 is the linear conveyor according to any of examples 76 to 83, wherein each of the multiple bodies adjoins a straight line which runs along (for example parallel to) the guide profile and/or the transport path.

Example 85 is the linear conveyor according to any of examples 76 to 84, wherein the guide profile has two segments, between which one of the multiple bodies is arranged.

Example 86 is the linear conveyor according to any of examples 76 to 85, wherein the multiple bodies overlap one another in a projection along the transport path.

Example 87 is the linear conveyor according to any of examples 76 to 86, further having: a rail guide which has the guide profile.

Example 88 is a vacuum arrangement having a vacuum chamber and a linear conveyor according to any of examples 76 to 87 arranged in the vacuum chamber.

Example 89 is a method including: coupling-on of a substrate carrier (for example configured according to any of examples 50 to 74) onto a circulation conveyor transport wheel (for example configured according to any of examples 1 to 30) which is arranged in a vacuum (e.g., including rolling up the substrate carrier on the transport wheel); and/or decoupling of the substrate carrier from the circulation conveyor transport wheel which is arranged in the vacuum (e.g., including unrolling the substrate carrier from the transport wheel), wherein the coupling-on and the decoupling (e.g., the rolling up and the unrolling) for example begin at the same side of the substrate carrier, wherein the substrate carrier has members which are coupled to one another for example by means of rotary connections.

Example 90 is a method (for example according to example 89) including: guiding a substrate carrier (for example configured according to any of examples 50 to 74) by means of a (for example elongate) guide profile of a linear conveyor along a transport path; generating a feed movement of the substrate carrier by means of a toothing (for example a lantern-gear toothing) between the linear conveyor and the substrate carrier, wherein the toothing (e.g., interlocking and/or gearing) is provided for example between the substrate carrier and a linear conveyor which has the guide profile (and which is for example configured according to any of examples 76 to 87), wherein for example the generation of the feed movement includes coupling-on of the substrate carrier onto, or decoupling of the substrate carrier from, a circulation conveyor transport wheel (for example configured according to any of examples 1 to 30).

Example 91 is the method according to example 89 or 90, wherein the substrate carrier is transported on different sections of a transport path before the coupling-on and/or after the decoupling, wherein for example the different sections of the transport path have an angle with respect to one another and/or cross one another.

Example 92 is the method according to any of examples 89 to 91, wherein the transport before the coupling-on takes place toward the circulation conveyor transport wheel and the transport after the decoupling takes place away from the circulation conveyor transport wheel.

Example 93 is the method according to any of examples 89 to 92, further including: processing (for example coating with a coating material) of one or more than one substrate which is carried by the substrate carrier that has been coupled onto the circulation conveyor transport wheel, wherein the circulation conveyor transport wheel is rotated during the processing; wherein the processing (for example coating) of the substrate takes place along more than half (for example three quarters) of a revolution per rotation of the circulation conveyor transport wheel.

Example 94 is the method according to any of examples 89 to 93, wherein the coupling-on of the substrate carrier includes the coupling-on of multiple members of the substrate carrier in succession.

Example 95 is the method according to any of examples 89 to 94, wherein the coupling-on of the substrate carrier includes the locking of the coupling of the substrate carrier to the circulation conveyor transport wheel.

Example 96 is the method according to any of examples 89 to 95, wherein the circulation conveyor transport wheel rotates during the decoupling of the substrate carrier and/or coupling-on of the substrate carrier.

Example 97 is the method according to any of examples 89 to 96, wherein the decoupling of the substrate carrier includes the elimination (e.g., removal and/or reversing) of locking of the coupling of the substrate carrier to the circulation conveyor transport wheel.

Example 98 is the method according to any of examples 89 to 97, wherein the circulation conveyor transport wheel is mounted so as to be rotatable, for example about an axis of rotation which is oriented along the force of gravity.

What is claimed is:

1. A circulation conveyor transport wheel comprising:
a framework on which the circulation conveyor transport wheel can be rotatably mounted;
a multiplicity of coupling devices which are arranged along an outer circumference of the framework and of which each of the coupling devices comprises at least one form-fit contour to couple a substrate carrier in a form-fitting manner, wherein the form-fit contour is configured to engage the substrate carrier in the form-fitting manner by restricting movement of the substrate carrier relative to the form-fit contour in at least one direction,
wherein the multiplicity of coupling devices comprises a pair of coupling devices, wherein a distance along the circumference between the form-fit contours of the pair of coupling devices to one another is smaller than a distance along the circumference between the form-fit contours of the pair of coupling devices and the form-fit contours of the multiplicity of coupling devices, which are arranged immediately adjacent to the pair.

2. The circulation conveyor transport wheel as claimed in claim 1, wherein the form-fit contours are each provided by a cutout.

3. The circulation conveyor transport wheel as claimed in claim 1, wherein the multiplicity of coupling devices comprises multiple pairs of coupling devices, wherein a distance along the circumference between the form-fit contours of each pair to one another is less than a distance along the circumference between the form-fit contours of each pair and the form-fit contours of the multiplicity of coupling devices, which are arranged between the multiple pairs.

4. The circulation conveyor transport wheel as claimed in claim 1, wherein the form-fit contours of the pair are arranged offset with respect to one another along the circumference.

5. The circulation conveyor transport wheel as claimed in claim 1,
wherein each of the coupling devices has a locking device which can be switched between a first state and a second state,
wherein, in the first state, a form-fitting coupling to the substrate carrier is locked, and in the second state, the form-fitting coupling to the substrate carrier is unlocked.

6. The circulation conveyor transport wheel as claimed in claim 1, wherein each of the multiplicity of coupling devices has a fork or a bolt which provides the form-fit contour.

7. The circulation conveyor transport wheel as claimed in claim 1, wherein the at least one form-fit contour is curved toward an axis of rotation of the circulation conveyor transport wheel or away from the axis of rotation.

8. The circulation conveyor transport wheel as claimed in claim 1, wherein the at least one form-fit contour is configured to, in engagement with the substrate carrier, provide a rotary joint.

9. A circulation conveyor comprising:
a circulation conveyor transport wheel as claimed in claim 1,
a bearing arrangement by which the circulation conveyor transport wheel is rotatably mounted.

10. The circulation conveyor as claimed in claim 9, the circulation conveyor further comprising:
the substrate carrier, wherein the substrate carrier is configured to carry one or more than one substrate,
wherein the substrate carrier comprises multiple counterpart coupling devices, each of which being configured to be coupled to a coupling device of the multiplicity of coupling devices.

11. The circulation conveyor as claimed in claim 10, wherein the substrate carrier has a lantern-gear rack.

12. A conveying arrangement comprising:
a circulation conveyor as claimed in claim 10, and
a first linear conveyor configured to provide a transport path toward the circulation conveyor transport wheel.

13. The conveying arrangement as claimed in claim 12, further comprising:
a second linear conveyor configured to provide a transport path away from the circulation conveyor transport wheel;
wherein, by the circulation conveyor transport wheel, the transport path is diverted from the first linear conveyor to the second linear conveyor.

14. The conveying arrangement as claimed in claim 13, wherein the first linear conveyor comprises multiple toothed gears for driving a transport movement along the transport path.

15. The conveying arrangement as claimed in claim 12, wherein the first linear conveyor comprises:
- an elongate guide profile which provides a transport path for the substrate carrier;
- multiple bodies which are arranged and rotatably mounted on the guide profile and of which each body has a multiplicity of drive teeth to form a toothing with the substrate carrier;
- a drive device to transmit a torque to each of the multiple bodies.

16. The conveying arrangement as claimed in claim 12, wherein the transport path extends in a crosswise direction.

17. A vacuum arrangement comprising:
- a conveying arrangement as claimed in claim 12, and
- a vacuum chamber in which the circulation conveyor transport wheel is arranged.

* * * * *